(12) United States Patent
Drndic et al.

(10) Patent No.: US 8,828,792 B2
(45) Date of Patent: Sep. 9, 2014

(54) NANOSTRUCTURE ASSEMBLIES, METHODS AND DEVICES THEREOF

(75) Inventors: Marija Drndic, Philadelphia, PA (US); Michael D. Fischbein, Philadelphia, PA (US)

(73) Assignee: The Trustees of The University of Pennsylvania, Philadelphia, PA (US)

( * ) Notice: Subject to any disclaimer, the term of this patent is extended or adjusted under 35 U.S.C. 154(b) by 1719 days.

(21) Appl. No.: 11/597,069

(22) PCT Filed: May 25, 2005

(86) PCT No.: PCT/US2005/018342
§ 371 (c)(1),
(2), (4) Date: Sep. 21, 2007

(87) PCT Pub. No.: WO2006/076036
PCT Pub. Date: Jul. 20, 2006

(65) Prior Publication Data
US 2008/0017845 A1 Jan. 24, 2008

Related U.S. Application Data

(60) Provisional application No. 60/574,352, filed on May 25, 2004, provisional application No. 60/663,637, filed on Mar. 21, 2005.

(51) Int. Cl.
| | | |
|---|---|---|
| *H01L 51/40* | (2006.01) | |
| *H01L 51/10* | (2006.01) | |
| *H01L 51/05* | (2006.01) | |
| *H01L 29/76* | (2006.01) | |
| *B82B 3/00* | (2006.01) | |
| *H01L 51/00* | (2006.01) | |
| *B82Y 30/00* | (2011.01) | |
| *B82Y 10/00* | (2011.01) | |
| *B82Y 40/00* | (2011.01) | |

(52) U.S. Cl.
CPC .......... *H01L 51/102* (2013.01); *H01L 51/0048* (2013.01); *B82Y 30/00* (2013.01); *B82Y 10/00* (2013.01); *H01L 51/0595* (2013.01); *H01L 51/0052* (2013.01); *H01L 29/7613* (2013.01); *B82Y 40/00* (2013.01); *B82B 3/00* (2013.01)
USPC .............. 438/99; 438/118; 438/689; 438/725

(58) Field of Classification Search
None
See application file for complete search history.

(56) References Cited

U.S. PATENT DOCUMENTS

| | | | |
|---|---|---|---|
| 3,711,908 A | 1/1973 | Broers ........................ | 29/25.18 |
| 3,876,883 A | 4/1975 | Broers et al. .................. | 250/492 |

(Continued)

FOREIGN PATENT DOCUMENTS

| | | | |
|---|---|---|---|
| WO | WO2004/006337 A1 | | 1/2004 |
| WO | WO 2004007636 A1 * | | 1/2004 |

(Continued)

OTHER PUBLICATIONS

Bachtold, A., et al., "Scanned probe microscopy of electronic transport in carbon nanotubes," Phys. Rev. Lett., 2000, 84(26), 6082-6085.

(Continued)

*Primary Examiner* — Kyoung Lee
(74) *Attorney, Agent, or Firm* — Baker & Hostetler LLP

(57) ABSTRACT

Disclosed herein are methods for assembling nanostructures. The assembling methods include contacting the plurality of nanostructures to a substrate having one or more discontinuities. At least a portion of the plurality of nanostructures assemble adjacent to the discontinuity, the assembled nanostructures including at least one nanostructure having a bridging, molecule. Devices, such as field-effect transistors, are also disclosed.

19 Claims, 42 Drawing Sheets

(56) References Cited

U.S. PATENT DOCUMENTS

| | | | |
|---|---|---|---|
| 3,971,860 A | 7/1976 | Broers et al. | 427/43 |
| 4,197,332 A | 4/1980 | Broers et al. | 430/272 |
| 4,210,806 A | 7/1980 | Broers | 250/311 |
| 4,263,514 A | 4/1981 | Reeds, Jr. | 250/492 A |
| 4,316,093 A | 2/1982 | Broers et al. | 250/492.1 |
| 4,557,995 A | 12/1985 | Broers et al. | 430/296 |
| 5,505,928 A | 4/1996 | Alivisatos et al. | 423/299 |
| 5,751,018 A | 5/1998 | Alivisatos et al. | 257/64 |
| 5,990,479 A | 11/1999 | Weiss et al. | 250/307 |
| 6,048,616 A | 4/2000 | Gallagher et al. | 428/407 |
| 6,128,214 A * | 10/2000 | Kuekes et al. | 365/151 |
| 6,159,620 A * | 12/2000 | Heath et al. | 428/615 |
| 6,225,198 B1 | 5/2001 | Alivisatos et al. | 438/497 |
| 6,306,736 B1 | 10/2001 | Alivisatos et al. | 438/497 |
| 6,322,901 B1 | 11/2001 | Bawendi et al. | 428/548 |
| 6,335,245 B2 | 1/2002 | Park et al. | 438/257 |
| 6,379,635 B2 | 4/2002 | O'Brien et al. | 423/122 |
| 6,576,291 B2 | 6/2003 | Bawendi et al. | 428/215 |
| 6,586,787 B1 * | 7/2003 | Shih et al. | 257/288 |
| 6,635,494 B2 * | 10/2003 | Yamashita | 438/1 |
| 6,656,802 B2 | 12/2003 | Oszustowicz | 438/257 |
| 6,690,059 B1 | 2/2004 | Lojek | 257/316 |
| 6,744,065 B1 * | 6/2004 | Samuelson et al. | 257/14 |
| 6,791,338 B1 * | 9/2004 | Bratkovski et al. | 324/600 |
| 6,815,218 B1 * | 11/2004 | Jacobson et al. | 438/1 |
| 7,030,452 B2 | 4/2006 | Tao et al. | |
| 7,049,625 B2 * | 5/2006 | Kern et al. | 257/9 |
| 7,067,341 B2 * | 6/2006 | Mascolo et al. | 438/48 |
| 7,494,907 B2 * | 2/2009 | Brown et al. | 438/584 |
| 7,615,776 B2 * | 11/2009 | Chaudhari | 257/40 |
| 2002/0002195 A1 | 1/2002 | Huang | 514/423 |
| 2002/0169195 A1 | 11/2002 | Kindness | 514/25 |
| 2003/0034486 A1 * | 2/2003 | Korgel | 257/13 |
| 2003/0040173 A1 | 2/2003 | Fonash et al. | |
| 2003/0067668 A1 * | 4/2003 | Feldheim et al. | 359/328 |
| 2003/0103367 A1 * | 6/2003 | Aeppli et al. | 365/9 |
| 2003/0175161 A1 * | 9/2003 | Gabriel et al. | 422/90 |
| 2004/0002195 A1 * | 1/2004 | Brousseau, III | 438/301 |
| 2004/0029050 A1 | 2/2004 | Brenner et al. | 438/510 |
| 2004/0067646 A1 * | 4/2004 | Tao et al. | 438/689 |
| 2004/0178390 A1 | 9/2004 | Whiteford et al. | 252/500 |
| 2004/0232389 A1 | 11/2004 | Elkovitch | 252/500 |
| 2005/0054004 A1 | 3/2005 | Alivisatos et al. | 435/7.1 |
| 2005/0056828 A1 | 3/2005 | Wada et al. | 257/40 |
| 2006/0234417 A1 * | 10/2006 | Isobe et al. | 438/99 |

FOREIGN PATENT DOCUMENTS

| | | |
|---|---|---|
| WO | WO2004/078027 A3 | 9/2004 |
| WO | WO2006/076036 A2 | 7/2006 |
| WO | WO2006/102292 A3 | 9/2006 |

OTHER PUBLICATIONS

Banerjee, S., et al., "Synthesis and characterization of carbon nanotube-nanocrystal heterostructures," Nano Letts., 2002, 2(3), 195-200.
Bagen, S., "Photoresist coating methods," 1997, http://mail.memsexchartge.org/pipermail/mems-talk/1997-September/001056.html, downloaded from the internet on Sep. 9, 2005, 3 pages.
Bezryadin, A., et al., "Nanofabrication of electrodes with sub-5 nm spacing for transport experiments on single molecules and metal clusters," J. Vac. Sci. Technol. B, 1997, 15(4), 793-799.
Bockrath, M., et al., "Scanned conductance microscopy of carbon nanotubes and λ-DNA," Nano Letts., 2002, 2(3), 187-190.
Broers, A.N., et al., "Electron-beam fabrication of 80-Å metal structures," App. Phys. Lett., 1976, 29, 596-598.
Broers, A.N., et al., "Electron beam lithography—resolution limits," Microelec. Eng., 1996, 32, 131-142.
Broers, A.N., "Resolution limits for electron-beam lithography," IBM J. of Res. Develop., 1988, 32(4), 502-513.
Cartlidge, E., "Atom lithography sees the light," PhysicsWeb, 2002, http://physicsweb.org/articles/news/6/10/2/1, downloaded from the internet on Sep. 9, 2005, 2 pages.

Chang, T.H.P., "Proximity effect in electron-beam lithography," J. Vac. Sci. Technol. B., 1975, 12, 1271-1275.
Chen, J., et al., "Large on-off ratios and negative differential resistance in a molecular molecular electronic device," Science, New Series, 1999, 286(5444), 1550-1552.
Chen, F., et al., "Synthesis and properties of lead selenide nanocrystal solids," Mat. Res. Soc. Symp. Proc., 2002, 691, 359-364.
Coe, S., et al., "Electroluminescence from single monolayers of nanocrystals in molecular organic devices," Nature, 2002, 420, 800-803.
"Core Technologies," Nanosys, http://www.nanosysinc.com/technology.html, 2004, 1-5.
Cui, Y., et al., "Integration of colloidal nanocrystals into lithographically patterned devices," Nano Letts., 2004, A-F.
Cummings, D.R.S., et al., "3 nm NiCr wires made using electron beam lithography and PMMA resist," Microelec. Eng 30., 1996, 30, 423-425.
Datta, S., "Electrical resistance: an atomistic view," Nanotechnology, 2004, 15, S433-S451.
Deshmukh, M.M., et al., "Fabrication of asymmetric electrode pairs with nanometer separation made of two distinct metals," Nano Lett., 2003, 3(10), 1383-1385.
Drndic, M., et al., "Transport properties of annealed CdSe colloidal nanocrystal solids," Appl. Phys., 2002, 92(12), 7498-7503.
Drndic, M., et al., "Imaging the charge transport in arrays of CdSc nanocrystals," Appl. Phys. Lett., 2003, 83(19), 4008-4010.
Duan, X.F., et al., "Single-nanowire electrically driven lasers," Nature, 2003, 421(6920), 241-245.
Duan, X., et al., "Indium phosphide nanowires as building blocks for nanoscale electronic and optoelectronic devices," Nature, 2001, 409, 66-69.
Dubertret, B., et al., "In vivo imaging of quantum dots encapsulated in phospholipids micelles," Science, 2002, 298(5599), 1759-1762.
Eisler, H.J., et al., "Color-selective semiconductor nanocrystal laser," Appl. Phys. Lett., 2002, 80(24), 4614-4616.
Ferretti, A., et al., "First-principles theory of correlated transport through nanojunctions," Am. Phys. Soc., 2005, 116802-1-116802-4.
Fischbein, M.D., "Nanogaps by direct lithography for high-resolution imaging and electronic characterization of nanostructures," Applied Physics Letts., 88, 2006, 063116-1-063116-3.
Ginger, D.S., et al., "Charge injection and transport in films of CdSe nanocrystals," Appl. Phys., 2000, 87, 1361-1368.
Gleiche, M., et al., "Nanoscopic channel lattices with controlled anisotropic wetting," Nature, 2000, 403, 173-175.
Grant, A.W., et al., "Transmission electron microscopy 'windows' for nanofabricated structures," Nanotechnol., 2004, 15, 1175-1181.
Gudiksen, M.S., et al., "Electroluminescence from a single-nanocrystal transistor," Dept. of Chemistry & Chem. Biology & Dept. of Physics, Harvard Univ., 1-16.
Guisinger, N.P., et al., "Room temperature negative differential resistance through individual organic molecules on silicon surfaces," Nano Letts., 2004, 4(1), 55-59.
Harcmza, J.M., et al., "Attachment of single CdSc nanocrystals to individual single-walled carbon nanotubes," Nano Letters, 2002, 2(11), 1253-1258.
Islam, M.A., et al., "Electrodeposition of patterned CdSc nanocrystal films using thermally charged nanocrystals," Appl. Phys. Lett. 2002, 80(20), 3823-3825.
Jarosz, M.V., et al., "Observation of bimolecular carrier recombination dynamics in close-packed films of colloidal CdSe nanocrystals," J. of Chem. Physics B, 2003, 107, 12585-12588.
Kalaugher, L. (Ed.), "Doping nanocrystals is much more speedy," Nanotechnweb.org, 2004, http://nanotechweb.org/articles/news/2/11/7, downloaded from the internet on Nov. 22, 2004, 2 pages.
Kalaugher, L., "Nanoparticles boost solar cells," http://www.nanotechweb.org/articles/news/4/10/13/1, downloaded from the internet on Oct. 25, 2005, 2 pages.
Kalaugher, L., "Bone Grows better on nanophase metals," 2004, http://nanotechweb.org/articles/news/2/11/7, downloaded from the internet on May 9, 2007, 2 pages.
Kervennic, Y.V., et al., "Nanometer-spaced electrodes with calibrated separation," App. Phys. Lett., 2002, 80(2), 321-323.

(56) References Cited

OTHER PUBLICATIONS

Kiselev and Novikov Reply: submitted to Phys. Rev. Lett., 2003, condmat/0307031, p. 029802-1.

Kim, Sungjee, et al., "Type-II quantum dots: CdTe/CdSe(Core/Shell) and CdSe/ZnTe(Core/Shell) heterostructures," J. Am. Chem. Soc., 2003, 125(38), 11466-11467.

King, G.M., et al., "Nanometer patterning with ice," Nano Letts., 2005, 5(6), 1157-1160.

Klein, D.L., et al., "A single-electron transistor made from cadmium selenide nanocrystal," Nature, 1997, 389, 699-701.

Klein, D.L., et al., "An approach to electrical studies of single nanocrystals," Appl. Phys. Lett., 1996, 68(18), 2574-25-2576.

Krahne, R., et al., "Fabrication of nanoscale gaps in integrated circuits," Appl. Phys. Lett., 2002, 81(4), 730-732.

Krauss, T.D., et al., "Charge, polarizability, and photoionization of single semiconductor nanocrystals," Phys. Rev. Lett., 1999, 83(23), 4840-4843.

Kyser, D.F., et al., "Monte Carlo simulation of electron beam scattering and energy loss in thin films on thick substrates," Proceedings of the $6^{th}$ International Conference on Electron and Ion Beam Science and Technology, 1974, 205-223.

Levitov, L.S., et al., "Charge ordering and hopping in a triangular array of quantum dots," http://xxx.lanl.gov/abs/cond-mat/9912484, 1999, downloaded from the internet on Jan. 22, 2007, 1 page (abstract).

Li, C.Z., et al., "Quantized tunneling current in the metallic nanogaps formed by electrodeposition and etching,"App. Phys. Lett., 2000, 77(24), 3995-3997.

Liang, W., "Kindo resonance in a single-molecule transistor," Nature, 2002, 417, 725-729.

Lifshitz, E., et al., "Synthesis and characterization of PbSe quantum wires, multipods, quantum rods, and cubes," Nano Lett., 2003, 3(6), 857-862.

Liu, K., et al., "Simple fabrication scheme for sub-10 nm electrode gaps using electron-beam lithography,"Appl. Phys. Lett., 2002, 80(5), 865-867.

Liu, G.F., et al., "Detection of quantum confined states in au nanoclusters by alkali ion scattering," Phys. Rev. Lett., 2004, 92(21), 216801-1-216801-4.

Liu, S., et al., "Nanowire lithography: fabricating controllable electrode gaps using Au—Ag—Au Nanowires," Nano Lett., 2005, 5(6), 1071-1076.

Loss, D., et al., "Quantum computation with quantum dots," Phys. Rev. A, 1998, 57(1), 120-126.

Lu, N., et al., "Lateral patterning of luminescent CdSe nanocrystals by selective dewetting from self-assembled organic templates," Nano Lett., 2004, 4(5), 885-888.

Lutwyche, M.I., "The resolution of electron beam lithography," Microelec. Eng., 1992, 17, 17-20.

Ma, T.P., "Making silicon nitride film a viable gate dielectric," IEEE Trans. Electron Devices, 1998, 45(3), 680-690.

Molzen, W.W., "Materials and techniques used in nanostructure fabrication," J. Vac. Sci. Technol., 1979, 16(2), 269-272.

Morgan, N.Y., et al., "Electronic transport in films of colloidal CdSe nanocrystals," Physical Review B, 2002, 66, 075339-1-075339-9.

Morkved, T.L., et al., "Silicon nitride membrane substrates for the investigation of local structure in polymer thin films," Polymer Communications, Elsevier Science, Ltd., 1998, 5 pages.

Morpurgo, A.F., et al., "Controlled fabrication of metallic electrodes with atomic separation," App. Phys. Lett., 1999, 74(14), 2084-2086.

Murray, C.B., et al., "Synthesis and characterization of nearly monodisperse CdE (E=S, Se, Te) semiconductor nanocrystallites," J. Am. Chem. Soc., 1993, 115, 8706-8715.

Ouyang, M., et al., "Coherent spin transfer between molecularly bridged quantum dots," Science, 2003, 301, 1074-1078.

Pandey, R.K., et al., "Growth and characterization of silicon nitride films for optoelectronics applications," J. Opt. Mat., 2004, 27, 139-146.

Parikh, M., et al., "Energy deposition functions in electron resist films on substrates," Appl. Phys., 1979, 50(2), 1104-1111.

Park, H., et al., "Fabrication of metallic electrodes with nanometer separation," App. Phys. Lett., 1999, 75(2), 301-303.

Park, H., et al., "Nanomechanical oscillations in a single-$C_{60}$ transistor," Nature, 2000, 407, 57-60.

Park, J., et al., "Coulomb blockade and the kondo effect in single-atom transistors," Nature, 2002, 417, 722-725.

Parthasarathy, R., et al., "Electronic transport in metal nanocrystal arrays: the effect of structural disorder on scaling behavior," Phys. Rev. Lett., 2001, 87(18), 186807-1-186807-4.

Peng, X., et al., "Shape control of CdSe nanocrystals," Nature, 2000, 404, 59-61.

Philipp, G., et al., "Shadow evaporation method for fabrication of sub 10 nm Gaps between metal electrodes," Microelec. Eng., 1999, 46, 157-160.

"Photolithography," http://www.ece.gatech.edu/research/labs/vc/processes/photoLith.html, downloaded from the internet on Sep. 9, 2005, 12 pages.

Porath, D., et al., "Direct measurement of electrical transport through DNA molecules," Nature, 2000, 403, 635-638.

Puntes, et al., "Colloidal nanocrystal shape and size control: The case of cobalt," Science, 2001, 291, 2115-2117.

Qin, L., et al., "On-Wire lithography," Science, 2005, 309, 113-115.

Rabani, E., et al., "Drying-mediated self-assembly of nanoparticles," Nature, 2003, 426, 271-274.

Redl, F.X., et al., "Three-dimensional binary superlattices of magnetic nanocrystals and semiconductor quantum dots," Nature, 2003, 423, 968-971.

Reed, M.A., et al., "Conductance of a molecular junction," Science, New Series, 1997, 278(5336), 252-254.

Rehse, S.J., et al., "Nanolithography with metastable neon atoms: enhanced rate of contamination resist formation of nanostructure fabrication," Am. Inst. of Physics., 1997, 1427-1429.

Reichert, J., et al., "Driving current through single organic molecules," Am. Physical Society, 2002, 88(17), 176804-1-176804-4.

Reyes-Betanzo, C., et al., "Mechanisms of silicon nitride etching by electron cyclotron resonance plasmas using $SF_6$- and $NF_3$-based gas mixtures," J. Vac. Sci. Technol. A, 2004, 22(4), 1513-1518.

Sanders, J.T., et al., Nature, 1998, 393, 7 (publication unavailable).

Sashchiuk, A., et al., "PbSe nanocrystal assemblies: synthesis and structural, optical, and electrical characterization," Nano Lett., 2004, 4(1), 159-165.

Scher, H., et al., "Anomalous transit-time dispersion in amorphous solids," Phys. Rev. B, 1975, 12(6), 2455-2477.

Scott, W.T., "The theory of small-angle multiple scattering of fast charged particles," Review of Modern Phsysics, 1963, 35(2), 231-313.

Sedgewick, T.O., et al., "A novel method for fabrication of ultrafine metal lines by electron beams," J. Electrochem. Soc., 1972, 119, 1769-1771.

Sordan, R., et al., "Coulomb blockade phenomena in electromigration break junctions," Appl. Phys. Lett., 2005, 87, 013106-1-013106-3.

"SPI supplies® brand silicon nitride membrane window grids for TEM," 1998, http://www.2spi.com/catalog/instruments/silicon-nitride.shtml, downloaded from the internet on Sep. 9, 2005, 8 pages.

Strachen, D.R., et al., "Controlled fabrication of nanogaps in ambient environment for molecular electronics," App. Phys. Lett., 2005, 86, 043109-1-043109-3.

Sun, L.F., et al., "Shadow-evaporated nanometer-sized gaps and their use in electrical studies of nanocrystals," Nanotechnology, 2005, 16, 631-634.

Tans, S.J., et al., "Room-temperature transistor based on a single carbon nanotube," Nature, 1998, 393, 49-52.

Tevaarwerk, E., et al., "Electrically isolated SiGe quantum dots," Appl. Phys. Lett., 2002, 80(24), 4626-4628.

Thywissen, J.H., "Atom lithography using MRI-type feature placement," arXiv:physics/0209084, 2002, 4 pages.

Visconti, P., "The fabrication of sub-10 nm planar electrodes and their use for a molecule-based transistor," Nanotechnology, 2004, 15, 807-811.

(56) References Cited

OTHER PUBLICATIONS

Wan Soo Yun, et al., "Ferroelectric properties of individual barium titanate nanowires investigated by scanned probe microscopy," Nano Lett., 2002, 2(5), 447-450.

Wehrenberg, B.L., et al., "Interband and intraband optical studies of PbSe colloidal quantum dots," J. Phys. Chem. B, 2002, 106, 10634-10640.

Wehrenberg, B.L., et al., "Electron and hole injection in PbSe quantum dot films," J. Am. Chem. 2003, 125, 7806-7807.

Younkin, R., "Nanostructure fabrication in silicon using cesium to pattern a self-assembled monolayer," Am. Inst. of Physics., 1997, 1261-1263.

Yu, D., et al., "$n$-type conducting CdSe nanocrystal solids," Science, 2003, 300(5623), 1277-1280.

Zandbergen, H.W., et al., "Sculpting nanoelectrodes with a transmission electron beam for electrical and geometrical characterization of nanoparticles," 2005, 5(3), 549-553.

Zandbergen, H.W., et al., "Sculpting nanoelectrodes with a transmission electron beam for electrical and geometrical characterization of nanoparticles," Nano Lett.,, 2005, A-E.

* cited by examiner

Figure 5
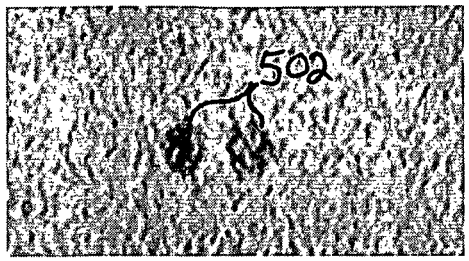
a)
b)
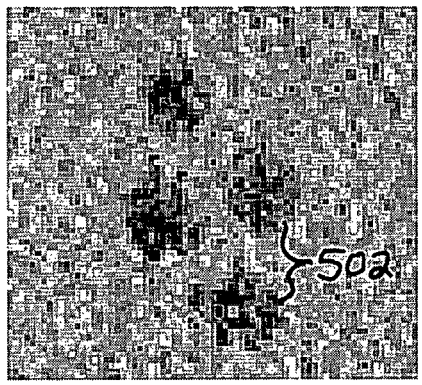
b)
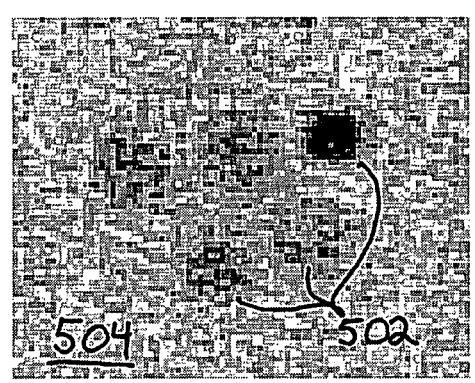
d)
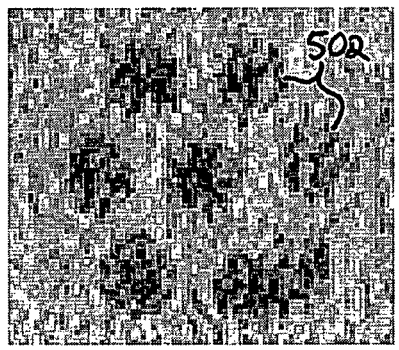
e)

CdSe crystals in a line along an edge

Figure 18
a) Zoomed Out Features
b) Zoom in of Window with Deposited Electrodes
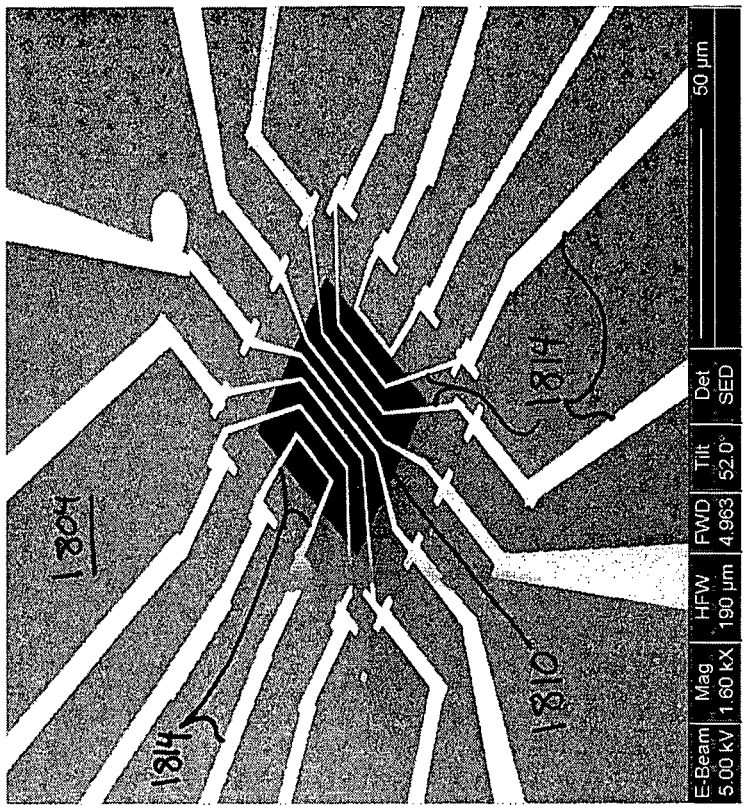
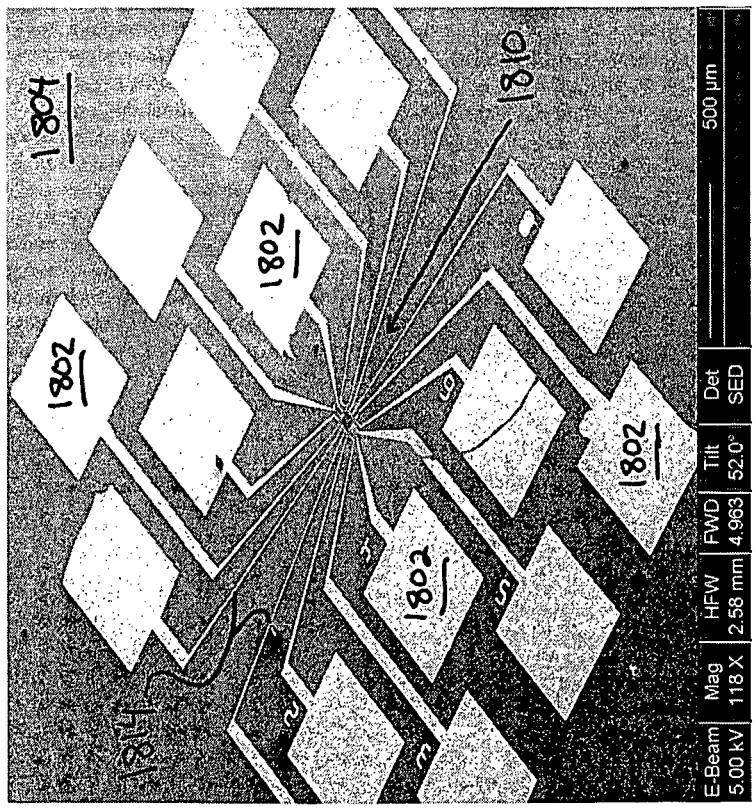

"Seeing" the Sample

Sub nm resolution imaging

Structural details (contacts, assembly) affect transport properties $I \sim (V - V_{th})^\alpha$ in metal nanocrystals, where $\alpha$ depends on ordering

Device

- Capacitor plate geometry
- W = 100 nm to 2 μm
- L = 1 μm to 1 mm

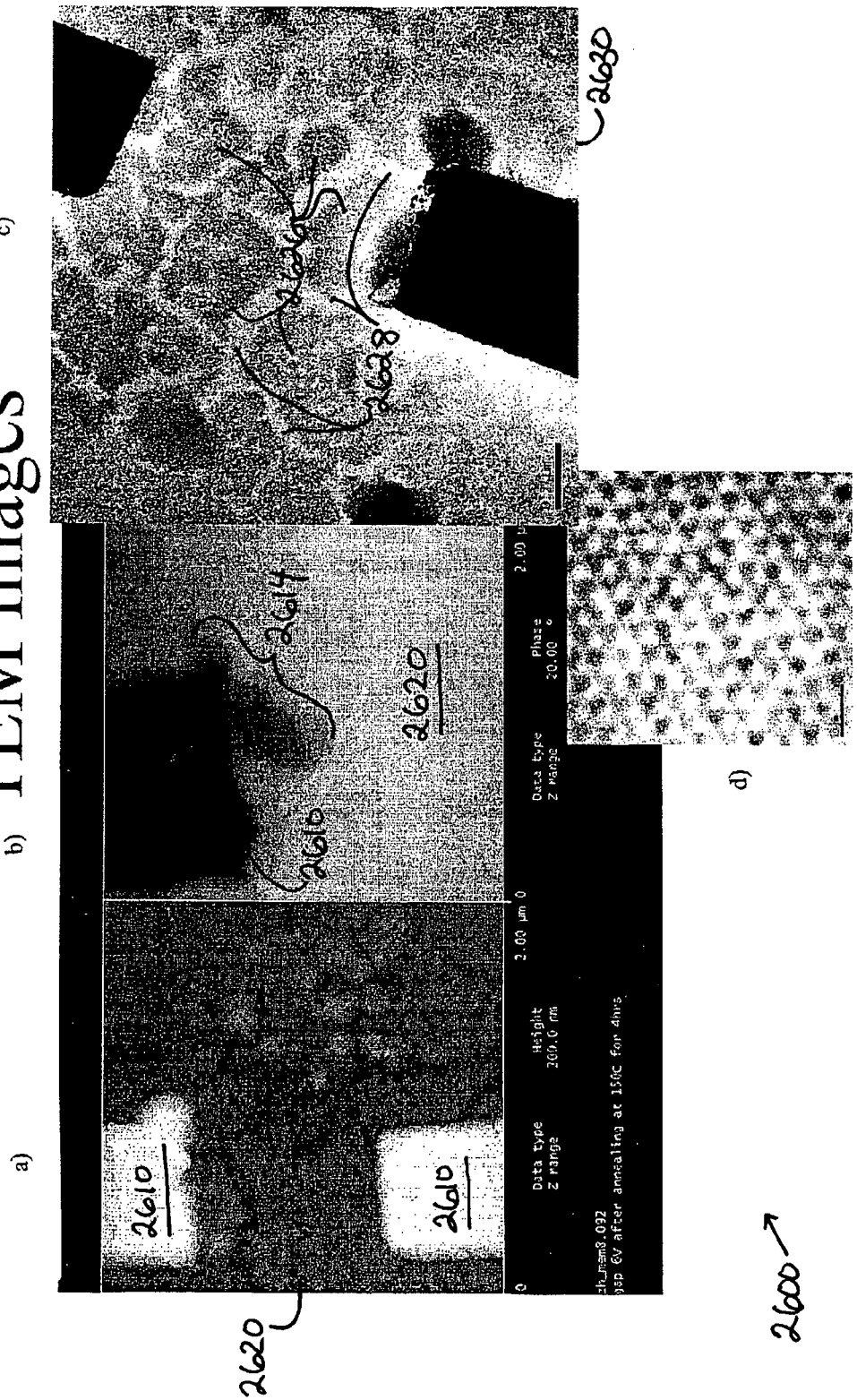
Figure 26 Correlation between EFM and TEM Images

Figure 27 Membrane Patterning
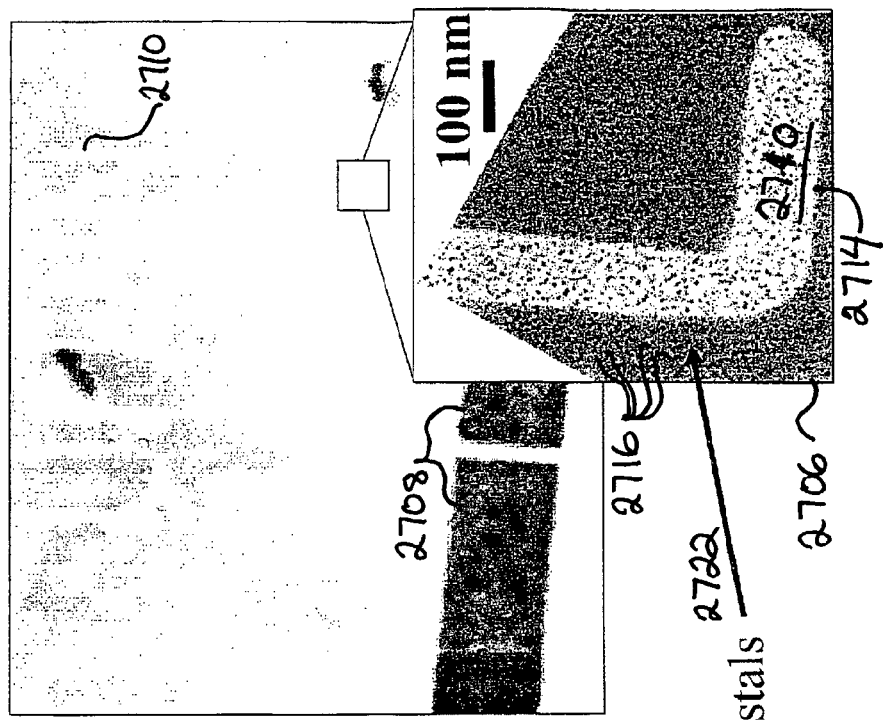
b) TEM Image
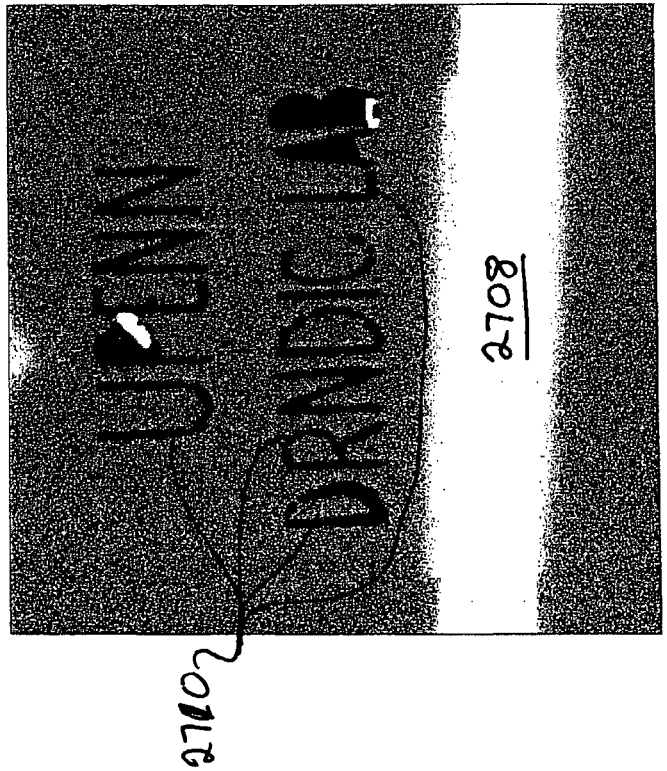
a) SEM Image Figure 28
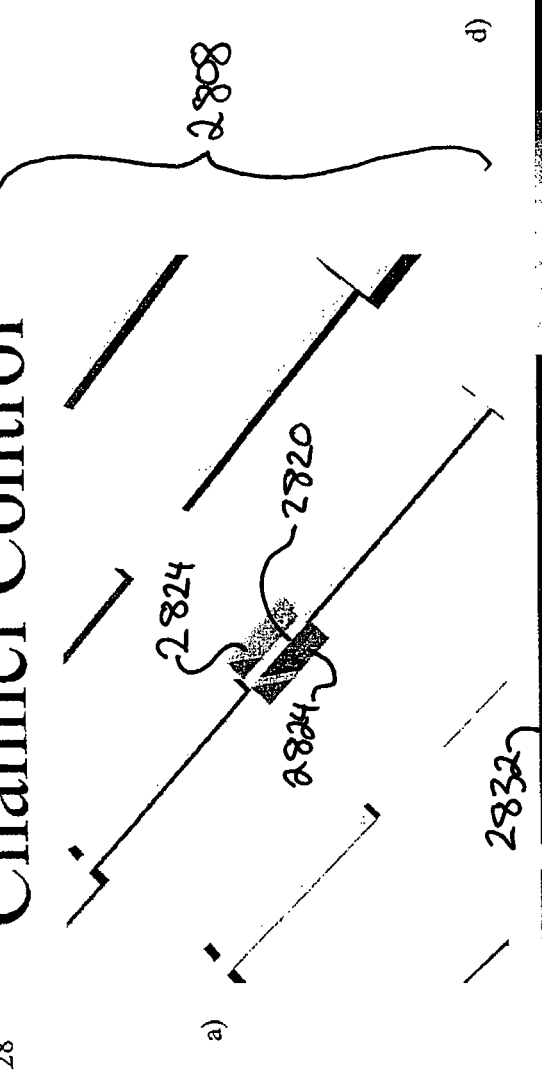
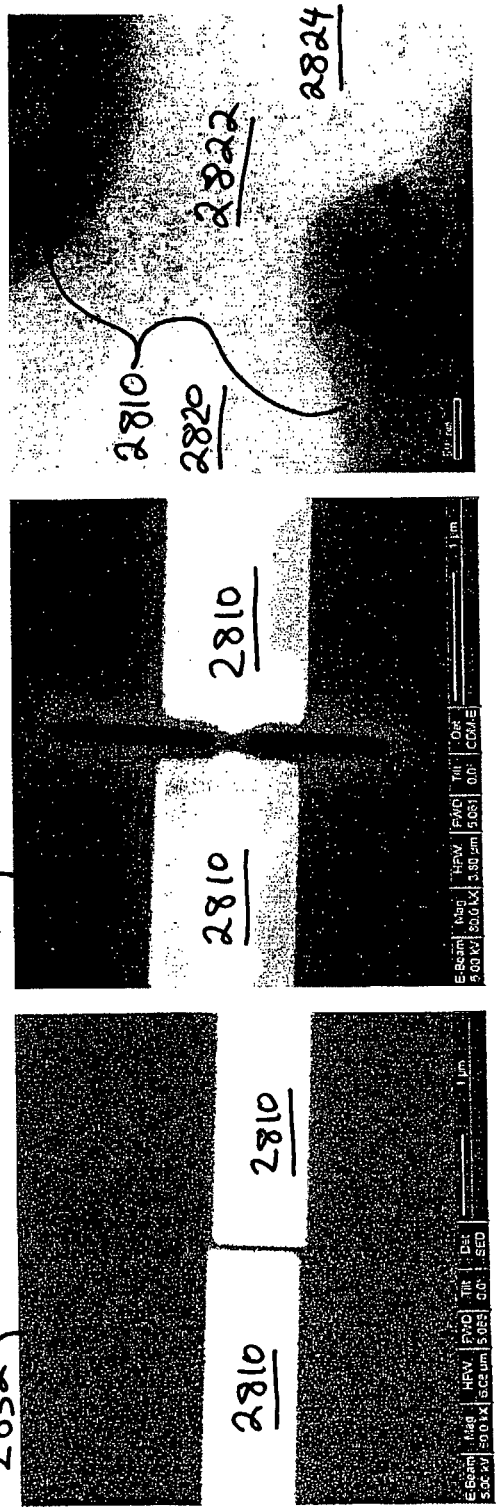

Figure 33
Device 2
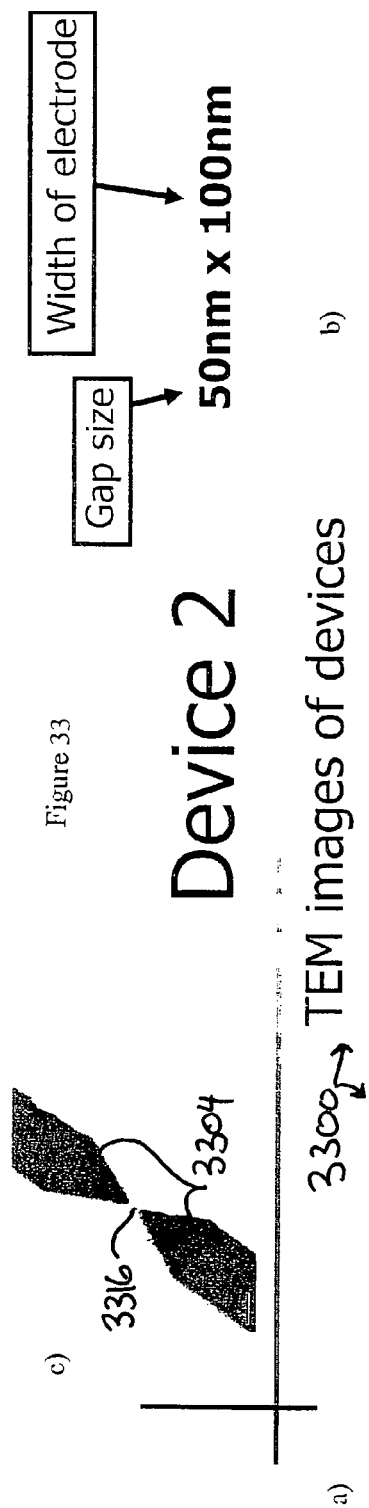
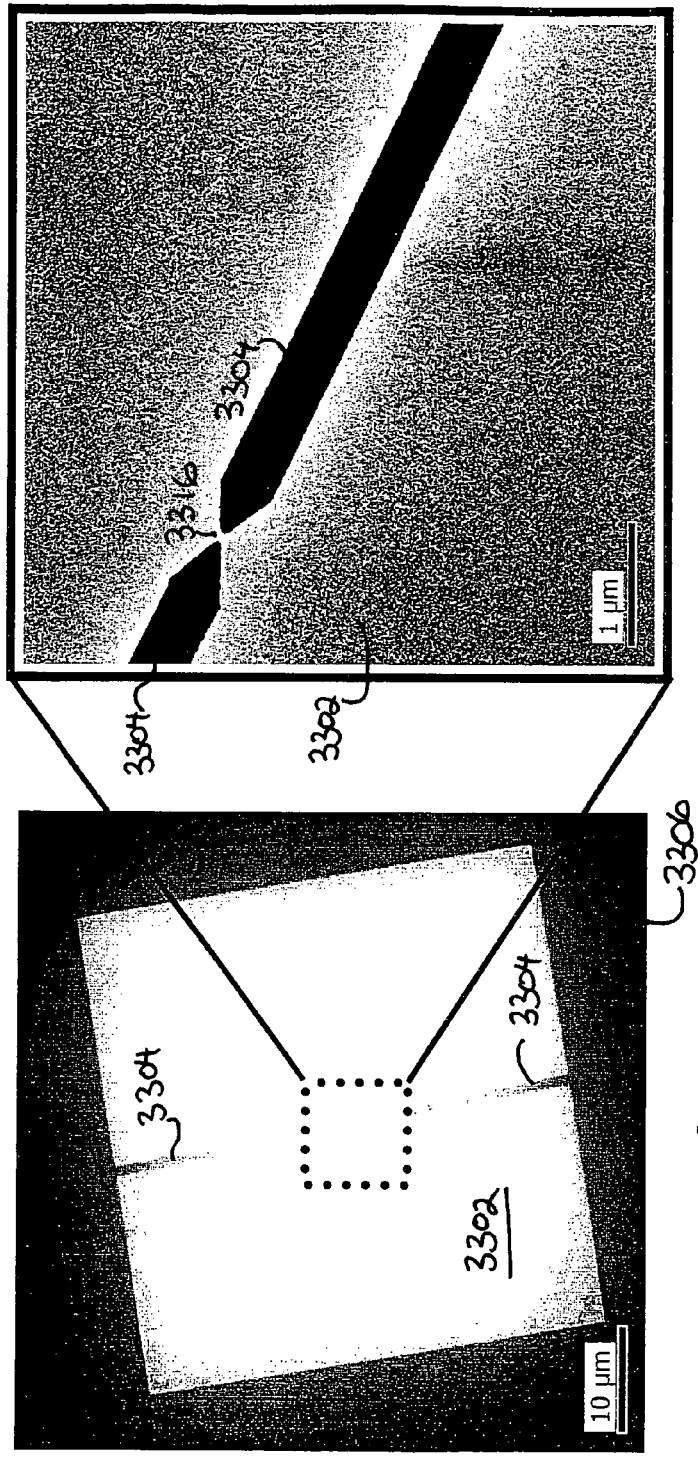
Gap size → 50nm x 100nm ← Width of electrode
a) TEM images of devices — Large features
b) Zoom-in image of fine features
c)

Mechanism of EFM Operation
Figure 36
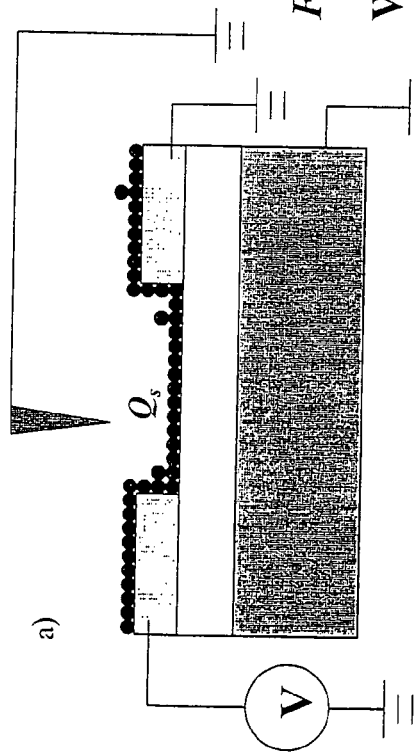
a)
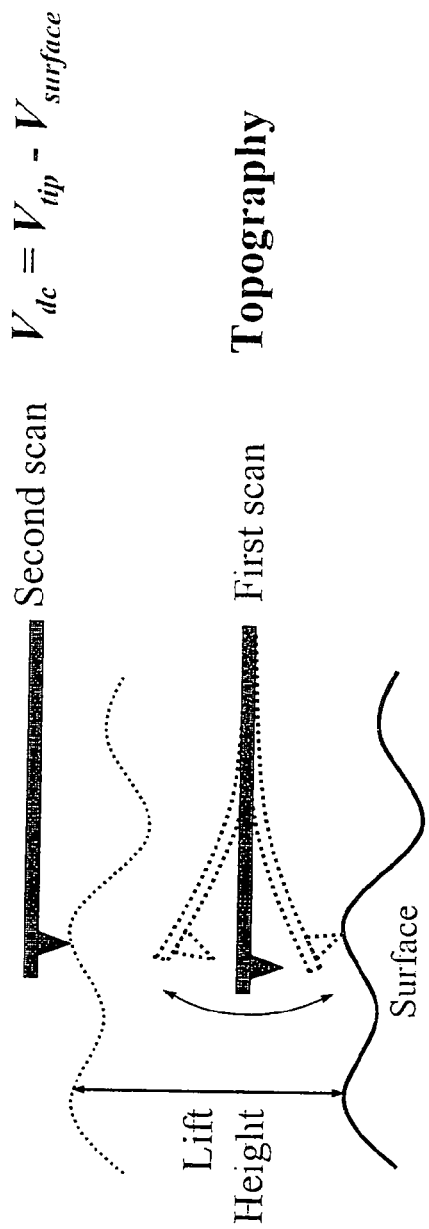
$F_{dc} = Q_s^2 / 4\pi\varepsilon_0 z^2 + Q_s CV_{dc} / 4\pi\varepsilon_0 z^2 + V_{dc}^2 C'/2$
When $V_{dc} = 0$,
EFM signal $\propto \Delta v \propto dF/dz \propto Q_s^2$
$V_{dc} = V_{tip} - V_{surface}$
b)

Experimental

100nm thick SiN membrane on p-type Si substrate 0.5μm wide Au electrode pairs with 1μm gap 3.5nm PbSe NCs with 1nm oleic acid capping in 9:1 hexane/octane Drop casting exposed to air <3min.

In vacuum P < 1 × 10$^{-5}$ torr

All later treatments *in situ*

Figure 40 *Changes upon Annealing at 430 K for 4 hours*

NANOSTRUCTURE ASSEMBLIES, METHODS AND DEVICES THEREOF

CROSS-REFERENCE TO RELATED APPLICATIONS

This application is the National Stage of International Application No. PCT/US2005/018342 filed May 25, 2005, which claims the benefit of U.S. Provisional Application No. 60/574,352, filed May 25, 2004, and U.S. Provisional Application No. 60/663,637, filed Mar. 21, 2005, the disclosures of which are incorporated herein by reference in their entirety.

STATEMENT OF GOVERNMENT RIGHTS

The invention was made with U.S. Government support. The Government may have certain rights in the invention under Office of Naval Research Grant No. N000140410489 and NSF IGERT Program Grant No. DGE-0221664.

FIELD OF THE INVENTION

The field of the invention generally relates to nanostructures, processes for manipulating nanostructures, and devices prepared using nanostructures.

BACKGROUND OF THE INVENTION

Interesting quantum effects occur when electrons are confined in small regions, such as in nanostructures, examples of which include quantum dots ("QD"), nanocrystals ("NCs"), and nanotubes ("NTs"). Quantum effects in nanostructures typically occur as a result of the quantization of electronic charges and spins and due to the interactions between electrons and the local environment [1] (Reference No. 1 listed below). Some of these effects (e.g., Coulomb blockade, size-dependent fluorescence of nanocrystals, and nanocrystal blinking) have only recently been observed. Furthermore, research efforts in the study of NCs have already led to new applications. The first prototypes of useful nanocrystal ("NC") devices based on quantum effects have been realized. Examples include a single-NC transistor [2], color-selective LEDs [3] and lasers [4,5], and nanoscale fluorescent markers [6,7].

As electronic circuitry shrinks, the dimensions of the circuitry will soon reach the NC size scales of a few nanometers where quantum effects tend to dominate electronic transport. Several properties of NCs that make them advantageous for use in quantum devices include, for example, small size to increase circuit density, room temperature quantum effects for ambient device operation, control of NC size, shape and composition, availability of large-scale synthetic techniques for preparing commercially viable amounts of NCs, and the ability of NCs to self-assemble.

NCs self-pack in either glassy arrays or ordered arrays, depending on the solvent composition and the drying parameters [16]. Although Brus and co-workers [24] have analyzed the drying-mediated self-assembly of nanoparticles using models of homogeneous and non-homogeneous solvent evaporation, the assembly process of nanostructures such as NCs is not fully understood.

The field of nanostructures is quite young. For example, researchers are currently working to discover, understand, and control mesoscopic effects that are observed in NC ordered arrays. Examples of mesoscopic effects include, inter alia, coulomb interactions, electron tunneling, charge ordering [8] and charge fluctuations. And because controlling such mesoscopic effects appears to be important for preparing electronic and optoelectronic devices, there is a continuing need to prepare nanostructure assemblies that are useful in preparing a wide variety of nanoscale electronic and optoelectronic devices. Examples of such electronic and optoelectronic devices include, inter alia, field-effect transistors ("FETs"), memory elements, photodiodes, sensors, and photovoltaic cells.

An array of coupled quantum dots has been proposed for quantum information processing ("QIP") [9,10]. Researchers have demonstrated coherent spin transfer between two CdSe NCs using optical means [11]. Large 3D arrays of more than a million disordered CdSe NCs have revealed the NC 'ensemble averages' of electronic transport [12-16]. Compared to the well-established quantum dots in two-dimensional electron gases ("2DEGs") [1], the NC QDs have not been electrically as controllable. Nanocrystal quantum dots are at least ten times smaller than 2DEG QDs and show quantum effects even at room temperature. However, small arrays of NC QDs, for example, a system of two NC QDs with independently controllable QDs, has not been achieved yet. Accordingly, there is presently a need to controllably assemble and configure small numbers (i.e., fewer than about 1000) of nanocrystal quantum dots and other nanostructures for preparing nanoscale electronic and optoelectronic devices.

SUMMARY OF THE INVENTION

Various aspects of the present invention are directed to providing well-defined assemblies of nanostructures having from 2 to about 1000 nanostructures, for example, from only a few nanostructures (fewer than about 10), such as in nanostructure chains, up to about 1000 nanostructures, such as in nanostructure 2D arrays (~100×100 nanostructures) and nanostructure 3D arrays (~10×10×10 nanostructures). Typical nanostructures useful in the present invention include nanocrystals and nanorods. A number of nanostructure geometric assembly configurations are useful in a number of electronic and optoelectronic applications, as well as in research methods for testing the basic mechanisms of charge transport in nanostructures, for example NC QDs.

Accordingly, in certain aspects, the present invention provides methods comprising providing a plurality of nanostructures, providing a substrate comprising at least one discontinuity, and contacting the plurality of nanostructures to the substrate, wherein at least a portion of the plurality of nanostructures assemble adjacent to the discontinuity, the assembled nanostructures including at least one nanostructure comprising a bridging molecule.

In other aspects of the present invention, there are provided devices, comprising a substrate comprising at least one discontinuity, and a plurality of spatially assembled nanostructures residing adjacent to the at least one discontinuity, wherein at least two of the spatially assembled nanostructures are linked by one or more bridging molecules.

Certain aspects of the present invention are also directed to providing electronic devices, for example, field-effect transistors ("FETs"). Accordingly, there are also provided field-effect transistors, comprising a substrate comprising a first surface and a second surface, a discontinuity situated on the first surface, a source electrode and a drain electrode situated directly adjacent to the discontinuity and the first surface, the source electrode and drain electrode being separated by a distance providing a gap therebetween of from about 10 nm to about 1000 nm wide, from 2 to about 1000 spatially assembled semiconducting nanostructures residing within the gap, wherein the nanostructures are electronically coupled to each other and the two electrodes by one or more bridging molecules, and a gate electrode situated on the second surface opposite to the spatially assembled nanostructures, the gate electrode capable of altering the charge carrier density of the nanostructures when a gate voltage is applied.

The present invention also provides nanocrystal arrays comprising at least two molecularly bridged nanocrystals, as well as field effect transistors comprising at least two metal electrodes spaced apart and mounted to a substrate, having such nanocrystal arrays positioned within the space between the electrodes.

Other aspects of the present invention will be apparent to those skilled in the art in view of the detailed description and drawings of the invention as provided herein.

BRIEF DESCRIPTION OF THE DRAWINGS

The foregoing summary, as well as the following detailed description, is further understood when read in conjunction with the appended drawings. For the purpose of illustrating the invention, there is shown in the drawings exemplary embodiments of the invention; however, the invention is not limited to the specific methods, compositions, and devices disclosed. In the drawings:

FIG. 5 shows several electron micrographs of assembled NCs of the present invention: configurations of a) 2, b) 3, c) 4, d) 5, e) 7 CdSe NCs. The NC diameters are 5 nm.

FIG. 18 is a schematic illustration of an embodiment of a substrate used in the present invention having a plurality of electrode discontinuities deposited on a substrate.

FIG. 26 depicts a correlation of (a, b) EFM and (c, d) TEM imaging of a device of the present invention. The scale bars in (c) is 200 nm and in (d) is 10 nm.

FIG. 27 are (a) SEM and (b) TEM electron micrographs of membrane patterning used in preparing the devices of the present invention.

FIG. 28 is a schematic illustration (a) and electron micrographs (b, c, d) of channel control used in preparing the devices of the present invention.

FIG. 33 are TEMs of one of the electrodes of FIG. 33 that has been further processed to form a gap having a width of about 100 nm. (a) scale bar is 10 microns; (b) scale bar is 1 micron. (b) shows the gap.

FIG. 36 is a schematic illustration of the mechanism of conducting EFM measurements on FETs of the present invention; (a) an embodiment of an FET of the present invention comprising a gate electrode (bottom, grounded), source and drain electrodes, a linear array of 15 ordered nanocrystals, 2 disordered nanocrystals, and extra assembled nanocrystals adjacent the electrode and not part of the ordered array; (b) illustration of EFM scanning sing an AFM tip.

DETAILED DESCRIPTION OF ILLUSTRATIVE EMBODIMENTS

Figure 1:
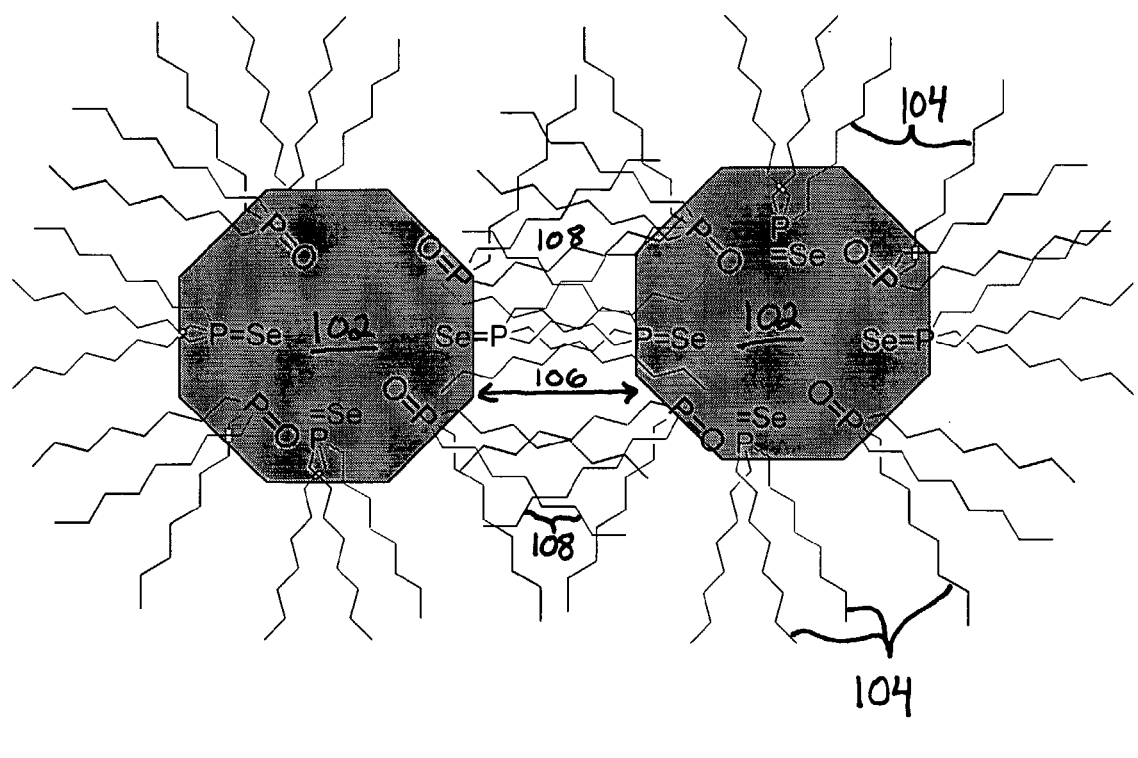
FIG. 1 is a schematic illustration of an embodiment of a molecularly bridged array of two neighboring nanocrystals with alkane bridging molecules (tri-octylphosphine oxide). The distance between the nanocrystals is approximately equal to the length of a bridging molecule.

The present invention may be understood more readily by reference to the following detailed description taken in connection with the accompanying figures and examples, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable. When any variable occurs more than one time in any constituent or in any formula, its definition in each occurrence is independent of its definition at every other occurrence. Combinations of substituents and/or variables are permissible only if such combinations result in stable compounds.

As employed above and throughout the disclosure, the following terms, unless otherwise indicated, shall be understood to have the following meanings.

A "nm" is a nanometer, $10^{-9}$ meters.

A "nanostructure" is a structure having at least one region or characteristic dimension with a dimension of less than about 500 nm, e.g., less than about 200 nm, less than about 100 nm, less than about 50 nm, or even less than about 20 nm. Preferably, the nanostructures have a characteristic dimension in the range of from about 1 nm to about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in several embodiments can be heterogeneous (e.g., heterostructures). Nanostructures can be, e.g., substantially crystalline, substantially monocrystalline, polycrystalline, amorphous, or a combination thereof. In one aspect, each of the three dimensions of the nanostructure has a dimension of less than about 500 nm, e.g., less than about 200 nm, less than about 100 nm, less than about 50 nm, or even less than about 20 nm. Preferably, each of the three dimensions of the nanostructure has a dimension in the range of from about 1 nm to about 20 nm. Nanostructures can comprise one or more surface ligands (e.g., surfactants, bridging molecules, or both).

A "crystalline nanostructure" is a nanostructure that is substantially monocrystalline. A crystalline nanostructure has at least one region or characteristic dimension with a dimension of less than about 50 nm, e.g., less than about 20 nm, less than about 10 nm, less than about 5 nm, or even less than about 2 nm. In certain preferred embodiments, nanocrystals have a dimension in the range of from about 1 nm to about 20 nm. Typically, the region or characteristic dimension will be along the smallest axis of the structure. Examples of such structures include nanowires ("NWs"), nanorods ("NRs"), nanotubes ("NTs"), branched nanowires ("b-NWs"), nanotetrapods ("N4Ps"), nanotripods ("N3Ps"), nanobipods ("N2Ps"), nanocrystals (NCs), nanodots ("NDs"), quantum dots ("QDs"), nanoparticles ("NPs"), nanoribbons ("NRs"), and the like. Any nanocrystal shape or morphology can be used in the present invention, and the nanocrystals are preferably spherical in shape. Crystalline nanostructures can be substantially homogeneous in material properties, or in several embodiments can be heterogeneous (e.g., heterostructures). Crystalline nanostructures preferably comprise one or more surface ligands (e.g., surfactants or bridging molecules). Crystalline nanostructures are optionally substantially single crystal in structure (a "single crystal nanostructure" or a "monocrystalline nanostructure"). Crystalline nanostructures for use in the present invention can be fabricated from essentially any convenient material or materials, and preferably the nanostructure is prepared from an inorganic material, e.g., an inorganic conductive or semiconductive material. A conductive or semi-conductive crystalline nanostructure often displays 1-dimensional quantum confinement, e.g., an electron can often travel along only one dimension of the structure. Crystalline nanostructures can be substantially homogeneous in material properties, or in several embodiments can be heterogeneous (e.g., heterostructures). The term "crystalline" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. Crystalline nanostructures can be fabricated from essentially any convenient material or materials.

"Plurality" refers to a collection of two or more objects.

"Substrate" refers to a material base object upon or beneath which an additional object or objects are placed or affixed.

"Discontinuity" refers to a sudden change in surface topology. With respect to materials such as substrates, a discontinuity gives rise to a sudden change in surface properties of the material, for example, the surface energy. Examples of discontinuities include an edge, step, trench, gap, point, ridge, hole, channel, plateau, bridge, or any combination thereof.

The verb "to assemble" refers to the action of arranging matter or objects.

The noun "assembly" refers to an arrangement of matter.

"Assembled nanocrystal" refers to a nanocrystal that had previously been subjected to the action of assembly.

"Spatially assemble" refers to the action of arranging matter or objects in space.

"Spatially assembled" refers to the state of objects that have previously been assembled in a spatial arrangement. Spatially assembled objects may be ordered, disordered, or both.

"Ordered" refers to an organized periodic arrangement.

"Disordered" refers to a disorganized arrangement.

"Spatially ordered" refers to an organized periodic arrangement of entities in space.

"Regularly spaced" refers to an ordered assembly of substantially equal-sized entities. "Substantially equal-sized entities" may vary in size to the extent that the degree of order of the ordered assembled does not change.

"Adjacent" refers to two or more entities, such as objects, surfaces, or any combination thereof, that reside near each other and are physically affected by their proximity to each other.

"Directly adjacent" refers to two or more adjacent entities that are in physical contact with each other.

"Bridging molecule" refers to a molecule that contacts two or more entities that are not directly adjacent; synonymous with "molecular bridge".

"Molecularly bridged" refers to two or more entities that are adjacent to each other in which one or more molecules are directly adjacent to each of the entities, or one or more molecules directly adjacent to one of the entities are directly adjacent to one or more molecules adjacent to another of the entities. A bridging molecule may bond to one or more entities through covalent bonding, ionic bonding, hydrogen bonding, van der Waals bonding, dispersive bonding, cohesive bonding, or any combination thereof.

"Entities" refers to matter, such as objects, surfaces, or any combination thereof, "Fluid" refers to the thermodynamic states of matter that include the liquid state, the gas state, the supercritical state, or any combination thereof.

"Covalently attached" refers to chemical covalent bonding.

"Electronically couple" refers coupling two or more entities so that the electronic state of one entity is affected by the electronic state of another entity or entities.

"Electrode" refers to a material object capable of transporting electrons.

"Organic" refers to a composition of matter comprising carbon atoms.

"Inorganic" refers to a composition of matter consisting essentially of atoms other than carbon.

"Polymer" refers to a composition of matter having a plurality of linked chemical units.

"Electrically conductive" refers to a composition of matter that has the capacity for electron conduction, hole conduction, or the ability to otherwise undergo charge transfer.

"Electrically insulating" refers to a composition of matter that does not have the capacity for electron conduction, hole conduction, or the ability to otherwise undergo charge transfer.

"Linked" refers to two or more entities that are molecularly bonded or directly adjacent to each other.

A "gap" is a region in space formed between two or more solid entities that are proximate to, but not directly adjacent to, each other.

"Majority" refers to more than half.

"Minority" refers to less than half.

"Substantially" is used to modify the importance, value, degree, amount, or extent of a subject word or phrase to indicate that the absolute meaning or value of the modified word or phrase is not required as long as the function or effect of the subject word or phrase is achieved. For example, the phrase "substantially all of (subject word or phrase)" means that not all of the (subject word or phrase) is required for achieving the required function or effect that all of the (subject word or phrase) would otherwise provide.

"Transmissive" refers to the ability of photons to pass through a material.

"Optically transparent" refers to a transmissive material that absorbs less than a majority of photons that impinge the transmissive material.

Nanostructures for use in the present invention include, but are not limited to nanoscale and non-nanoscale (e.g., bulk crystalline) assemblies. Nanostructures, such as nanocrystals, nanowires, nanorods, nanoparticles and the like, can be fabricated by a number of synthetic procedures known to one of skill in the art. Nanostructure size can be controlled by any of a number of convenient methods that can be adapted to different materials. For example, synthesis of nanocrystals of various composition is described in, e.g., Peng et al. (2000) "Shape control of CdSe nanocrystals," Nature 404:59-61; Puntes et al. (2001), "Colloidal nanocrystal shape and size control: The case of cobalt," Science 291:2115-2117; U.S. Pat. No. 6,306,736 to Alivisatos et al. (2001) entitled "Process for forming shaped group III-V semiconductor nanocrystals, and product formed using process"; U.S. Pat. No. 6,225,198 to Alivisatos et al. (2001) entitled "Process for forming shaped group II-VI semiconductor nanocrystals, and product formed using process"; U.S. Pat. No. 5,505,928 to Alivisatos et al. (1996) entitled "Preparation of III-V semiconductor nanocrystals"; U.S. Pat. No. 5,751,018 to Alivisatos et al. (1998) entitled "Semiconductor nanocrystals covalently bound to solid inorganic surfaces using self-assembled monolayers"; U.S. Pat. No. 6,048,616 to Gallagher et al. (2000) entitled "Encapsulated quantum sized doped semiconductor particles and method of manufacturing same"; and U.S. Pat. No. 5,990,479 to Weiss et al. (1999) entitled "Organo luminescent semiconductor nanocrystal probes for biological applications and process for making and using such probes." The portion of each of the aforementioned U.S. patents pertaining to the synthesis of nanocrystals are hereby incorporated by reference herein.

Methods of the present invention for providing assemblies of nanostructures, such as nanocrystals, nanorods, nanowires, and the like, are provided herein. Various embodiments of these methods comprise providing a plurality of nanostructures; providing a substrate comprising at least one discontinuity; and contacting the plurality of nanostructures to the substrate, wherein at least a portion of the plurality of nanostructures assemble adjacent to the discontinuity, the assembled crystalline nanostructures including at least one crystalline nanostructure comprising a bridging molecule. Suitable nanostructures used in these methods include nanowires, nanorods, nanotubes, branched nanowires, nanotetrapods, nanotripods, nanobipods, nanocrystals (NCs), nanodots, quantum dots, nanoparticles, nanoribbons, or any combination thereof. At least one of the assembled nanostructures includes a bridging molecule, and preferably substantially all or all of the assembled nanostructures include a bridging molecule. Any of the aforementioned nanostructures can suitably be assembled following the methods provided herein, and preferably, the nanostructures include nanocrystals, nanorods, or any combination thereof.

The assembly methods provided herein include a step of contacting the plurality of nanostructures to a discontinuity. Several types of suitable contacting steps used to assemble nanostructures according to the methods of the present invention include depositing nanostructures from a dispersion comprising nanostructures and a fluid, positioning nanostructures using an atomic force microscope tip, depositing nanostructures using a dip pen nanolithography tip, or any combination thereof. For example, in embodiments that include the step of depositing nanostructures from a dispersion comprising nanostructures and a fluid, the nanostructures can be suitably deposited to the substrate using coating, dipping, electroplating, or any combination thereof. Without being bound by any particular theory of operation, the nanostructures preferably assemble to the discontinuity as a result of a sudden change in surface properties of the substrate material. For example, a discontinuity in the surface energy is thermodynamically unfavorable. Accordingly, surface discontinuities gives rise to a thermodynamic driving force that assembles the nanocrystals at the discontinuity. In these embodiments where the nanocrystals are applied from a fluid medium, the methods of assembly will typically include at least one additional step of removing fluid from the substrate. Fluid is suitably removed by evaporation or drying using vacuum, heat, a drying gas, or any combination thereof. The assembly of nanostructures at a discontinuity on the substrate using fluid nanostructure dispersions is, in several embodiments, accompanied by the depositing of nanostructures elsewhere on the substrate away from the discontinuity. Accordingly, in several embodiments it is desirable to remove or wash excess nanostructures that are adjacent to the substrate and not adjacent to the discontinuity. Excess nanostructures may suitably be removed using any of a variety of lithographic, AFM, and ion beam techniques.

After the nanostructures are assembled on the discontinuity, an additional step of heating the nanostructures after the contacting step can be carried out. Heating the assembled nanostructures above the temperatures necessary to drive off adsorbed fluid from the assembly can be used to anneal the assembly. Annealing is useful, for example, to increase the electrical conductivity of the assembled nanostructures, the nanostructures are suitably annealed by heating up to about 500° C., more typically up to about 430° C., and more typically up to about 350° C.

The methods of assembling nanostructures according to several embodiments of the present invention include at least one of the nanostructures in the assembly having at least one bridging molecule. In several embodiments, it is preferred that a plurality of bridging molecules are covalently attached to the surface of each assembled nanostructure. Preferably, the bridging molecules link adjacent nanostructures in the assembly. Typically, the distance between two neighboring nanostructures is up to about the length of one of the bridging molecules. For example, referring to FIG. 1, there is illustrated a molecularly bridged array 100 having two Se-containing assembled nanocrystals 102, each nanocrystal having a plurality of alkyl hydrocarbon bridging molecules (104, 108) covalently attached to the surfaces of the nanocrystals 102. The nanocrystals 102 are separated by distance 106. The two nanocrystals 102 are adjacent to each other through the intervening alkyl hydrocarbon bridging molecules 108. The bridging molecules 108 between adjacent assembled nanostructures 102 electronically couple by electron tunneling or capacitive coupling in preferred embodiments of the invention. The bridging molecules may bond to one or more adjacent nanostructures, to one or more directly adjacent bridging molecules, or both during the assembly process. For example, in several embodiments, at least one of the bridging molecules covalently bonds two assembled nanostructures.

Figure 16:
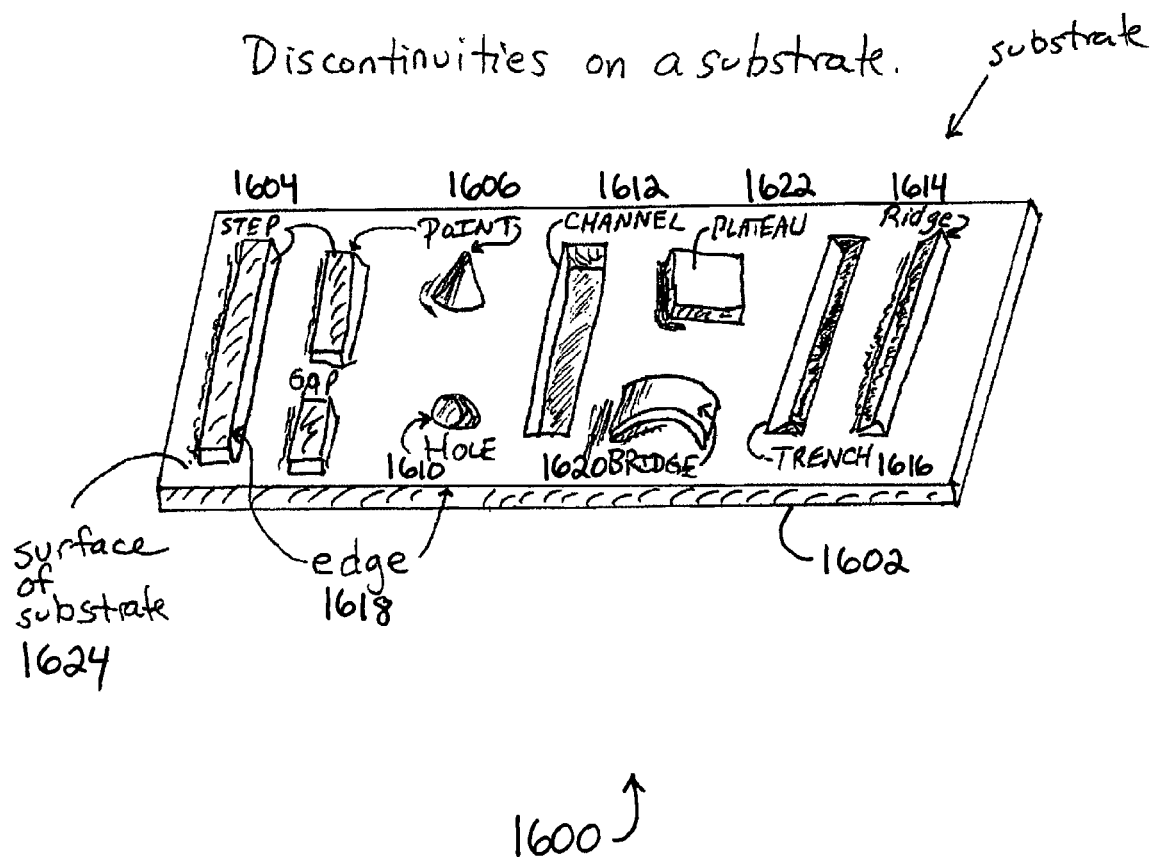
FIG. 16 is a schematic illustration of various types of discontinuities on a substrate.

The assembly of a plurality of nanostructures having at least one bridging molecule at a discontinuity also provides an embodiment of the present invention wherein at least one of the bridging molecules links at least one of the nanostructures to the discontinuity. In this embodiment, the nanostructure that is linked to the discontinuity electronically couples to the discontinuity. Electronic coupling of the nanostructure to the discontinuity is particularly useful in embodiments wherein the discontinuity comprises an electrode, such as for use in an electronic or optoelectronic device or circuit. In the methods provided herein, a suitable discontinuity includes an edge, step, trench, gap, point, ridge, hole, channel, plateau, bridge, or any combination thereof. An illustration of a variety of suitable discontinuities on a substrate (1600) is provided in FIG. 16. For example, discontinuities direct the assembly of NCs by introducing a feature on the surface (1624) of a substrate (1602) that forces the NCs to assemble, for example, as the solvent they are dispersed in evaporates. Suitable discontinuities include a step (1604), a point (1606), a hole (1610), a channel (1612), a ridge (1614), a trench (1616), an edge (1618), a bridge (1620) and a plateau (1622).

Suitable bridging molecules may be organic, inorganic, or both. In various embodiments, organic bridging molecules suitably include an alkyl phosphine oxide, a molecule comprising aromatic, amine or thiol functionality, an electrically conductive molecule, oligomer or polymer, or any combination thereof. Suitable bridging molecules may include any of the small molecules, oligomers or polymers disclosed in U.S. Pat. App. Pub. No. 2004/0178390 to Whiteford et al., (Sep. 16, 2004), the disclosure of which pertaining to small molecules, oligomers or polymers suitable for modifying charge transport across a nanocrystal surface or within a nanocrystal-containing matrix, is incorporated by reference herein. Suitable alkyl phosphine oxides include an alkyl group composed of a linear, branched or cyclic hydrocarbon, the hydrocarbon composed of from 1 to about 100 carbon atoms and from 1 to about 200 hydrogen atoms. Typically, the alkyl phosphine oxide is tri-octylphosphine oxide or tri-butylphosphine oxide. For bridging molecules that include aromatic, amine or thiol functionality, the functionality suitably includes a linear, branched or cyclic heteroatom group composed of from 1 to about 30 carbon atoms, from 1 to about 60 hydrogen atoms, and from 1 to about 60 atoms that are not carbon or hydrogen.

As the nanostructures assemble, certain preferred embodiments of the method of the present invention include a majority of the nanostructures spatially assembling into an ordered arrangement adjacent to the discontinuity. As these nanostructures spatially assembly, at least a portion of the plurality of nanostructures can assemble directly adjacent to the discontinuity or is linked to the discontinuity by one or more bridging molecules.

Suitable nanorods used in the present invention can be made according to the processes disclosed in U.S. Pat. No. 6,225,198 and U.S. Pat. App. Pub. 2005/0054004, the portion of each pertaining to the preparation of nanorods is incorporated by reference herein.

Suitable nanocrystals used in the present invention are commercially available from Evident Technologies, Troy, New York. Suitable PbSe nanocrystals useful in various embodiments of the present invention range in size from about 1 nm to about 10 nm in diameter, and typically from about 2 nm to about 8 nm in diameter. Blends of different sizes of nanocrystals may also be used, for example for tailoring the absorbance and emission spectrum of an optoelectronic device. Suitable PbSe nanocrystals may have a core-shell structure composed of a semiconducting core material and an optional semiconducting shell material. Preferably, the PbSe nanocrystals comprise substantially a core. Suitable nanocrystals also comprise one or more ligand molecules attached or adsorbed to the surface of the quantum dot. Suitable ligand molecules include organic moieties that give rise to a ligand layer, preferably an organic ligand layer, of from about 0.1 nm to 10 nm thick, typically from about 0.2 nm to about 5 nm thick, and more typically of from about 0.5 nm to about 3 nm thick. In certain preferred embodiments, the PbSe nanocrystals include surfactant fragments, such as oleic acid fragments, which preferably are about 1 nm to about 3 nm in length.

In addition to PbSe, certain other nanocrystals may also be used in the present invention, many of which are described by Bawendi et al., in WO2004078027 A2, the description of which pertaining to the synthesis of nanocrystals is incorporated by reference herein. A suitable nanocrystal can be a member of a population of nanocrystals having a narrow size distribution. A suitable nanocrystal can be a sphere, rod, disk, or other shape. Spherical nanocrystals are preferred.

Suitable nanostructures are particles composed of a semiconductor material having a particle size in the range of from about 0.5 nm to about 20 nm, typically in the range of from about 1 nm to about 15 nm more typically in the range of from about 2 nm to about 12 nm, and even more typically in the range of from about 3 nm to about 9 nm. In several embodiments, suitable nanocrystals include a composition having the formula MX, where M is lead, tin, germanium, cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The semiconductor forming the nanostructure, such as a nanocrystal, can include Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. Nanostructures prepared from Group IV-VI (e.g., PbSe and InAs) are particularly suitable for providing nanocrystals that emit in the NIR spectrum, with PbSe being preferred.

The population of nanostructures can have a narrow size distribution. For example, in nanocrystals, the population can be monodisperse and can exhibit less than about 15% RMS ("Root-Mean-Square") deviation in diameter of the nanocrystals, preferably less than about 10% RMS, more preferably less than about 5% RMS. In several embodiments, the population of nanocrystals can be polydisperse, for example exhibiting a deviation in diameter of greater than about 15% RMS, preferably greater than about 25% RMS, and more preferably greater than about 35% RMS. In several embodiments, the size distribution can be bimodal, for example composed of a population of two narrow size distribution nanocrystals, trimodal, for example composed of a population of three narrow size distribution nanocrystals, or polymodal, for example composed of a population of n narrow size distribution nanocrystals, wherein n is 4 or greater.

Many suitable nanocrystals are commercially available, for example, from Evident Technologies, Troy, N.Y. The preparation of a wide variety of nanocrystals are also known to those skilled in the art. For example, U.S. Pat. No. 6,322,901 to Bawendi et al., incorporated herein by reference, discloses the synthesis of CdX/ZnY core/shell nanoparticles, where X is S, Se and Te, and Y is S and Se. These methods of preparing semiconductor nanocrystals include pyrolysis of organometallic reagents, such as dimethyl cadmium, injected into a hot, coordinating agent. This permits discrete nucleation and results in the controlled growth of macroscopic quantities of nanocrystals. Suitable nanocrystals can be synthesized using colloidal growth process and can produce a monodisperse particle population. Colloidal growth occurs by rapidly injecting an M donor and an X donor into a hot coordinating agent. The injection produces a nucleus that can be grown in a controlled manner to form a nanocrystal. The reaction mixture can be gently heated to grow and anneal the nanocrystal. Both the average size and the size distribution of the nanocrystals in a sample typically depend on the growth temperature. The growth temperature for maintaining steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be related to as a size. The process of controlled growth and annealing of the nanocrystals in the coordinating agent that follows nucleation can also result in uniform surface derivatization and regular core structures. As the size distribution sharpens, the temperature can be raised to maintain steady growth. By adding more M donor or X donor, the growth period can be shortened.

Suitable nanocrystals typically emit light in the near infrared ("NIR") or infrared ("IR") wavelength regions when excited with incident radiation. An example of a semiconductor nanocrystal that emits light in the near infrared or infrared wavelength regions is PbSe nanocrystals having a particle size in the range of from about 1 nm to about 10 nm.

The nanostructures of certain preferred embodiments for use in electronic and opto-electronic applications are composed of CdSe, CdSe/ZnS, Cd/Te, Pb/Se, or any combination thereof. The nanostructures suitably have an average particle size of the nanostructures is between about 1 nm and about 20 nm, preferably wherein the RMS particle size deviation of the assembled nanostructures is less than about 5%.

The discontinuities may be fabricated by removing material from a suitable substrate or by adding material to a suitable substrate. For example, a substrate may be processed using chemical or ion beam etching to remove substrate material that results in the formation of one or more channels, holes, bridges, steps, gaps, points, plateaus, ridges or trenches. Material may also be added to the substrate using coating or chemical vapor deposition processes to form one or more channels, holes, bridges, steps, gaps, points, plateaus, ridges or trenches wherein the discontinuity includes one or more electrodes. Atoms and molecules can also be added to a substrate, moved from one location on a substrate to another location on a substrate, removed from a substrate, or any combination thereof, by use of a suitable atomic force microscope tip, or the like. Bridges may also be provided using a material in the form of a thin membrane. Suitably, a combination of methods is used to remove and add material to the substrate to form the discontinuities. Materials that are added or removed to the substrate may include one or more materials for suitably providing one or more electrodes to the surface. In these embodiments, the discontinuity may be formed by one or more electrodes. Electrodes that are envisioned may be semiconducting but are preferably electrically conducting. Suitable electrodes are composed of a metal, a molecular wire, or both. In embodiments where the electrode includes a molecular wire, the electrode is typically placed directly adjacent to discontinuity on the substrate. Suitable molecular wires include a nanotube or an electrically conducting molecule, oligomer or polymer. Suitable nanotubes include a multi-walled carbon nanotube, a double-walled carbon nanotube, a single-walled carbon nanotube, or any combination thereof.

In several embodiments, a nanotube is assembled adjacent or directly adjacent to a discontinuity, and then another nanostructure, such as a nanocrystal, is assembled adjacent or directly adjacent to the nanotube. For example, by providing a nanotube including an acid functional group and at least one other nanostructure functionalized with an amine group, one embodiment of the method of the present invention further includes the step of reacting the acid functional group and the amine group to link the nanotube to the nanostructure. In this embodiment, the nanotube functions as an electrode for the nanostructure, and preferably, the nanotube functions as a molecular wire that electronically couples the linked nanostructure to a second electrode for use in a device. In these embodiments, the nanotube is preferably a single-walled carbon nanotube.

In other embodiments of the present invention, the discontinuity includes two electrodes directly adjacent to the substrate and a gap between the two electrodes. The gap between the two electrodes is suitably formed using e-beam lithography, break junction technique, electroplating, or any combination thereof. These techniques can be used to remove material from an electrode residing on the substrate that results in the formation of a gap between two electrodes. The gap can be from about 1 nm to about 3000 nm wide. Additional material removed from the location of the electrode can also give rise to the formation of one or more discontinuities in the substrate material, for example the formation of a channel in the substrate beneath the gap between the electrodes. In several embodiments, the gap between the two electrodes is from about 2 nm to about 100 nm wide. This range of gap widths suitably provides from 2 to 10 rows to assemble in the gap. The rows of nanostructures typically orient parallel to the surface profile of the adjacent electrode. For example, an electrode having a flat surface adjacent to the gap will typically give rise to rows of nanostructures oriented in a straight line parallel to the electrode surface. In addition to nanostructures being assembled between the electrodes, the methods of the present invention also encompass methods which includes the assembly of additional nanostructures directly adjacent to one or both electrodes, the additional nanostructures situated exterior to the gap.

The discontinuities are typically configured so that at least 2 nanostructures and up to about 100,000 nanostructures assemble adjacent to the discontinuity. In several embodiments of the present invention, the number of nanostructures that assemble adjacent to the discontinuity typically can also be in the range of from 2 to about 100,000 nanostructures, or from 2 to 10,000 nanostructures, or from 2 to 1000 nanostructures, or from 2 to 300 nanostructures, or from 2 to 100 nanostructures, or from 2 to 30 nanostructures, or from 2 to 10 nanostructures, or from 2 to 7 nanostructures, or 3, 4 or 5 nanostructures. Typically more than two nanostructures assemble adjacent to the discontinuity.

In carrying out the methods of the present invention, several of the embodiments include a majority of the nanocrystals spatially assembling into an ordered arrangement adjacent to the discontinuity. In these embodiments, the ordered arrangement includes a linear array, a two-dimensional array, a three-dimensional array, or any combination thereof. Suitable linear arrays include from 2 to about 1000 regularly spaced nanostructures, suitable two-dimensional arrays includes from 4 to about 10,000 nanostructures that are rectangularly or hexagonally configured, and suitable three-dimensional arrays include from 4 to 100,000 nanostructures. Three-dimensional arrays of nanostructures of the present invention typically have a regular geometric configuration, for example icosahedral, simple cubic, body-centered cubic, face-centered cubic, hexagonal close-packed, or any combination thereof.

Those of skill in the art will appreciate that perfect ordering of the nanostructures is not required to prepare useful electronic and opto-electronic devices. After the nanostructures have assembled, a minority of the nanostructures, or no nanostructures, adjacent to the discontinuity may be disordered. Typically, the disordered nanostructures can be observed in electron micrographs as being dislocated from, or not part of, the ordered assembly. Disordered nanostructures in assemblies typically arise as the number of nanostructures in the assembly increases above three, typically where the number of nanostructures in the assembly is greater than about 10, more typically greater than about 100, even more typically greater than about 1,000, and further typically greater than about 10,000. In these embodiments of the invention, typically fewer than about 20% percent of the assembled nanostructures adjacent to the discontinuity are disordered.

Any type of substrate material that is useful in the preparation of electronic or optoelectronic devices can be used in the present invention. Suitable substrates include silicon, silicon oxide, silicon dioxide, silicon nitride, silicon oxynitride, diamond, ceramic, polymer, or any combination thereof, such as a composite material. The substrates are typically electrically insulating. For opto-electronic applications, the substrate is preferably optically transparent. For example, in several embodiments, the substrate is transmissive to photons having at least one wavelength in the range of from 200 nm to 2000 nm. In other embodiments, the substrate can be transmissive to ultraviolet light, visible light, infrared light, or any combination thereof. In other embodiments, the substrates can be electrically conductive, such as a metallic or electrically conductive thin film.

In one embodiment of the method of the present invention, a plurality of CdSe nanocrystals are provided in a fluid dispersion and contacted to a silicon substrate comprising at least one edge discontinuity and two electrodes positioned directly adjacent to the edge discontinuity. The two electrodes providing a gap having a width of about 10 nm to about 100 nm, wherein from 2 to 10 nanostructures assemble within the gap. At least a portion of the nanocrystals assemble adjacent to the discontinuity, the assembled nanocrystals including at least one nanocrystal comprising a bridging molecule wherein the substrate includes an edge discontinuity. This is further illustrated in FIG. 7, as discussed below.

The devices of the present invention typically include a substrate having at least one discontinuity, and a plurality of spatially assembled nanostructures residing adjacent to the at least one discontinuity, wherein at least two of the spatially assembled nanostructures are linked by one or more bridging molecules. Suitable nanostructures include nanowires, nanorods, nanotubes, branched nanowires, nanotetrapods, nanotripods, nanobipods, nanocrystals, nanodots, quantum dots, nanoparticles, nanoribbons, or any combination thereof. Preferably, the nanostructures include nanocrystals, nanorods, or any combination thereof. In certain embodiments, substantially all or all of the spatially assembled nanostructures are linked by one or more bridging molecules, and preferably at least two adjacent nanostructures are linked by a bridging molecule. In other embodiments, at least one nanostructure is linked by one or more bridging molecules to an electrode residing at the discontinuity. The devices of the present invention may include any of a variety of additional nanostructures. For example, the devices may further comprising one or more nanostructures that are adjacent to the substrate and not adjacent to the discontinuity.

The devices of the present invention may desirably have a spatially ordered assembly of nanostructures that is electrically conductive. In several embodiments, sufficient conductivity in the spatially assemblies is achieved after the nanostructures are annealed, as described further herein.

The spatially assembled nanostructures typically have at least one bridging molecule that is linked to the surface of one nanostructure. The bridging molecules typically link the spatially assembled nanostructures to electronically couple the nanostructures. Linking of the nanostructures can be done in any of a variety of ways. For example, in several embodiments, each of the spatially assembled nanostructures may include a surface and a plurality of bridging molecules covalently attached to the surface. Preferably, all of the spatially assembled nanostructures are linked by bridging molecules. In other embodiments, at least one of the bridging molecules is covalently bonded to two of the spatially assembled nanostructures. In addition, the nanostructures may be linked to the discontinuity. For example, at least one of the spatially assembled nanostructures can be linked to the discontinuity. Preferably, the nanostructure linked to the discontinuity is electronically coupled to the discontinuity, which is advantageous in applications involving the control of current between the spatially assembled nanostructures and one or more discontinuities that are electrically conductive.

In several embodiments, the devices of the present invention may have any combination of nanocrystals and bridging molecules that results in neighboring nanostructures being electronically coupled. For example, two neighboring nanostructures may be electronically coupled by a molecular wire. In other embodiments, an electrically conductive polymer molecular can be sufficiently long to electronically couple two or more nanostructures. Bridging molecules may be of sufficient length, as in electrically conductive polymers, so that the distance between two neighboring nanostructures is less than the length of the bridging molecules. In other embodiments, the combination of nanostructures and bridging molecules provides devices of the present invention so that the distance between two neighboring nanostructures is up to about the length of one of the bridging molecules.

The devices of the present invention will typically include at least one discontinuity that is used for assisting assembling of the nanostructures. For example, suitable devices include at least one discontinuity such as an edge, step, trench, gap, point, ridge, hole, channel, plateau, bridge, or any combination thereof, as illustrated above in FIG. 16.

Additional fabrication details of the devices of the present invention may also include any of the methods described herein that includes providing a plurality of nanocrystals, providing a substrate comprising at least one discontinuity, and contacting the plurality of nanocrystals to the substrate, wherein at least a portion of the plurality of nanocrystals assemble adjacent to the discontinuity, the assembled nanocrystals including at least one nanocrystal comprising a bridging molecule. For example, the description herein for methods of assembling a variety of nanostructures on a substrate having at least one discontinuity may be used in preparing various embodiments of devices of the present invention. For example, the bridging molecules may be organic, inorganic, or both. The organic bridging molecules may include an alkyl phosphine oxide, a molecule comprising aromatic, amine or thiol functionality, an electrically conductive molecule, oligomer or polymer, or any combination thereof. In other embodiments, the devices may include a majority of the nanostructures being configured in a spatially ordered arrangement adjacent to the discontinuity. For example at least a portion of the plurality of nanostructures can be assembled directly adjacent to the discontinuity or is linked to the discontinuity by bridging molecules.

The devices of the present invention may use any of the nanostructures that are described herein. Preferred assemblies of the nanostructures that are described herein are also preferably used in preparing the preferred devices of the present invention. In certain preferred embodiments, the nanostructures include any of the semiconducting nanocrystals or nanorods that are further described herein.

The device discontinuity can also include one or more electrodes in several embodiments of the present invention. Preferably, the discontinuity includes a gap formed between two or more electrodes. The electrodes are suitably conducting or semiconducting. Electrically conducting electrodes can be composed of a metal, a molecular wire, or both. Suitable molecular wires includes a nanotube or an electrically conducting molecule, oligomer or polymer. A suitable nanotube includes a multi-walled carbon nanotube, a double-walled carbon nanotube, or a single-walled carbon nanotube, and preferably the nanotube is linked to a nanostructure so that the nanotube electronically couples the linked nanostructure to a second electrode.

In other embodiments, the discontinuity includes two electrodes directly adjacent to the substrate and a gap between the two electrodes. Suitable electrodes are typically between about 10 nm and about 100 nm in height measured relative to the substrate. The gap between the two electrodes is typically from about 1 nm to about 3000 nm wide, and preferably from about 2 nm to about 100 nm wide. From 2 to 10 nanostructures can also be spatially assembled in the gap, which may further include additional nanostructures situated exterior to the gap and directly adjacent to one or both electrodes.

Devices may have anywhere from 2, 3, 4, or 5 nanostructures to fewer than about 100,000, or fewer than about 10,000, or fewer than about 1,000 or fewer than about 300, or fewer than about 100, or fewer than about 30, or fewer than about 10, or fewer than about 7, or spatially ordered nanostructures adjacent to the discontinuity. In many embodiments, there are more than 2 nanostructures spatially ordered adjacent to the discontinuity in the devices of the present invention.

In several embodiments, the devices have a spatially ordered arrangement that includes a linear array, a two-dimensional array, a three-dimensional array, or any combination thereof. For example, the linear array may include from 2 to 1000 regularly spaced nanostructures, or a two-dimensional array includes from 4 to 10,000 nanostructures that are rectangularly or hexagonally configured. Similarly, devices having the three-dimensional array includes from 4 to 100,000 nanostructures. Configurations of the nanostructures useful in the devices of the present invention are provided hereinabove.

Substrates useful in the devices of the present invention are also provided hereinabove, for example, suitable substrates may be composed of silicon, silicon oxide, silicon dioxide, silicon nitride, silicon oxynitride, diamond, ceramic, polymer, or any combination thereof. Typically the substrate includes an edge discontinuity, two electrodes positioned directly adjacent to the edge discontinuity, the two electrodes providing a gap having a width of about 10 nm to about 100 mn, and from 2 to 10 nanostructures assembled within the gap. In several preferred embodiments, devices of the present of the present invention further include a gate electrode situated directly adjacent to the substrate, the gate electrode situated on a surface of the substrate opposite the plurality of spatially assembled nanostructures.

The field-effect transistors ("FETs") of the present invention include a substrate comprising a first surface and a second surface, a discontinuity situated on the first surface, a source electrode and a drain electrode situated directly adjacent to the discontinuity and the first surface, the source electrode and drain electrode being separated by a distance providing a gap therebetween of from about 10 nm to about 1000 nm wide, from 2 to about 1000 spatially assembled semiconducting nanostructures residing within the gap, wherein the nanostructures are electronically coupled to each other and the two electrodes by one or more bridging molecules, and a gate electrode situated on the second surface opposite to the spatially assembled nanostructures, the gate electrode capable of altering the charge carrier density of the nanostructures when a gate voltage is applied.

Any type or combination of the various nanostructures provided herein can be used for preparing the FETs of the present invention. Suitable nanostructures include nanowires, nanorods, nanotubes, branched nanowires, nanotetrapods, nanotripods, nanobipods, nanocrystals (NCs), nanodots, quantum dots, nanoparticles, nanoribbons, or any combination thereof. In preferred embodiments, the nanostructures include nanocrystals, nanorods, or any combination thereof. Among all of the nanostructures described herein, the preferred nanostructures used in the FETs have an average particle size in the range of from about 1 nm to about 20 nm, and are composed of a core or a core/shell morphology. Preferred compositions are composed of CdSe, CdSe/ZnS, Cd/Te, Pb/Se, or any combination thereof.

In the FETs of the present invention, any suitable electrically conductive material may be used as the source and drain electrodes. Preferably, the source and drain electrodes are composed of a metal, a molecular wire, or both. Suitable metals include gold, silver, platinum, palladium, aluminum, copper, or any combination thereof. Suitable molecular wires include a nanotube, an electrically conducting molecule, oligomer or polymer, or both. Suitable nanotubes include multi-walled carbon nanotubes, double-walled carbon nanotubes, or single-walled carbon nanotubes. For improving electronic coupling effects, it is preferred that the nanotube is functionalized for linking at least one of the nanostructures. In embodiments incorporating nanotubes, it is preferred that the nanotube, especially a single-walled carbon nanotube, electronically couples the linked nanostructure to one of the source or drain electrodes.

The field-effect transistors of the present invention can be fabricated according to any of the procedures for preparing devices of the present invention, and also including provision of a gate electrode. Any of the methods of providing assembled nanostructures adjacent to one or more discontinuities are also used in preparing the FETs of the present invention. For example, the distance between neighboring nanostructures assembled on the discontinuity can be up to about the length of one of the bridging molecules in the FETs. A suitable discontinuity includes an edge, step, trench, gap, point, ridge, hole, channel, plateau, bridge, or any combination thereof. In addition, the field-effect transistors may further comprise additional nanostructures situated exterior to the gap and directly adjacent to one or both electrodes. In other embodiments, the field-effect transistor may have a majority or all of the nanostructures reside spatially ordered in the gap. The number of nanostructures that the FETs of the present invention can incorporate generally follows the teachings of the devices as provided herein. For example, the FETs may have from 2 to 100,000 nanostructures, or fewer nanostructures as provided herein. Likewise, the spatial ordering and geometric configurations of the nanostructures of the FETs follows that of the devices as described herein. For example, the FETs in several embodiments may have from 2 to about 10,000 nanostructures that are rectangularly or hexagonally configured in a two-dimensional pattern. Fewer than about 10,000 nanostructures can be incorporated in FET embodiments of the present invention. For example, fewer than about 5,000, or about 2,000, or about 1,000, or about 500, or about 200, or about 100, or about 50, or about 20, or about 10 nanostructures can be configured to prepare the FETs of the present invention. Preferably the nanostructures comprise a plurality of semiconducting nanocrystals as provided herein. Preferably at least a portion of the nanostructures are molecularly bridged.

In preferred embodiments, the field-effect transistors of the present invention include a substrate that is composed of silicon, silicon oxide, silicon dioxide, silicon nitride, silicon oxynitride, diamond, ceramic, polymer, or a composite material of any combination thereof. In addition, the substrate is optically transparent and electrically insulating in preferred embodiments.

Other embodiments of the present also include a nanocrystal array including at least two molecularly bridged nanocrystals. Such nanostructure arrays can be used as an FET. For example, one embodiment provides field effect transistors comprising at least two metal electrodes spaced apart and mounted to a substrate, a nanocrystal array of at least two molecularly bridged nanocrystals situated within the space between the electrodes.

The present invention also provides nanocrystal assemblies, the fabrication of electronic devices (in field-effect transistor geometries), the properties of nanocrystal assemblies, and the preparation and operation of devices that include such nanocrystal assemblies as one or more components. Nanocrystal assemblies include well-defined configurations of NCs in one-dimensional ("1D"), two-dimensional ("2D") and three-dimensional ("3D") arrays. Nanocrystal assemblies also include nanocrystal-nanotube (NC-NT) structures, and NC mixtures of varying NC sizes and materials. Accordingly, the present invention provides methods to arrange NCs in desired configurations, to control the charge and spin of individual NCs, for example, by changing the chemistry and introducing local electromagnetic fields, and to controllably inject and detect the electronic response.

Materials and devices of the present invention are prepared and characterized using a range of tools, instruments, and techniques, for example, low-noise electrical measurements, charge imaging, fluorescence microscopy, atomic-force microscopy ("AFM"), and transmission-electron microscopy ("TEM").

The parameters of the electronic transport in small NC assemblies, the parameters of electronic tunneling between NCs and nearby objects (such as carbon nanotubes), and between NCs themselves can be determined using these techniques. For example, the role of the bridging molecoles connecting the NCs with the electrodes and the neighboring NCs can be determined using these techniques.

Figure 4:
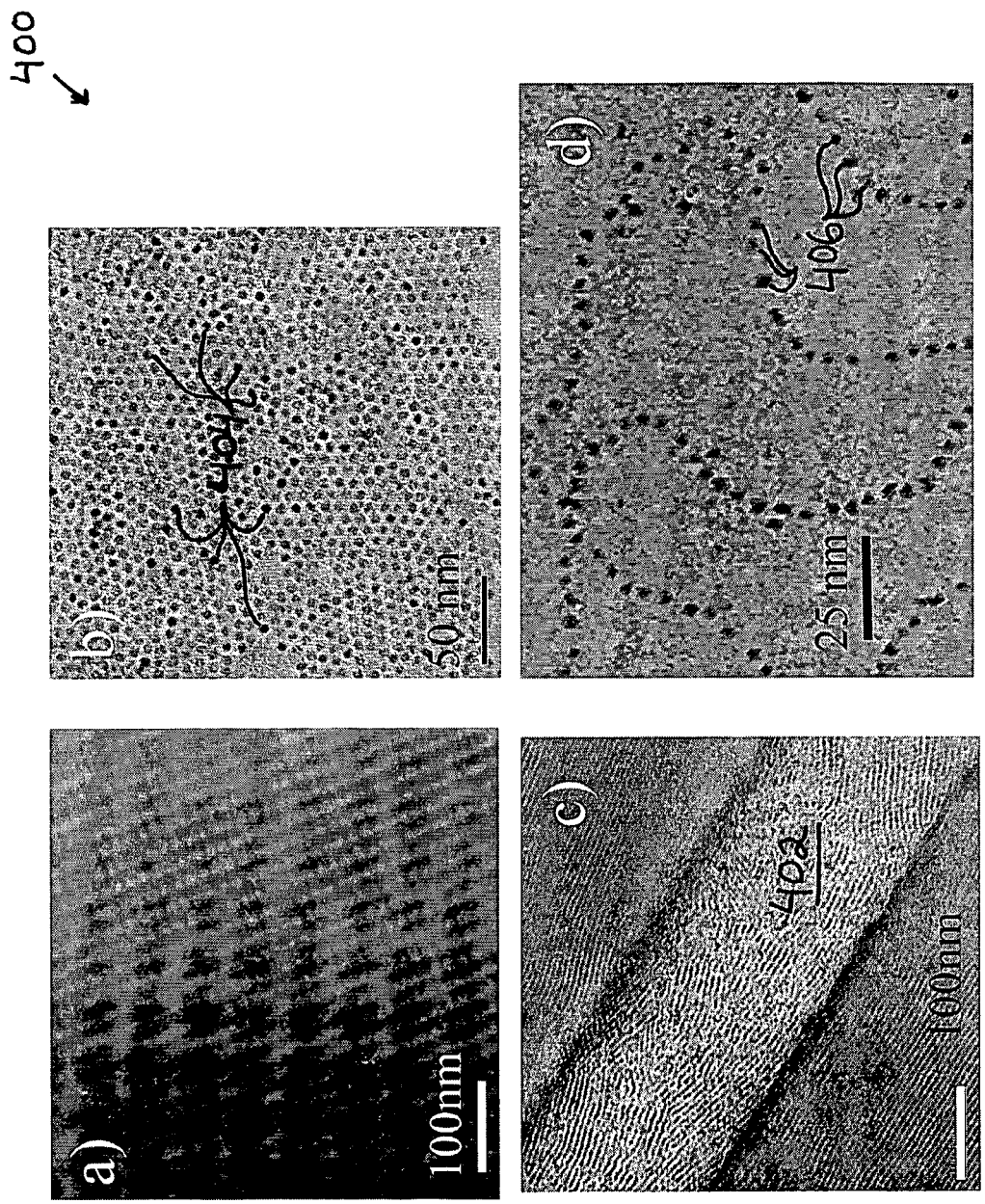
FIG. 4 shows several electron micrographs of assembled NCs of the present invention. a) 3D NC superlattice, and b) 2D array of PbSe NCs from 9:1 hexane/octane solution; c) NC assembly within the 80 nm deep trench defined in a 100 nm thick SiN window; d) chain-like CdSe assembly from non-homogeneous evaporation. CdSe NCs are capped with TOPO molecular bridges; PbSe NCs are capped with oleic acid molecular bridges.

NCs are macromolecules, only a few nanometers in size, in the mesoscopic regime. They are large enough for their properties to be described by band-theory, but small enough for the effects of the NC finite size to dominate their physical properties [17]. NCs can be capped with organic or inorganic molecules, which functionalize their surface and serve as a molecular bridge between NCs [18]. For example, referring to FIG. 1, there is provided a schematic of two nearby nanocrystals with alkane bridging molecules, tri-octylphosphine oxide. As illustrated in this figure, the distance between the nanocrystals is approximately equal to the length of a bridging molecule. Referring to FIG. 4, NCs may self-assemble into arrays. FIG. 4 shows several transmission electron micrographs (400) of assembled arrays NCs of the present invention: a) 3D NC superlattice, and b) 2D array of PbSe NCs (404) from 9:1 hexane/octane solution; c) NC assembly within the 80 nm deep trench (402) defined in a 100 nm thick SiN window; d) chain-like CdSe assembly (406) from non-homogeneous evaporation. CdSe NCs are capped with TOPO molecular bridges; PbSe NCs are capped with oleic acid molecular bridges.

The finite-size of the NCs used in the present invention gives rise to the quantization of the energies of electrons and holes. These discrete energy levels are strongly size-dependent and NCs manifest quantum properties even at room temperature. Without being bound by any particular theory of operation, the HOMO-LUMO gap scales approximately [17] as $\Delta E \approx E_g + A/D^2$, where D is the NC diameter, and $E_g$ is the band-gap of the NC composition in the bulk. For CdSe NCs, $\Delta E$ is from about 1.5 eV (red) to about 2.3 eV (blue) for the NC diameter from about 8 nm to about 2 nm.

Large numbers of uniform NCs can be made with near atomic precision [18] and RMS ("root-mean-square") size deviation of <5%. Suitable nanocrystals can range from being electrically insulating to being electrically conducting. Preferably, the NCs are semiconducting, with CdSe, CdSe/ZnS, CdTe, PbSe NC compounds being preferred. These materials have been synthesized and chemical recipes are readily available [19, 20]. A variety of NCs are commercially available from Evident Technologies (www.evidenttech.com). Using semiconducting NCs, one can start with zero electrons in the conduction band of the NC and then inject one or more electrons into the NCs. Injecting charge into the conduction band can be achieved by applying an electric field to nearby metal electrodes and gates, by light excitation (visible light for CdSe, CdSe/ZnS, CdTe, and infrared for PbSe), and by doping [16].

Figure 2:
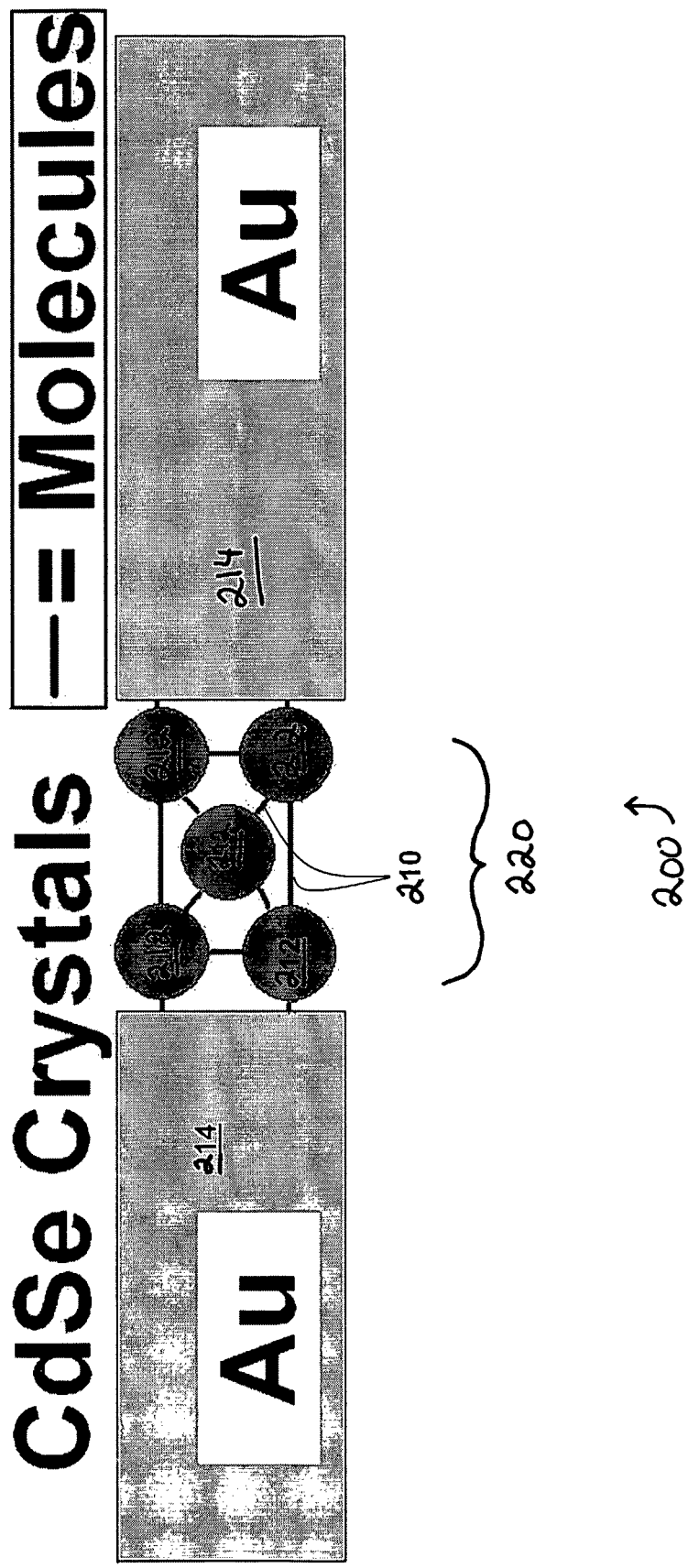
FIG. 2 is a schematic illustration of an embodiment of NC coupling in an embodiment of a device of the present invention: an artificial molecule is composed of 5 molecularly-bridged CdSe NCs in between metal electrodes. The electrons on the NCs can be tunnel-coupled, capacitively-coupled, or both.

Referring to FIG. 2, there is provided an illustration of NC coupling in a device of the present invention. FIG. 2 is a schematic illustration of an embodiment of NC coupling in a device(200): an artificial molecule (220) composed of 5 molecularly-bridged (210) CdSe NCs (212) in between metal electrodes (214). The electrons on NCs can be tunnel-coupled and capacitively-coupled.

Single NCs show a range of important phenomena including Coulomb blockade, single-electron transport and discrete electronic states [1, 2]. Without being bound by any particular theory of operation, the tunneling of electrons onto an already charged NC will be suppressed at room temperature, because the energy required to add one additional electron to a charged NC is $E_c = e^2/C$, where C is the self-capacitance of a NC. For CdSe, $E_c \approx 200$ meV for a NC diameter of 5 nm, which is much larger than kT at room temperature, where k is the Boltzmann constant and T is temperature expressed in Kelvin.

One NC is referred to as an artificial atom, and two or more linked NCs is referred to as an artificial molecule. Coupling NCs can be achieved using various mechanisms. One mechanism, for example, is electron tunneling which mimics molecular bonds formed between atoms. This coupling can be parameterized in the Hubbard model [21] using an inter-dot tunnel matrix element. NCs coupled in this way open avenues for coherent wavefunction propagation in these structures, including proposed implementations of quantum information processing in arrays of quantum dots. [10]

A second way to couple and correlate electrons on NCs is using inter-dot Coulomb interaction (capacitive coupling). This energy scale is ~50 meV for CdSe NCs, which is larger than room temperature. Levitov et al. [8] predicted that the conductivity in hexagonal NC arrays will reach zero at finite temperature (and undergo phase transition) when the electron density (number of electrons/number of NCs) is $n=\frac{1}{3}$, $\frac{2}{3}$ and $n=\frac{1}{2}$. This should occur because of the long-range character of the Coulomb interaction, which is measured experimentally.

Molecules such as alkanes (TOPO, TBPO), aromatic molecules (pyridine), amines, thiols, and conductive polymers, can be used as molecular bridges between NCs [16]. Recently, there has been optical evidence of coherent spin transport between two NCs, mediated by the π-orbitals in dithiol-conjugated bridging molecules [11]. In this regard, electronic transport in 1D and 2D arrays of molecularly-bridged NCs is readily measured. A number of important materials-dependent and device parameters is determined, including inter alia: (i) electron tunneling dependence on the bridging molecule quantity, distribution and composition; (ii) control of the coupling between two NCs in situ; (iii) control of the coupling between the electrodes and the NCs; affect of the local environment on the charge state of NCs; (iv) how electrons propagate between NCs in the presence of electric fields; and (v) how electrons propagate between NCs in the presence of magnetic fields.

Controllable arrays of NCs provide NC-based electronics and quantum computing. Controllable arrays of coupled NCs also enable the study of quantum phenomena based on correlated electronic charges and spins at room temperature. Accordingly, the present invention enables one to control how electrons move and interact in well-controlled NC arrays in field-effect geometries by controlling electron tunneling using appropriate bridging molecules. NC charge and spin is also controlled using external stimuli, for example, by subjecting the nanocrystals to photons, electric and magnetic fields, or any combination thereof.

Figure 3:
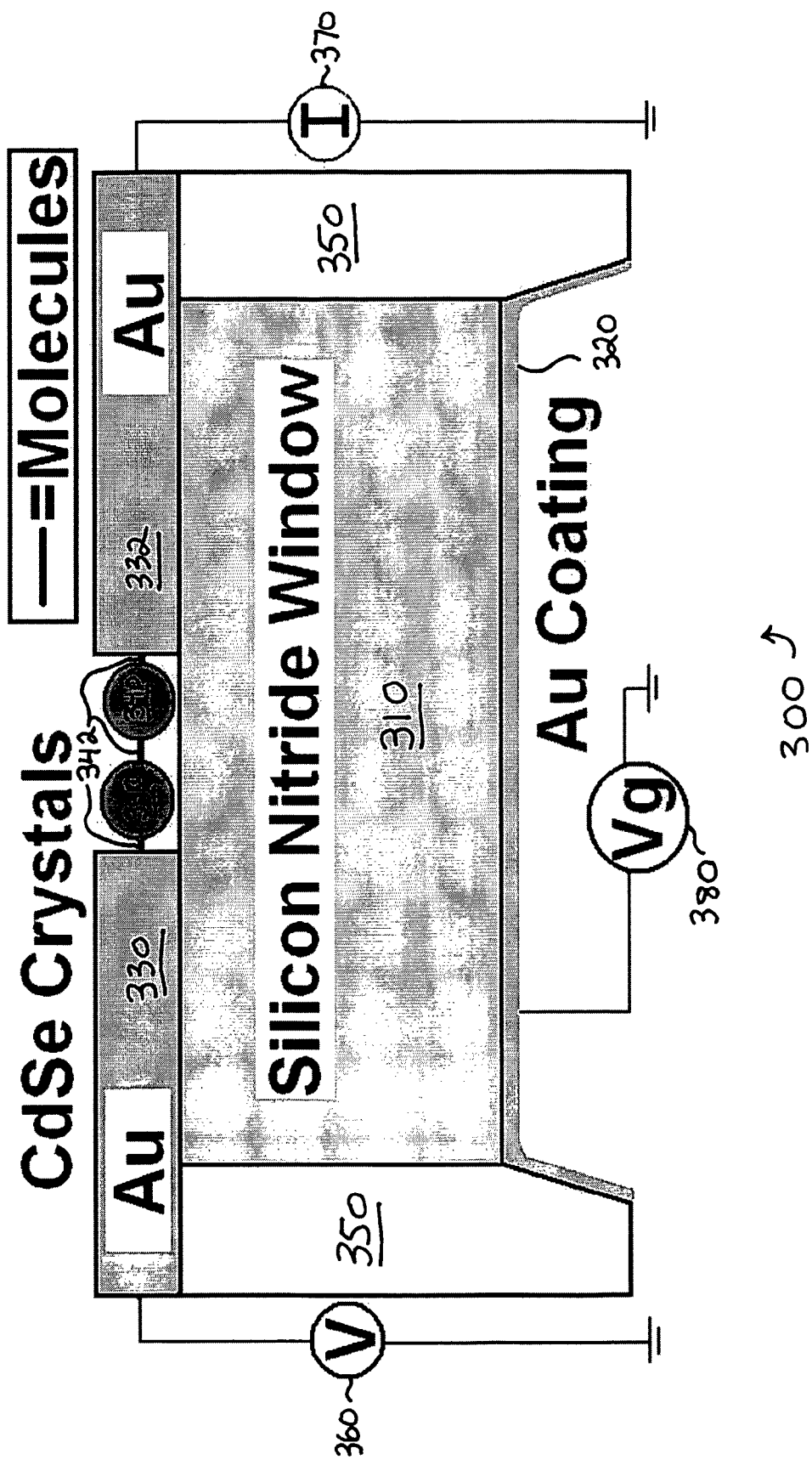
FIG. 3 is a schematic illustration of an embodiment of a device of the present invention prepared using a silicon nitride substrate, two gold electrodes and a gold gate coating. Voltage V is applied to the source electrode and current I is measured at the drain electrode. Vg on the gate is used to change the carrier density in the NCs.

Device fabrication and characterization. Further details of the fabrication and characterization of NC-based devices are provided herein. In one embodiment there is provided a device having a field-effect transistor geometry (with two electrodes and a gate) with a small number (linear chains and 2D arrays) of linked NCs. A schematic of the device containing two NCs is illustrated in FIG. 3. Two NCs form an artificial molecule. In addition to being able to operate as a circuit element, the FET geometry allows the study of how the charge moves from the electrode into the NC and between two NCs. The device can be made on a silicon nitride (SiN) window (~100 nm thick). The metal gate can be a few nm-thin and can be used to change the carrier density in the NCs above, by applying a gate voltage $V_g$. Additional device geometries and fabrication methods are described below.

In several embodiments, the devices of the present invention allow for characterization using electrical measurements, TEM and AFM, to correlate the electrical and the structural properties. Referring to FIG. 3, there is provided a schematic illustration of an embodiment of a device (300) of the present invention prepared using a silicon nitride substrate (310), with source and drain electrodes (330, 332) and a gate (320). Voltage V is applied (360) to the source electrode (330) and current I (370) is measured at the drain electrode (332). Vg (380) on the gate (320) can be used to change the carrier density in the NCs (340). Suitable bridging molecules (342) include any of a variety of different molecules, preferably chain-like molecules, such as TOPO, pyridine, thiols, and oleic acid. Without being bound by a particular theory of operation, it is believed that the barrier for the electron tunneling will be affected by the type of bridging molecule. In several embodiments, one kind of bridging molecule is attached on the electrode side of the NC, and another kind of bridging molecule is attached on the other side. Suitable conductive electrode materials (e.g., metals, such as Au, Cu, Ag, Pd, Pt, Al, or any combination thereof) can also be selected to adjust the metallic Fermi level with respect to the HOMO level of the bridging molecule to control the tunneling barriers.

Devices of the present invention are suitably prepared using any of a number of microfabrication techniques know in the semiconductor arts. For example, optical, electron-beam and focused-ion beam (FIB) lithography, are used. Nanocrystals are typically synthesized according to wet chemical techniques as described further below. Nanocrystals are typically applied and assembled onto lithographically-patterned substrates. Material preparation and device assembly is typically conducted in a cleanroom environment, for example Class 1000 Class 100 clean environments are suitable, and a Class 10 clean environment is preferred.

Nanocrystal Synthesis. Many various nanocrystals that are suitably used in the present inventions are commercially available from Evident Technologies, Inc. (www.evident-tech.com) or can be readily synthesized using wet chemical techniques. For example, the synthesis of CdSe NCs is provided by Murray, et al. in reference [18]. Several procedures for synthesizing CdSe core-only NCs and CdSe/ZnS core/shell NCs are known. Preferably, CdSe and CdSe/ZnS are made according to the procedures provided in US Patent Application Pub. No. 2002/0071952 Bawendi, et al., [19] the portion of which pertaining to the synthesis of nanocrystals is incorporated by reference herein. PbSe and CdTe nanocrystals are preferably prepared according to the procedures of reference [20].

Example of preparation of Cd/Se NCs. All reactions are performed in a dry nitrogen atmosphere using Schlenk techniques. Chemical reagents include tri-octylphosphine oxide ("TOPO"), $Cd(acac)_2$, $Zn(acac)_2$, selenium, dodecanal ("DDA"), 1,2-hexadecanediol ("HDDO"), and hexamethyl-disilathiane $(TMS)_2S$. The reaction apparatus used to make CdSe NCs includes a 50 mL three-neck round bottom flask with an air condenser, a rubber septum and the temperature probe. The injection solution totals 10 mL and includes $Cd(acac)_2$, HDDO, TOP and TOPSe (tri-n-octylphosphine selenide) stock solution. TOPSe is prepared by stirring and completely dissolving a selenium shot into 100 mL of TOP under a dry nitrogen atmosphere. The amount of reagents in the injection solution is determined by the desired average size of CdSe NCs. The reaction solvent includes TOPO, HDA, and TOP. The NCs are made by rapidly injecting and stirring the injection mixture into the reaction solvent through a rubber septum before the temperature of the solvent initially heated to 360° C. drops below 355° C. The NC growth becomes very slow when the temperature drops to 200° C. The complete growth occurs within ~15-60 minutes. A ZnS shell can be further grown on the CdSe NC surfaces, in a similar multiple-neck round bottom flask. The reaction solvent is the same as above. The NC overcoating solution made out of $Zn(acac)_2$, DDA, and $(TMS)_2S$, is added to the CdSe core solution to make CdSe/ZnS NCs. The NC size selection is completed using precipitation and sedimentation out of solution. Butanol and methanol are added to NCs in hexane.

After centrifuging, NC powder is left on the bottom of the vial and the supernatant is removed. The remaining powder is resuspended in hexane/butanol and the procedure is repeated two more times. Absorption spectra of NCs (UV-visible for CdSe, and infrared for PbSe) is used to determine mean NC diameter and quality [12,23].

Bridging molecules used in the present invention can be incorporated onto the surfaces of the nanocrystals. In one embodiment, suitable bridging molecules include organic species that facilitate charge transfer to or from nanostructures as disclosed in U.S. Patent Application No. 2004/0178390, the portion of which pertaining to organic species that facilitate charge transfer is incorporated by reference herein. In another embodiment, NC ligands can be exchanged for bridging molecules. Typically the NC ligands include any of the organic chain molecules that are used during the synthesis of the NCs. For example, TOPO used in the synthesis of CdSe NCs can be exchanged, for example, by pyridine, TBPO, pyrazine, amines as described in reference [18]. This is particular preferred in preparing embodiments in which the NCs are desirably applied to the devices from an aqueous solution. For example, TOPO can be replaced by amine groups to obtain water-soluble NCs using the following procedure. CdSe (CdSe/ZnS) NCs are resuspended in chloroform by sonification. AET (2-aminoethane thiol hydrochloride) is added to the NC chloroform solution to create a two-phase solution. The NCs typically reside in the heavier chloroform phase. This mixture is then stirred vigorously for several hours, and the NCs then go into the lighter aqueous phase. In the stirring process, the TOPO is replaced by amine groups, making the NCs water soluble. NCs can then be separated from AET by centrifugation and resuspending the NCs in PBS (phosphate buffer saline) a few times.

Controlled Assembly of Nanocrystals into Lithographically-made Devices. Preferred solvent compositions (hexane, octane, octanol, chloroform) and drying conditions (nitrogen atmosphere and varying drying times) are used to achieve NC arrays. NCs self-pack in either glassy arrays or ordered arrays, depending on the solvent composition and the drying parameters. A combination of TEM, AFM and fluorescence microscopy can be used to investigate the pattern formation of the assembled NCs.

Different NC patterns, i.e., spatially ordered arrays, can be prepared by varying the assembly parameters. Various approaches and examples of controlled assembly of NCs into devices are further elaborated. In several embodiments, NCs can be integrated into devices using a variety of methods, for example by drop-casting or spin-casting dispersions of NCs onto substrates from solution, by immersing (dipping) the substrates into the NC solution, or any combination thereof. NC pattern formation is studied using TEM and AFM. Types of NC patterns vary as a function of the NC concentration in solution, the solvent composition, and the topography of the surface onto which they assemble.

Data analysis. The TEM and AFM/EFM images are analyzed using commercially available numerical computation software, for example MatLab™ (www.mathworks.com). Electrical data is obtained using LabView™ software (www.ni.com), and analyzed using LabView™, IgorPro™ (www.wavemetrics.com), MatLab™, Mathematica™ (www.wolfram.com), or any combination thereof.

Example: Several TEM pictures of CdSe and PbSe NC assemblies that were achieved using a range of solvents and assembly parameters are provided in FIG. 4. Referring to this figure, FIG. 4 *a*) shows a 3D NC superlattice, and FIG. 4 *b*) shows a 2D array of PbSe NCs from 9:1 hexane/octane solution. FIG. 4 *c*) is a TEM of an NC assembly within a 80 nm deep trench residing in a 100 nm thick SiN window, and FIG. 4 *d*) shows a chain-like (linear) CdSe assembly from non-homogeneous evaporation. In these examples, CdSe NCs are capped with TOPO and PbSe NCs are capped with oleic acid.

Examples: TEMs show the types of NC configurations that form spontaneously when CdSe NCs are drop-cast from diluted hexane solutions. Such isolated NC assemblies provide devices suitable having a small number (fewer than about 10) of coupled NCs. FIG. 5 shows several transmission electron micrographs (500) of assembled NCs (502) of the present invention. Referring to FIG. 5, there are provided TEMs showing configurations of a) 2 CdSe NCs in a linear array, b) 3 CdSe NCs in a 1D linear array, c) 4 NCs in a 2D rectangular array, d) 5 CdSe NCs in a 2D hexagonal array, and e) 7 CdSe NCs in a hexagonal array (two CdSes are appear to adjoin each other giving rise to 5 or 6 of the CdSe NCs forming a spatially assembled, ordered 2D array, with one of the spatially assembled NCs being disorder. The NC diameters in these examples are 5 nm.

Figure 6:
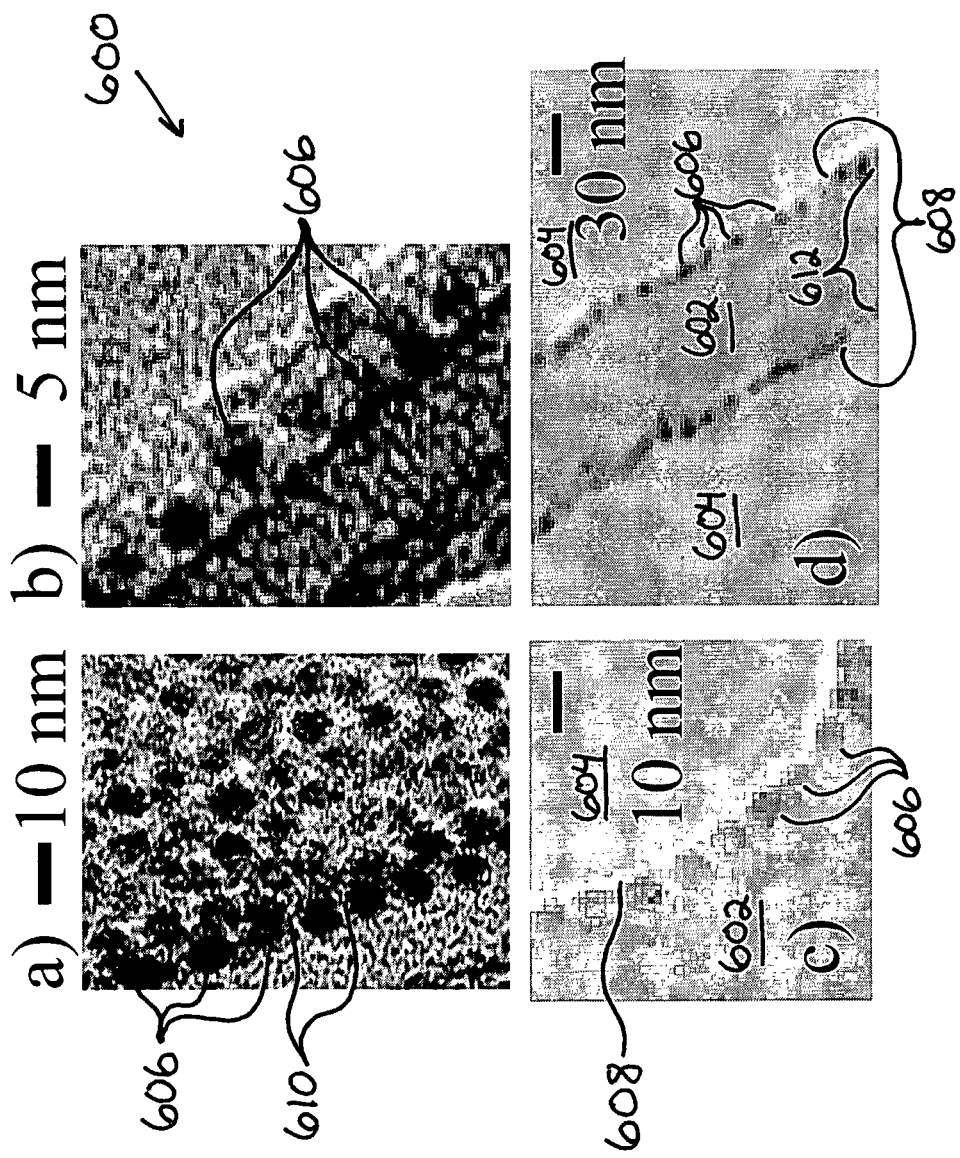
FIG. 6 shows several electron micrographs of assembled NCs of the present invention: a) and b) CdSe NCs aligned along a step; a) high, and b) low concentration; PbSe NCs align along edges of the SiN bridges.

Examples of Assembling Nanocrystals On Substrate Discontinuities. FIG. 6 shows NCs assembled in lines along the steps and edges on substrates. Referring to FIG. 6, there are provided several transmission electron micrographs (600) of assembled NCs (606) of the present invention: a) and b) CdSe NCs aligned along a step (610), with a) being a relatively high concentration of the NCs in solution, and b) being a relatively low concentration of the NCs in solution. c) and d) CdSe NCs align along edges (608) of bridges (612) of a carbon film (602). The region labeled (604) is empty space. As the concentration was decreased to achieve highly diluted solutions, two and more NCs consistently packed along the edges, and there were no additional NCs nearby. This effect was observed for diluted CdSe and PbSe NC solutions.

Figure 7:
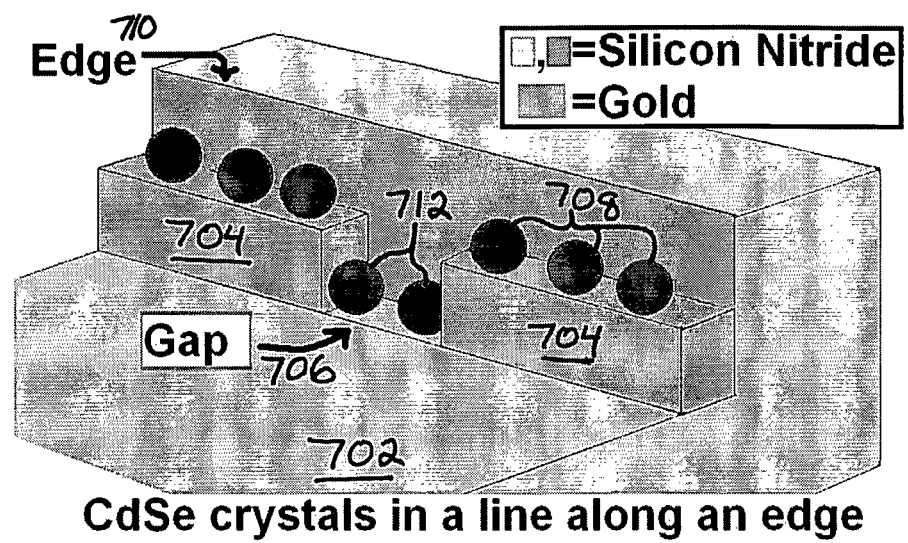
FIG. 7 is a schematic illustration of an embodiment of a device made according to a method of the present invention. NCs align along the edge on silicon nitride. The electrodes are made along the edge.

Example of Device Fabrication. One example of a device made according to the present invention is illustrated schematically in FIG. 7. FIG. 7 illustrates a resulting device 700 according to this embodiment of the process of the present invention. For example, the device 700 includes a silicon nitride substrate 702 that integrally includes an edge 710. Directly adjacent to the edge 710 and the substrate 702 are two gold electrodes 704 separated by a gap 706. Situated adjacent to the electrodes 704 are nanocrystals 708 exterior to the gap 706 and nanocrystals 712 within the gap 706. In one embodiment, this figure illustrates a silicon nitride substrate having an edge discontinuity and gold electrodes made along the edge. The electrodes reside in the corner created by the substrate top surface and vertically rising wall of the edge discontinuity. The space between the electrodes forms a gap within which reside two NCs. The NCs are molecularly bridged to each other and to the adjacent gold electrode using bridging molecules (not shown). NCs are also shown residing simultaneously adjacent to one of the electrodes and the vertical wall of the edge discontinuity.

Example: The spatial assembly of NCs adjacent to the discontinuity (e.g., aligned along the edges adjacent to the substrate surface) is exploited to make NC-FET devices as described herein. First, an edge (~15 nm high) is made along a silicon nitride (SiN) window (~100×100µm$^2$) using lithography and plasma etching. SiN windows are fabricated from SiN/Si wafers using lithography and wet (KOH) etching. Next, metal electrodes are fabricated along the edge using e-beam lithography or FIB. The electrodes are ~10 nm high. For making smaller gaps, the 'break junction technique' [2] can be used, or larger gaps (~100 nm) can be electroplated to created smaller gaps, or both techniques can be used. The NCs are drop-cast from a dilute solution and spatially assemble in a line along the edge, as illustrated in FIG. 7.

Gaps that contain from 2 to about 10 NCs in a line (~12 to ~100 nm gaps) can be made this way. The electrode dimensions are chosen such that the NCs in the gap are electrically isolated from other nearby NCs that may assemble on top of the electrodes (shown) or along the sides of the electrodes and adjacent to the substrate surface (not shown).

Example: In a related example of an NC-FET device of the present invention, an edge (~15 nm high) along a silicon nitride substrate is made using lithography and selective etching. Next, metal (gold) electrodes are applied along the edge using e-beam lithography. E-beam equipment is used to prepare structures as small as about 20 nm or even as small as about 10 nm wide and about 7 nm high. The gap is made either using e-beam lithography or for smaller gaps, using the 'break junction technique' and/or starting from larger gaps (~100 nm and using electroplating. The NCs are drop-cast from a dilute solution and assemble in a line along the edges, as illustrated in FIG. 7. Gaps having gap widths of about 12 nm to about 30 nm wide will contain from 2 to 5 NCs that are spatially arranged in a line. The electrode dimensions are chosen such that the NCs in the gap will be electrically isolated from any other nearby NCs that might assemble on top of electrodes and adjacent to the edge (as shown) or along the sides of the electrodes and adjacent to the substrate top (not shown).

Example: Field-effect transistor devices were made using assembled nanocrystals as described herein. FET electronic devices were made on silicon nitride membranes having an edge discontinuity provided on a surface using electron-beam lithography and metal evaporation to provide electrodes adjacent to the edge discontinuity. A dilute solution of nanocrystals was deposited on the edge discontinuity to assemble the NCs adjacent to the electrodes.

Figure 8:
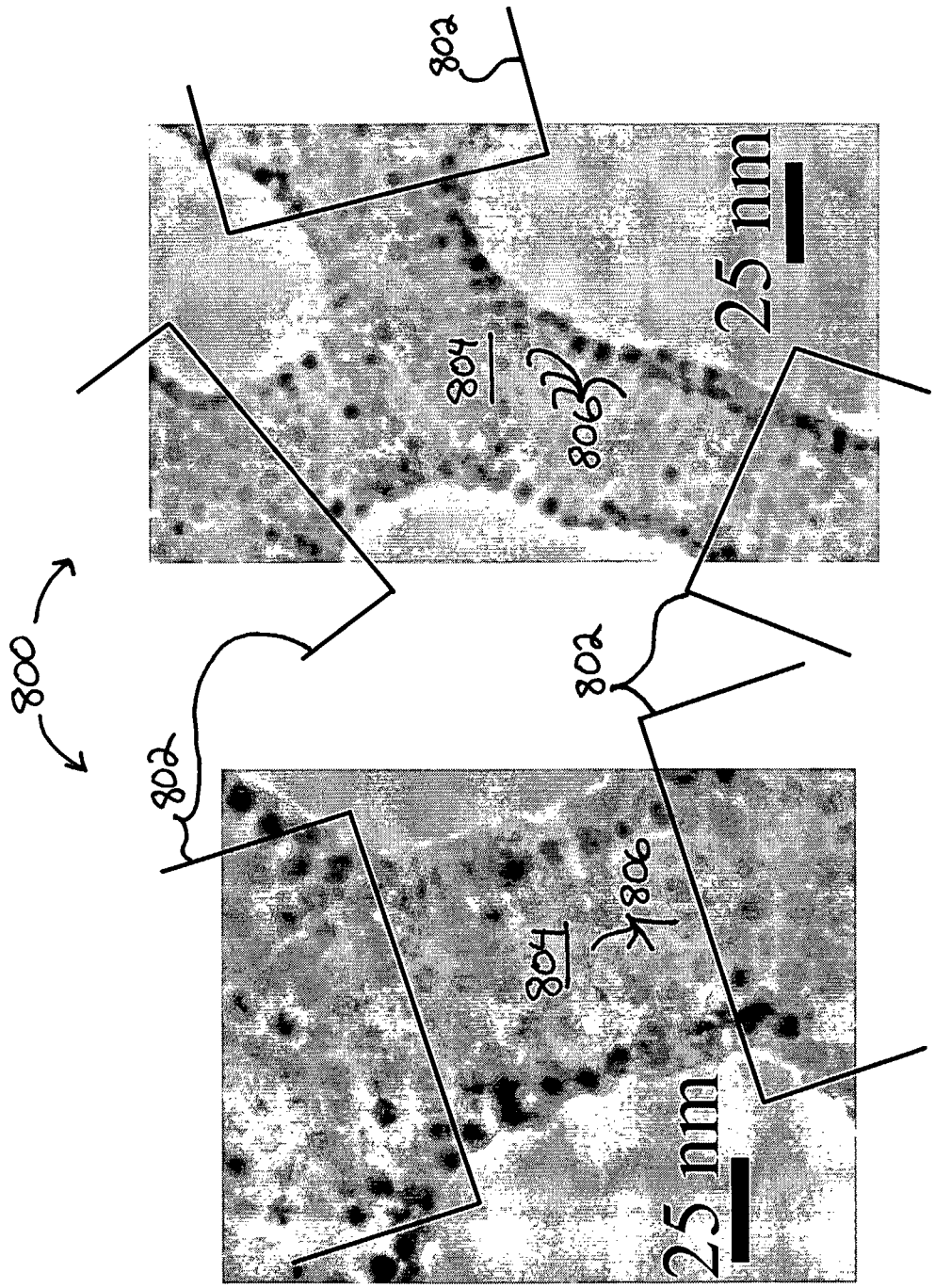
FIG. 8 shows several electron micrographs of assembled NCs of the present invention: TEM images of PbSe NCs deposited on top of SiN bridges. The SiN bridges are defined by e-beam lithography and plasma etching. Placement of metal electrodes is illustrated using black lines.

Example: Preparing chains (1D) and rectangular (2D) NC arrays: One or more bridges were created in an SiN substrate using plasma etching. NCs were deposited from solution onto a bridge, and the NCs spatially assemble on the bridges. Excess NCs not adjacent to the bridge are optionally removed. Bridge geometry was controlled using an etching pattern during plasma etching, Spatially assembled NCs were provided in the desired geometry defined by the etching pattern. FIG. 8 provides TEM images of SiN bridges having deposited NCs and illustrated with electrodes. The transmission electron micrographs (800) of assembled NCs of the present invention depict TEM images of CdSe NCs deposited on top of SiN bridges. The NCs cores (806) are separated by passivating molecules (808). The SiN bridges (804) are defined by e-beam lithography and plasma etching. Placement of metal electrodes (802) is illustrated using black lines (802). The bridges and metal electrodes were made using e-beam (or FIB) lithography by patterning a ~50×50 μm² SiN window. The patterns were then etched with $SF_6$ plasma through the 100nm thick SiN, leaving suspended SiN bridges. Etching also occurred sideways, so the bridges could be etched continuously down to zero width. SiN bridges were thus prepared and NCs were deposited on the bridges to form spatially assembled 2D arrays of NCs on the bridges.

Example: Using a Digital Instruments atomic force microscope ("AFM") and "Nanoman"™ software, NCs are dragged along a silicon nitride surface to desired positions and configurations. By dragging the AFM tip along the surface, the AFM can also be used to create discontinuities, for examples, trenches, edges, or steps, on the silicon nitride surface. NCs are contacted to the substrate discontinuity, such as by coating a fluid dispersion of NCs on the substrate surface having the discontinuity. The NCs assemble adjacent to the discontinuity prepared by the AFM.

Example: Gating the NCs: Metallic nanotubes are positioned adjacent to individual NCs. Metallic nanotubes are used to change the energy barriers between the NCs by providing a local electric field to control the charge and spin of an individual NC. For example, a carbon nanotube is placed midway and close to 2 NCs to control the tunneling barrier between the two NCs. Nanotubes can be positioned adjacent to one or more NCs by manipulating the nanotubes with AFM to position them near the NCs (for example, using the 'Nanoman'™ software from Veeco). Nanotubes can be positioned adjacent to one or more NCs by attaching the NCs to the nanotubes chemically, as described in reference [29]. Because the SiN windows allow for patterning on both sides, patterned gates can also be fabricated from below.

Figure 9:
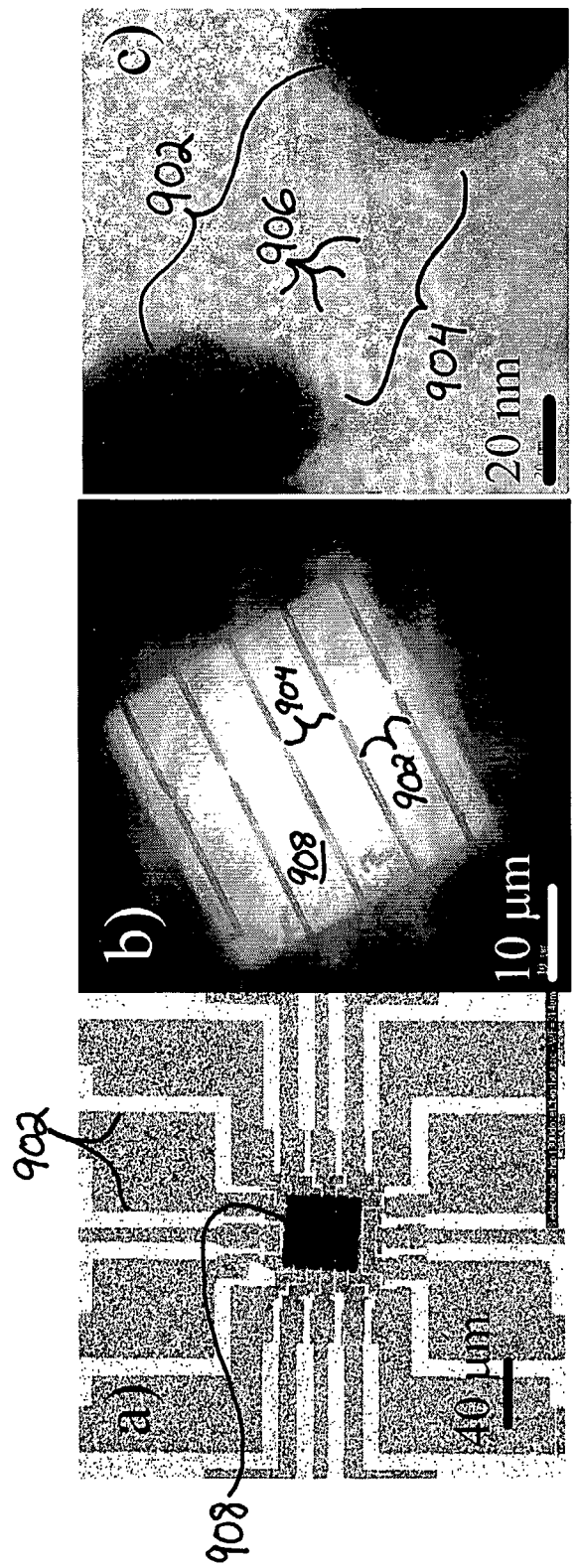
FIG. 9 shows several electron micrographs of devices of the present invention fabricated on a SiN window. From left to right, with increasing magnification: a) SEM picture (the SiN window appears black), b) TEM picture of the SiN window with 5 pairs of electrodes, and c) close-up TEM view of one of the electrodes in b) with deposited NCs.

Example: FIG. 9 shows several electron micrographs of devices of the present invention (900) fabricated on a SiN window (908). From left to right, with increasing magnification: a) SEM picture (the SiN window appears black), b) TEM picture of the SiN window with 5 pairs of electrodes (902), and c) close-up TEM view of an electrode gap (904) in b) with deposited NCs (906) shown adjacent to and inside the gap. The electrodes are fabricated by defining Cr/Au regions with e-beam lithography. The window is fabricated by chemically etching away the silicon underneath a square region of the SiN insulating layer with KOH. From left to right: scale bars are 40 μm, 10 μm and 20 nm.

Figure 10:
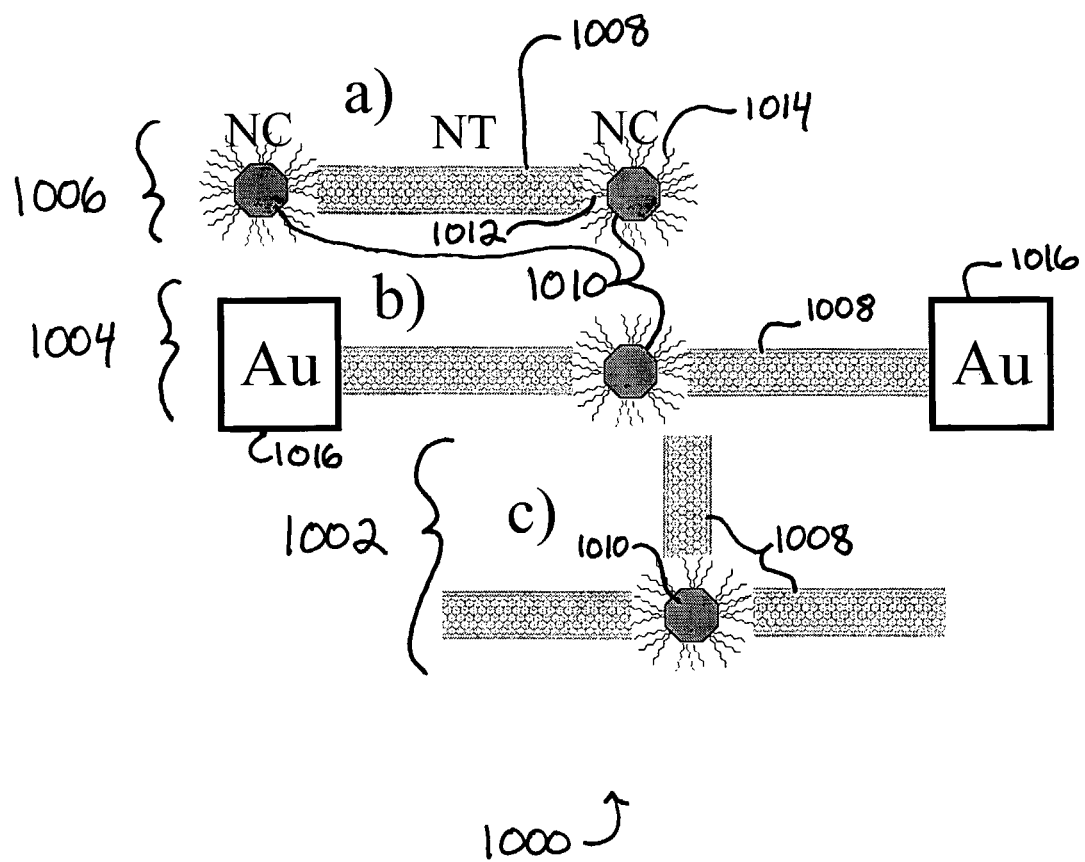
FIG. 10 is a schematic illustration of an embodiment of NC-NT circuitry: a) 1NC-1NT-1NC, b) NTs as 'leads' for contacting NCs, c) 1NC attached to multiple NTs.

Example. Nanocrystal-Nanotube (NC-NT) Structures. Nanotubes ("NTs") can be used as gates and as leads for the NCs, as well as to study the basic transport mechanisms in NC-NT structures. Carbon nanotubes can be attached to CdSe, CdSe/ZnS and PbSe nanocrystals. This is confirmed using FTIR in which the functional groups present in the NC-NT solution are observed in the spectra. One way to do this is following the procedure by Ravindran, et al. [29]. Commercially available carbon nanotubes are first purified in nitric acid. Nitric acid also opens the carbon bonds along the NT, while creating reactive carboxylic (COOH) groups. If the purification reaction in nitric acid is not too long, the COOH groups will form only at the ends of the NTs, allowing the NT ends to react with NCs functionalized with amine groups. If the purification is long, then the NCs can also be attached to the NT sidewalls. The NTs tend to sediment in solution. However, when the NCs are attached to the NTs, the NT-NC structures float freely in solution, because the NCs are soluble. NC attached nanotubes are recovered from the solution. Referring to FIG. 10, there is provided a schematic illustration of an embodiment of nanocrystal-nanotube ("NC-NT") circuitry composed of nanocrystals ("NC"s 1010) and nanotubes ("NT"s, 1008). Basic nanostructure elements are provided, for example 1 NC, 1 NT, 1NC-1 NT, and 1NC-1NT-1NC). Complex nanostructure elements composed of a plurality of basic nanostructure elements are used to make complex circuitry: a) 1NC-1NT-NC (1006) is provided for coupling two NCs (e.g., use as a quantum logic gate); b) 1NT-1NC-1NT (1004) provides for the 1NTs used as 'leads' for contacting NCs to electrodes (1016), (e.g., use as a single NC memory element, photodetector, or LED); c) 1NC attached to multiple (e.g., 3) NTs (1002) (e.g., for use as a single NC transistor). NT-NC attachment can be achieved with carboxylic acid—amine group conjugation, as described further in Banerjee, S. and Wong, S., "Synthesis and Characterization of Carbon Nanotube-Nanocrystal Heterostructures", *Nano Lett.* 2 (3) 195, 2002.

Nanotubes can be used as electrical leads to contact NCs. Electric charge transfers between the NCs and NTs in the NT-NC system as a function of the NC properties (CdSe and PbSe NC in a range of diameters), NT properties (single, or multiple wall NTs), and optionally bridging molecule properties, if present. A change in the absorption and emission spectra of the composite structures compared to the NCs or NTs alone is observed if there is coupling between the NCs and NTs.

Characterization Methods The materials and devices of the present invention are suitably characterized using a number of methods and instruments common to those of skill in the art, for example, electrical transport measurements, charge imaging in NCs, based on scanning-probe microscopy, fluorescence microscopy, TEM, FTIR, NMR and UV-vis spectroscopy.

Figure 11:
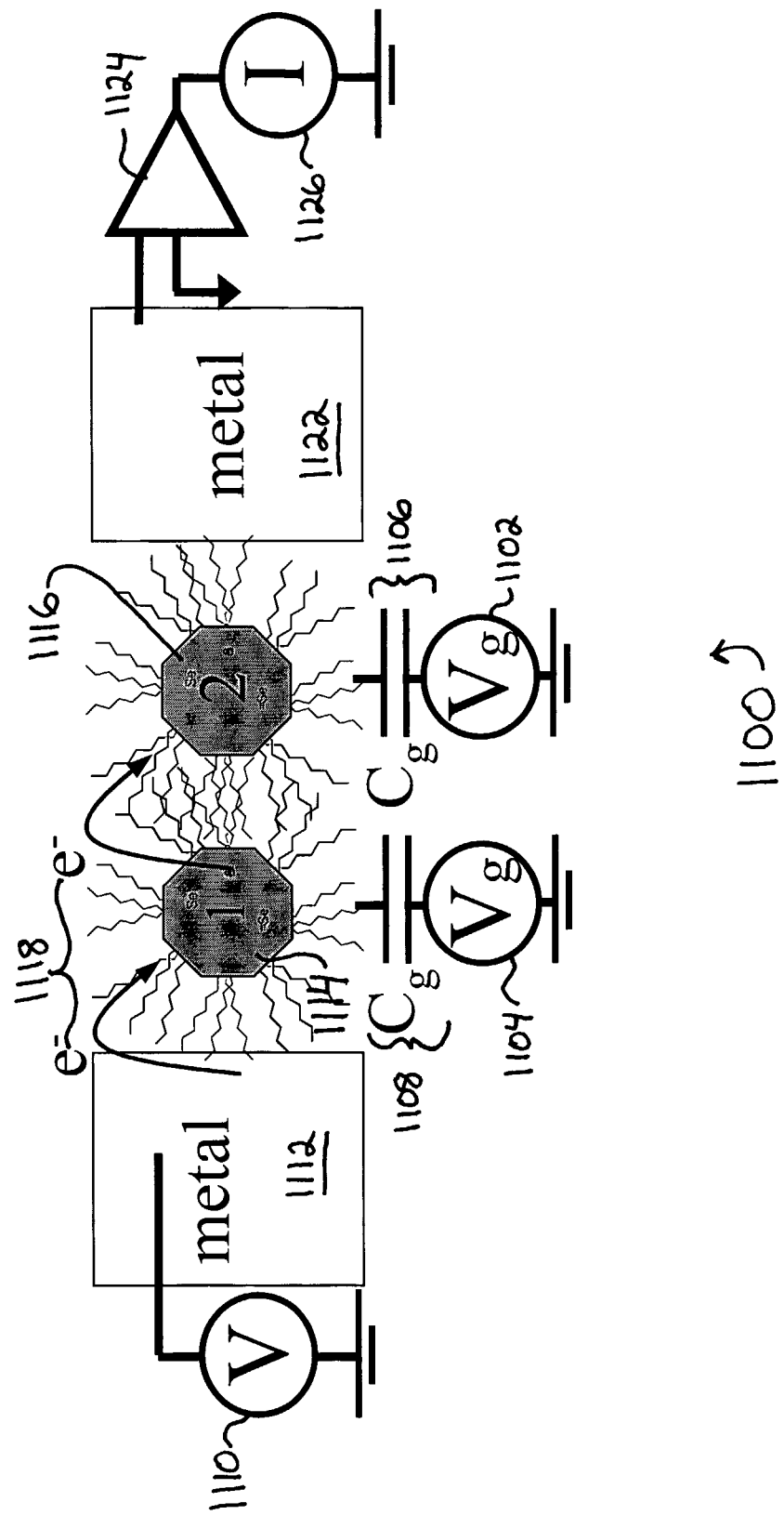
FIG. 11 is a schematic illustration of an embodiment of a field-effect transistor of the present invention: two NCs are molecularly bridged and aligned between metal electrodes. Cg is the capacitance to the gate, Vg is the gate voltage.

Example. FIG. 11 is a schematic illustration of an embodiment of a field-effect transistor (1100) of the present invention: two NCs (1114) and (1116) are molecularly bridged and aligned between metal electrodes: the source electrode (1112) and the drain electrode (1122). Cg (1108) symbolizes the capacitance of the first NC (1114) to the first gate voltage (1104), and Cg (1106) symbolizes the capacitance of the second NC (1116) to the second gate voltage (1102). Transport electrons (1118) are injected from the source electrode (1112) with an applied voltage source (1110). A current measurement instrument (1126) detects the collection of transported charges at the drain electrode. Transport electrons will only travel from left to right in this example and this is indicated symbolically (1124). In FIG. 11, the two NCs are electrically coupled to each other, each NC individually electrically coupled to a metal electrode and a gate electrode. Electrical transport measurements are used to measure the current-voltage ("I-V") characteristics of the NC-based FETs as a function of the NC parameters (size, spacing), bridging molecules, electrode materials, gate voltage, and external fields. The two NCs are molecularly bridged and aligned between the metal electrodes. Cg is the capacitance to the gate, Vg is the gate voltage. This device is useful as a building block in quantum computing applications.

Two electrical setups for low-noise measurements have been built to explore the electrical and optical properties of NC devices. These setups include a dewar with a cold finger at the end of which devices are mounted. The devices can be measured in situ over a large temperature range, from about 4K to about 700K. A sample holder made out of copper and Macor™ machinable glass ceramic (Corning, Inc., www.corning.com) is used. Samples are mounted on a ceramic chip carrier that is inserted into a chip socket made out of Macor™ machinable glass ceramic. Teflon™ plastic insulated wires that can stand high temperatures were connected to the gold pins on the chip socket using a micro-torch and high-temperature silver solder. The smallest current that is measured is about $5 \times 10^{-15}$ amperes, which permits measurement of resistive NC assemblies and noise.

The devices are tested at higher temperatures (typically above 373 K) to explore the effects of temperature on the properties of the NC arrays. Devices are measured in vacuum or in some gas, inert or ambient, in the dark, or under illumination, for example, using laser light. Sample quality is checked using photocurrent measurements as described in references [12,23].

The I-V characteristics of NC-FETs with 1D and 2D spatially assembled NC arrays of the present invention are measured. For example, the illustration in the FIG. 11 describes the experimental setup for measure the I-V characteristics of a 2 NC FET. The NCs in the embodiment illustrated in FIG. 11 are tunnel- and capacitively-coupled. The relative strength of these couplings depend on the bridging molecules, the NC parameters (shape, size, spacing, composition), and the fields applied. Without being bound by any particular theory of operation, when alkane bridging molecules are used, for example TOPO, the weak tunneling limit is expected to be achieved and the Coulomb interaction will dominate the transport. The strong tunnel-coupling limit is implemented by using conjugated molecules, such as described in [11]. Charge ordering is observed when the conductance of the NC-FETs reaches a minimum for electron densities ⅓, ⅔ and ½. In several embodiments, NC arrays can also be composed of two different NC materials and sizes (e.g., 'red' and 'green' CdSe NCs).

The I-V characteristics of NC-FETs are measured. The electron concentration in the NCs of the NC-FETS is changed by varying the gate voltage. Additionally, the chemical potential of the individual NCs can be controlled by gating them individually. This individual gating is carried out by positioning thin metallic objects, such as metallic nanotubes, near the NCs, as discussed generally in reference [29]. The formation of extended molecular-like states in the NC arrays and the effects of electron interactions is ascertained by changing the individual energy barriers in the array.

Figure 12:
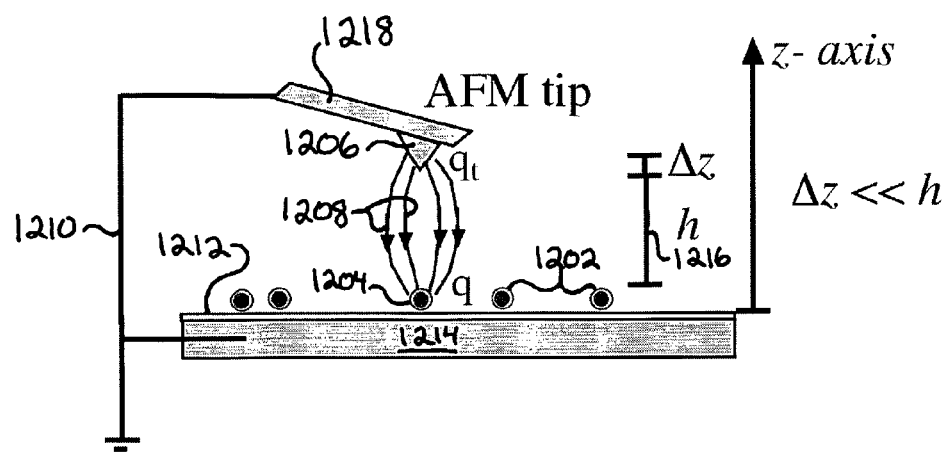
FIG. 12 illustrates the measurement of charge imaging in NCs of various device embodiments of the present invention. A charge q on a NC induces a charge qt on the tip, and the resonance frequency of the tip changes proportionally with $q^2$.

Example. Imaging the charge in NC devices. Imaging charge with a sharp tip is a direct way to visualize the charge distribution in the devices and FETs of the present invention. The charge in the NCs of the devices and FETs of the present invention is imaged using electric-force microscopy. Electric-force microscopy (EFM), which is discussed in reference [33], has been used to probe the electrical properties of microscopic systems [34-37]. Referring to FIG. 12, there is provided a schematic illustrating charge imaging [38] in NCs. FIG. 12 illustrates an Electrostatic Force Microscopy (EFM) measurement of charge in NCs of various device embodiments (1200) of the present invention. Devices sit on an insulating substrate (1212) on top of a conductive layer (1214), which is electrically connected to ground (1210). The tip (1206) is first scanned over the surface to map the topography. A second scan traces over the measured topography at a different height (1216). A charge q (1204) on a NC (1202) induces a charge $q_t$ (1208) on the conductive tip (1206), and, because the tip follows the topography, the resonance frequency of the cantilever (1218) changes proportionally with $q^2$ during the second scan. A charge q on a NC induces a charge $q_t$ on the tip. Consequently, the resonance frequency of the tip changes proportionally to $q^2$.

Figure 13:
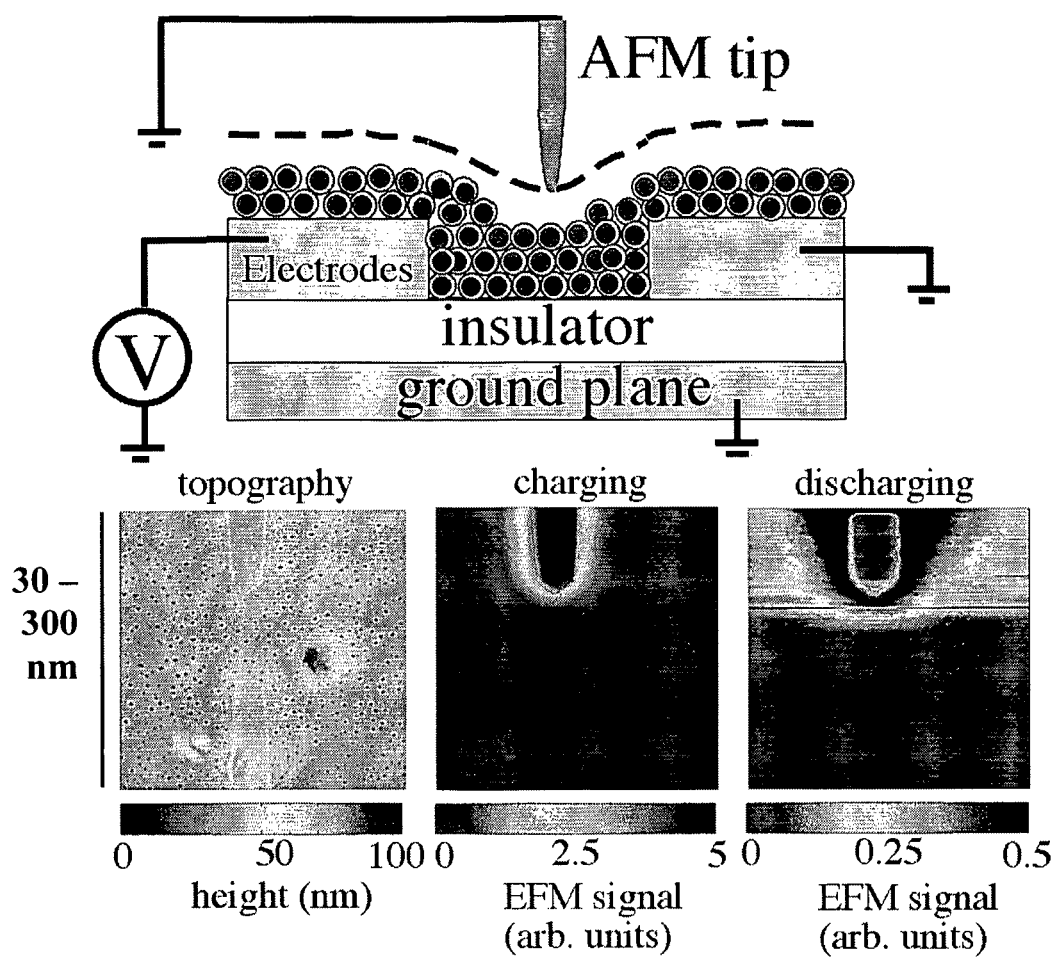
FIG. 13 shows a schematic illustration and EFM images of an embodiment of a device of the present invention. Top: schematic of an EFM method to image the charge transport in the NCs of a device of the present invention. Bottom left: AFM image of the topography of the device with CdSe NCs deposited on top of finger-like electrodes. Bottom center: EFM image showing charging of the NCs when voltage is applied to the source electrode. Bottom right: EFM image showing discharging of the film of NCs (Vdc=0), after charging for 1 hour. Charging and discharging images correspond to the topography image as shown.

A quantitative method based on EFM has been developed to image the charge motion in large NC arrays, as provided in reference [38]. This quantitative EFM method can be adapted to image smaller NC arrays having fewer than 1000 NCs as follows. Small CdSe NC arrays are imaged in a field-effect transistor geometry. The charge diffusion coefficient in assemblies of 2-1000 NCs is obtained. EFM measurements are made after the voltage on the source electrode is turned on and off. A device such as illustrated in FIG. 13, includes two Au electrodes separated by about 10-100 nm, a $SiO_2$ layer on top of a degenerately doped Si substrate. Highly monodispersed NCs, capped with a suitable bridging molecule, are self-assembled on top of the device. Negative dc-voltage Vdc is applied to the source electrode to charge the NCs, while all other voltages are zero (FIG. 13, top). A conductive tip oscillated in the z-direction and was scanned parallel to the sample surface. The electrostatic force F between the sample and the tip introduced a phase shift $\Delta\phi(x,y)$~dF/dz. An image is produced by measuring the phase shift as a function of the tip position in the xy-plane at a constant height. The EFM signal for Vdc=0 is proportional to the square of the charge in the NCs. EFM is used to study how the charge transport in NC arrays depends on the NC parameters (diameter, spacing), on the applied voltage and temperature. This will enable quantitative studies of electron injection from the electrodes into the NCs.

Imaging resolution is improved by using sharper tips and thinner gate oxides, as described generally in reference [38]. The tip characteristics are tailored to suit the smaller length scales. Commercially available 1-2 nm large 'super-sharp' tips can resolve individual NCs and the 'current channels'. EFM images are correlated with the TEM images which contain high-resolution details of the topography. The charge motion is modeled through the array, which can be done analytically [38] or numerically [41] using a cellular automata model.

Figure 14:
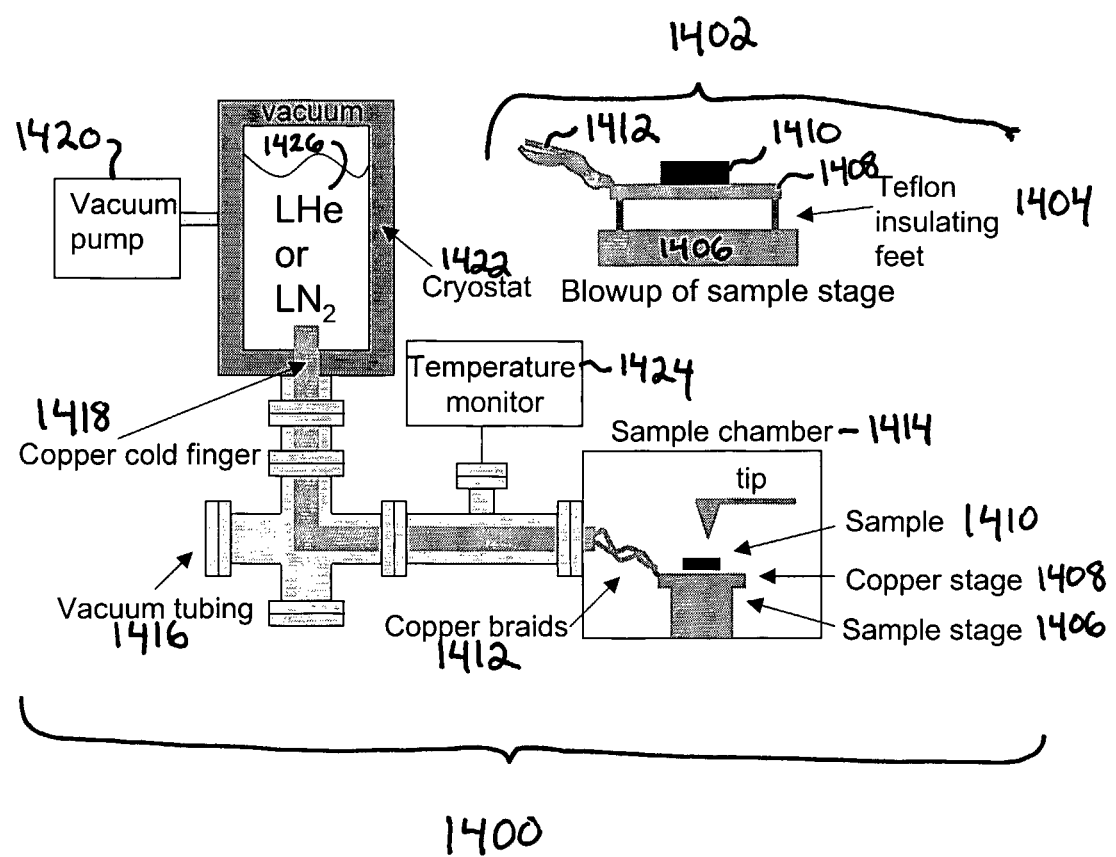
FIG. 14 is a schematic illustration of a low-temperature AFM/EFM apparatus that can be used to test the devices and field-effect transistors of the present invention.

A cold temperature AFM apparatus is provided to carry out AFM/EFM measurements at a range of temperatures from ~10K to ~650K, in vacuum. This AFM apparatus is a customized commercial AFM. A schematic illustration of this AFM apparatus 1400 is provided in FIG. 14, which illustrates a sample 1410 residing on a stage 1408. In a closer view 1402, the copper stage 1408 is supported by insulating feet 1404 on the sample stage 1406. Thermally conductive braids 1412 attach to the stage 1408 and cold finger 1418, which is monitored by a temperature monitor 1424 and attached to cryogenically cooled fluid 1426 contained within cryostat 1422. Also provided are vacuum pump 1420 and vacuum tubing 1416 attached to sample chamber 1414.

Increasing the conductivity in NC arrays. The conductivity in NC arrays can be increased in several ways: 1) by using a metal gate to change the carrier density, 2) by using bridging molecules to control the coupling between NCs, and 3) by using thin metal objects near the individual NCs to shift the NC energy levels. The ligands may be partially or totally removed by annealing the NCs in vacuum. Annealing may give rise to an all-semiconducting sample after the organics are removed. Typically, the conductivity of the NC arrays is increased by reducing the separation between the NCs. Without being bound by any particularly theory of operation, reducing the separation between the NCs increases the tunneling.

Annealing NC Arrays. An efficient way to reduce the NC separation is to anneal the NCs. Annealing typically makes the PbSe very conductive. The annealing temperature is typically at least about 100° C., more typically at least about 150° C., even more typically at least about 200° C., further typically at least about 250° C., even further typically at least about 300° C., up to at least about 350° C., and even up to at least about 400° C, and preferably below about 430° C. Annealing is preferably carried out under vacuum or in an inert gas, for example, helium, argon or nitrogen. Annealing also improves the ordering of nanocrystals.

Example: Large 3D ordered arrays of PbSe NCs were produced by annealing an assembly of PbSe NCs at 150° C. in vacuum. Annealing of the NCs may also cause red-shifts of the absorption spectra of NC arrays. Without being bound by any particular theory of operation, it is believed that because annealing decreases the separation between the NCs, red-shifting arises as a result of the change in polarization energy of the quantum-confined exciton when the dielectric environment around the NCs is changed. The position and shape of the absorption peaks is used as an additional measure of the nature and extent of the electronic coupling between the NCs.

Figure 15:
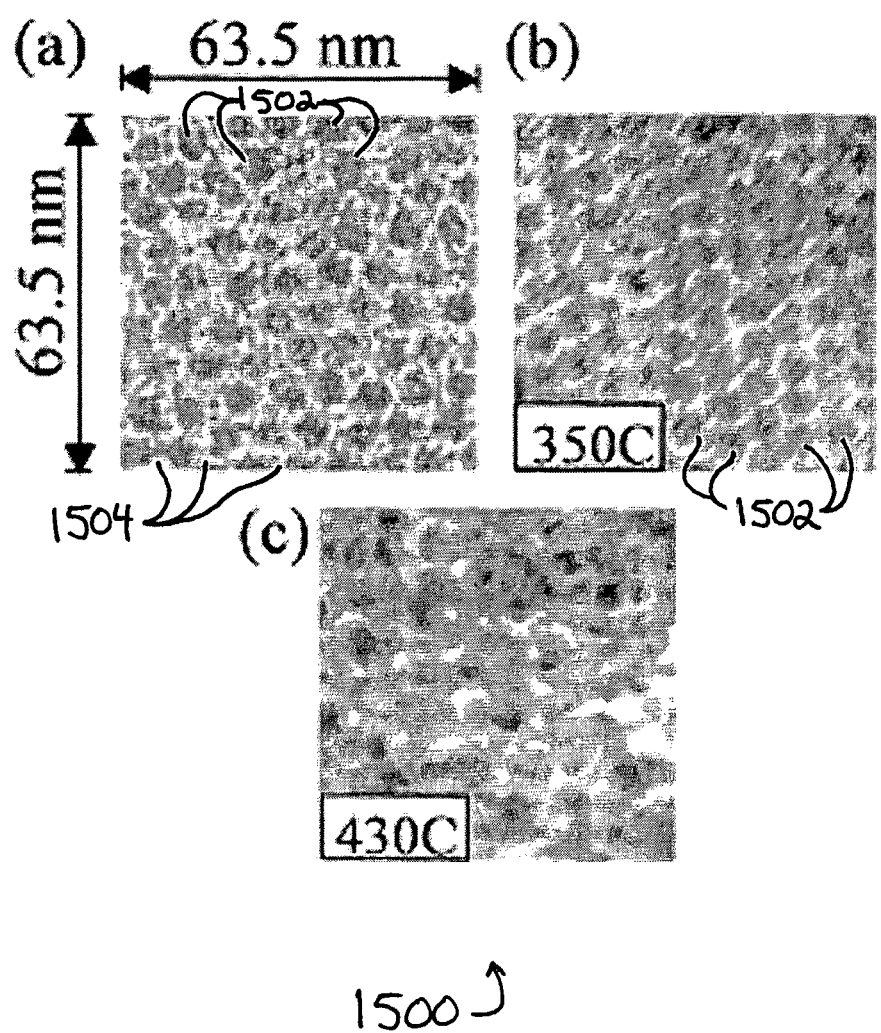
FIG. 15 show photomicrographs of the effect of annealing on NC arrays from reference [12]. TEMs of a CdSe NC array at room temperature with NC diameter D=6.1 nm: (a) as deposited, and after annealing in forming gas at annealing temperatures (b) $T_a$=350° C. and (c) $T_a$=430° C. The inter-dot separations found from these data are d=1.1 nm for (a) and d=0.5 nm for (b). The NCs are no longer distinct at 430° C.

Referring to FIG. 15, there is provided a series of TEMs (1500) of a CdSe NC array (1502) at room temperature with NC diameter D=6.1 nm:with ~100 NCs (from reference [12]): (a) as deposited, and after annealing in forming gas at annealing temperatures (b) Ta=350° C. and (c) Ta=430 ° C. The inter-dot separations found from these data are d=1.1 nm for (a) and d=0.5 nm for (b). The NCs are no longer distinct at 430° C. The annealing process melts the passivating layer (1504) on the NCs and allows the NCs to pack more closely together. As the NCs are annealed, the separation between the NCs decreases and the electrical conductivity increases by up to six orders of magnitude. In the devices of the present invention, the NCs can be thermally treated in situ to anneal the NCs, reduce the NC-NC separation distance, and increase the electrical conductivity.

Figure 17:
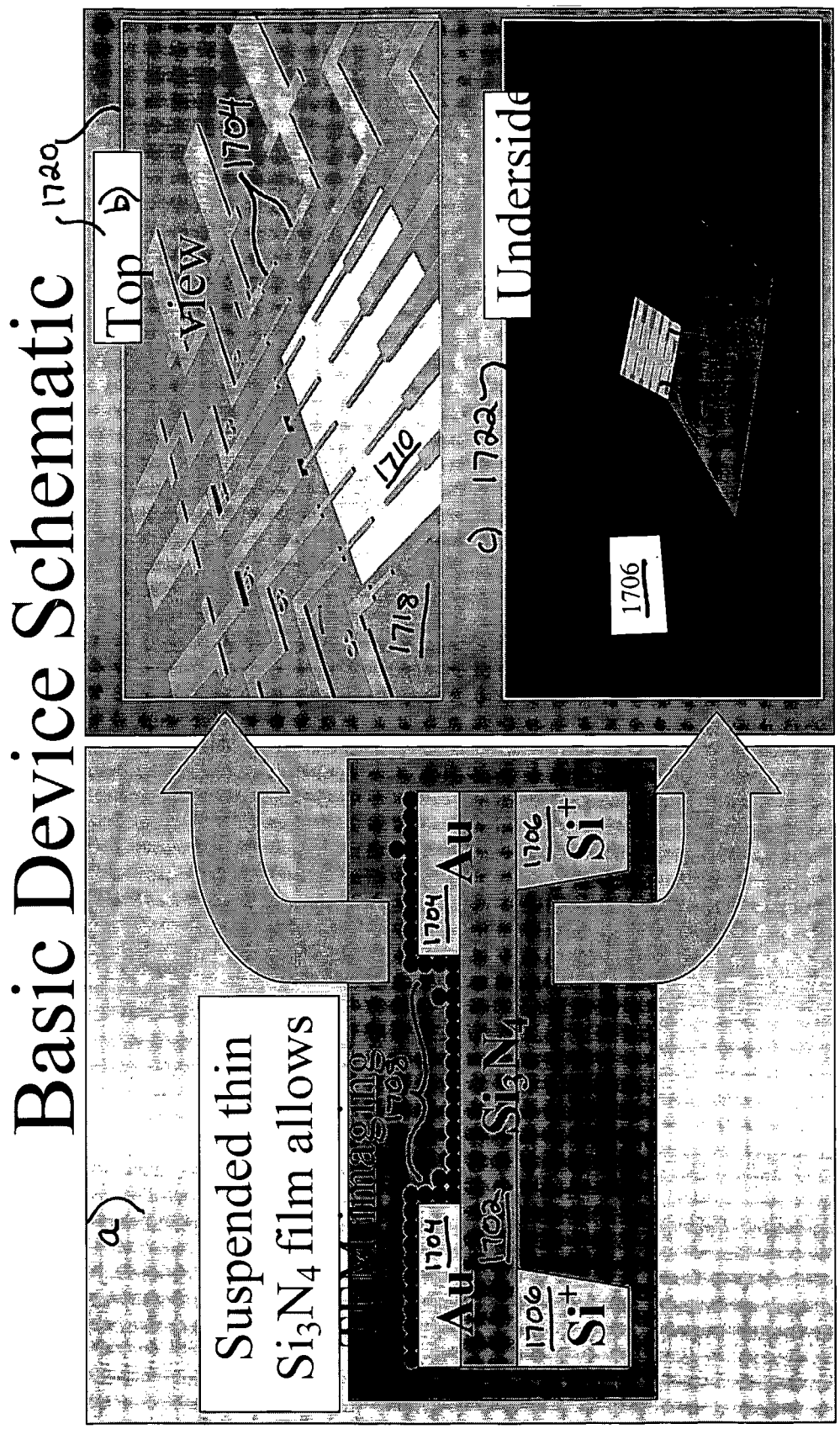
FIG. 17 is a schematic illustration of an embodiment of a device of the present invention. A) suspended thin film forming a bridge; b) top view; c) underside view.

A variety of different embodiments of the present invention are further exemplified below:

FIG. 17 is a schematic illustration of an embodiment of a device 1700 of the present invention: a) cross sectional view of device; a supporting layer (1706) is chemically etched such that a region is removed from underneath an insulating thin (~100 nm) film (1702). Electrodes (1704) can be fabricated on the thin film 1702 with E-Beam lithography. The purpose of using a thin film is to be able to image the NC assembly inside the device with TEM. NCs (1708) are deposited onto the surface and assemble 1708 inside the device 1700; b) a top view (1720) of the device 1700 showing the E-Beam fabricated electrodes (1704). The white region (1710) is the suspended region of the thin film 1702. The area (1718) outside of the white region 1710 is the thin film on top of the supporting layer 1706; c) The underside view (1722) of the device 1700. The suspended thin film is seen as the white region and the electrodes can be seen situated on the film because the film is thin enough to transmit the electron beam during TEM imaging.

FIG. 18 are SEMs of an embodiment of a device (introduced schematically in FIG. 17) of the present invention having a plurality of electrode discontinuities deposited on a substrate. a) SEM image showing the device; it is composed of contact pads (1802) which are used to electrically connect the electrodes (1814) to an external apparatus. The electrodes are sitting on a substrate made of a thin film in top of a supporting layer (1804). The black square in the middle is a region of thin film only (1810). b) a zoomed in SEM image of the device. The electrodes continue from the thin film on support layer region (1804) to the thin film only region (1810). The thin film makes imaging the assembly of NCs near electrode defects possible with TEM.

Figure 19:
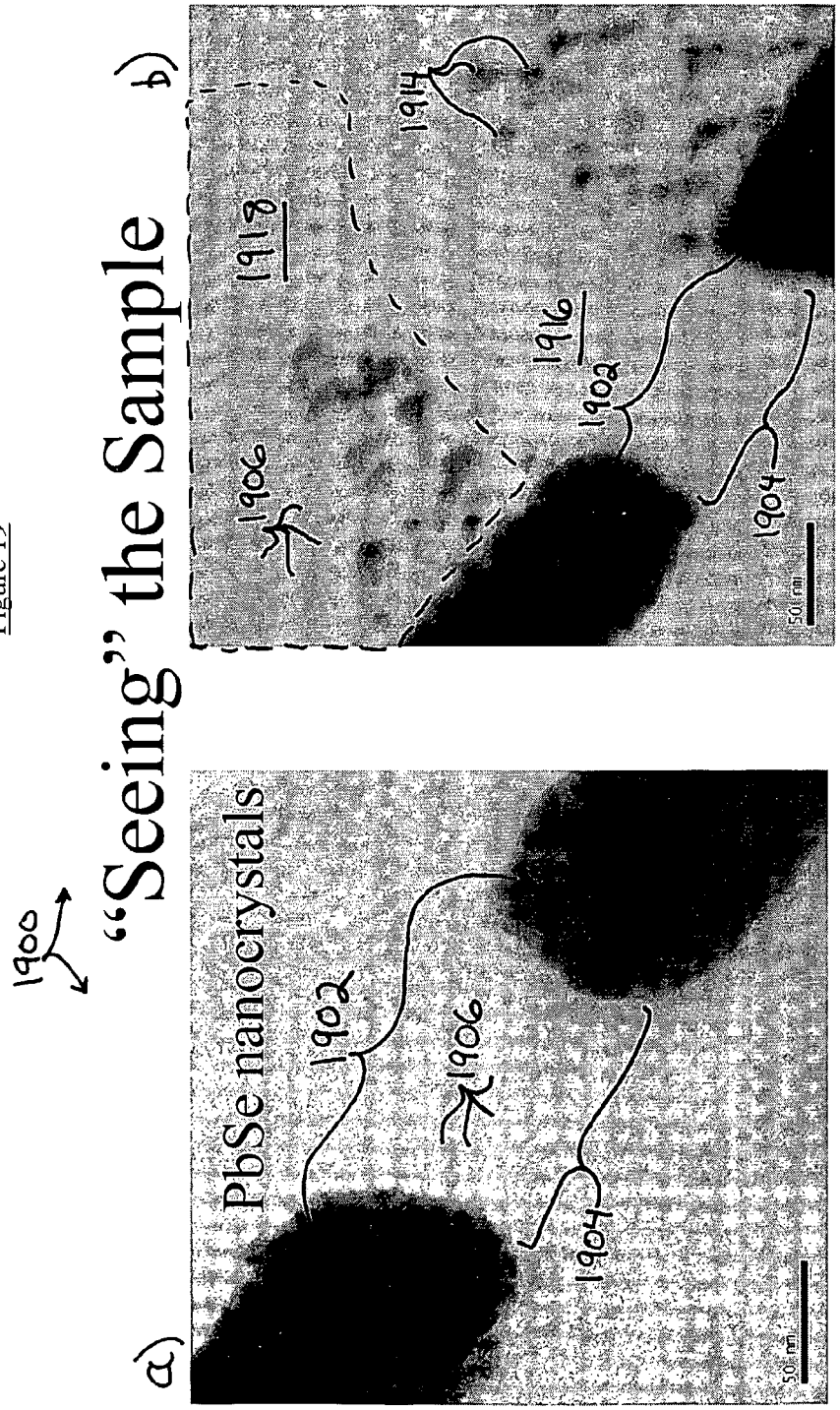
FIG. 19 depict TEMs of devices; a) an embodiment of the present invention having two electrodes having a 100 nm gap width having a plurality of about 10 layers of PbSe nanocrystals spatially assembled and ordered between the electrodes; b) electrodes without ordered nanocrystals in the gap.

FIG. 19 are TEMS of devices of the present invention; a) an embodiment of the present invention having two electrodes (1902) having a 100 nm gap (1904) width having a plurality of about 10 layers of PbSe nanocrystals (1906) spatially assembled and ordered between the electrodes; b) electrodes 1902 without ordered nanocrystals in the gap 1904. The lack of NCs in the gap region (1904) reveals the insulating thin film (1916) upon which the electrodes (1902) reside. Metal debris (1914) left over from the electrode fabrication process act as discontinuities and restricts NC assembly to a region away from the gap (1918).

Figure 20:
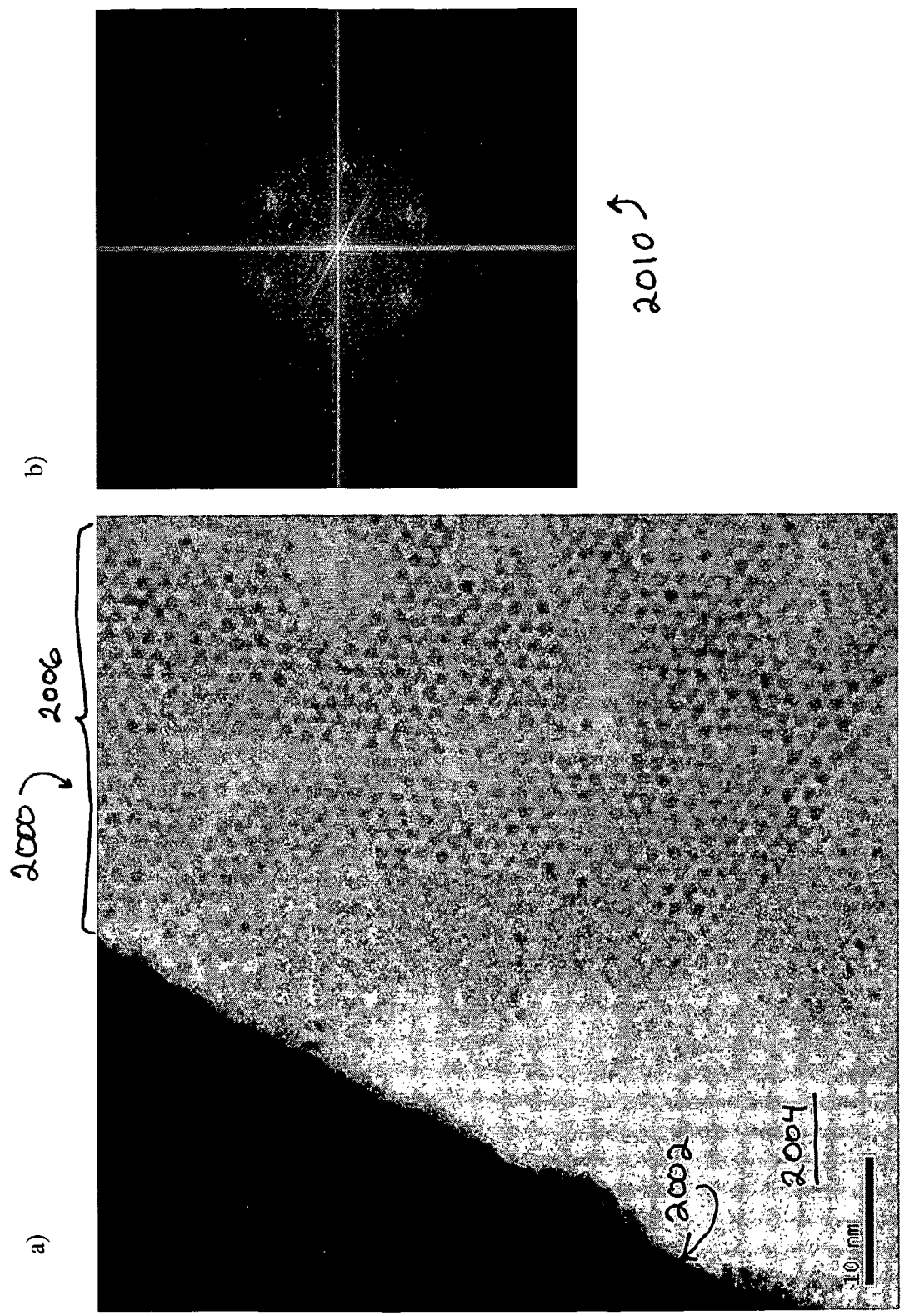
FIG. 20 is an electromicrograph (TEM) of spatially ordered nanocrystals adjacent an electrode (dark region at top left) (a), and an electron diffraction pattern of the spatially ordered region (b).

FIG. 20 is a transmission electron micrograph (TEM) 2000 of spatially ordered nanocrystals (2006) adjacent an electrode (2002) (a), and an electron diffraction pattern 2010 of the spatially ordered region (b). The surface on which the electrode and NCs sit is an insulating thin film (2004).

Figure 21:
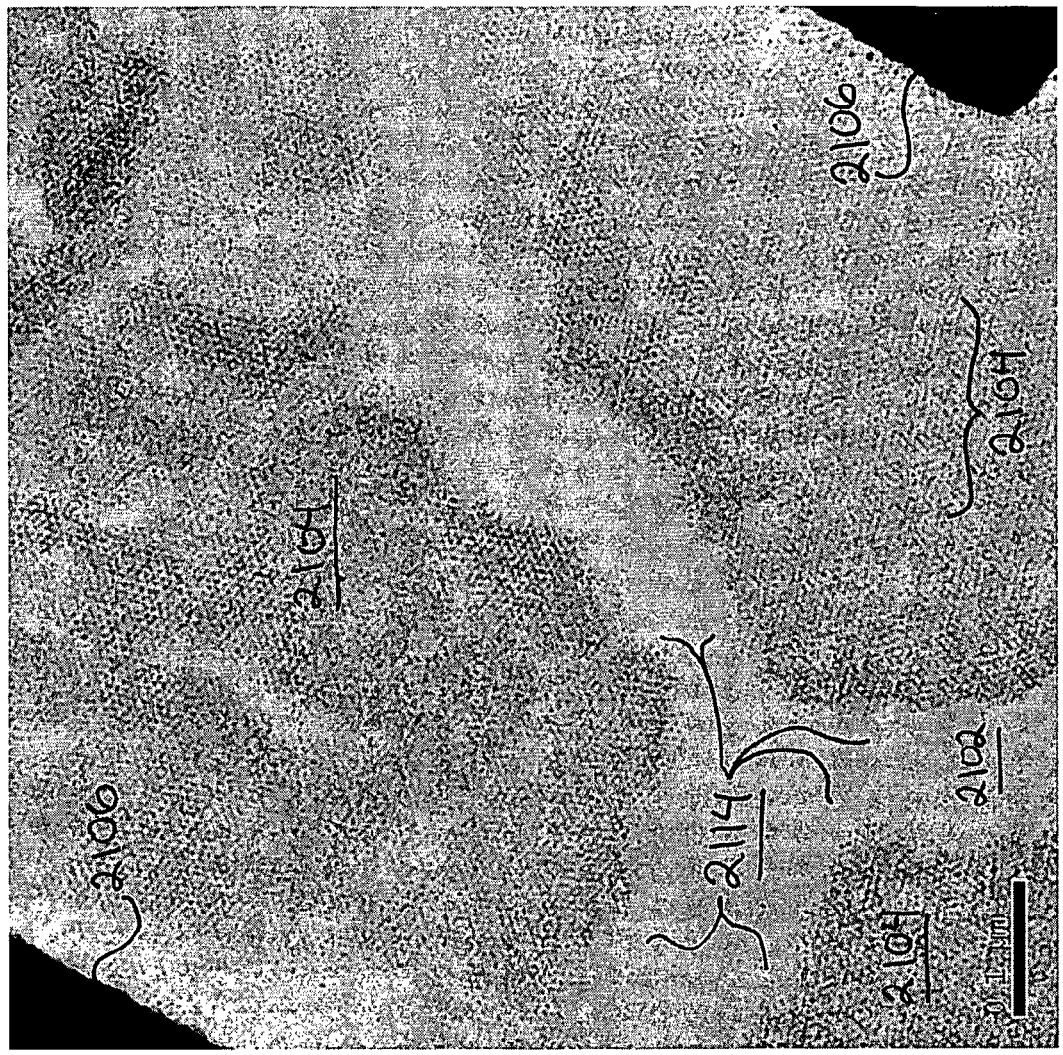
FIG. 21 is an electromicrograph (TEM) of spatially ordered nanocrystals between two electrodes (dark regions at top left and bottom right).

FIG. 21 is an electromicrograph (TEM) 2100 of spatially ordered nanocrystals (2104) between two electrodes (2106)

(dark regions at top left and bottom right.) The insulating thin film substrate (2102) can be seen in the regions where no NCs are present (2114).

Figure 22:
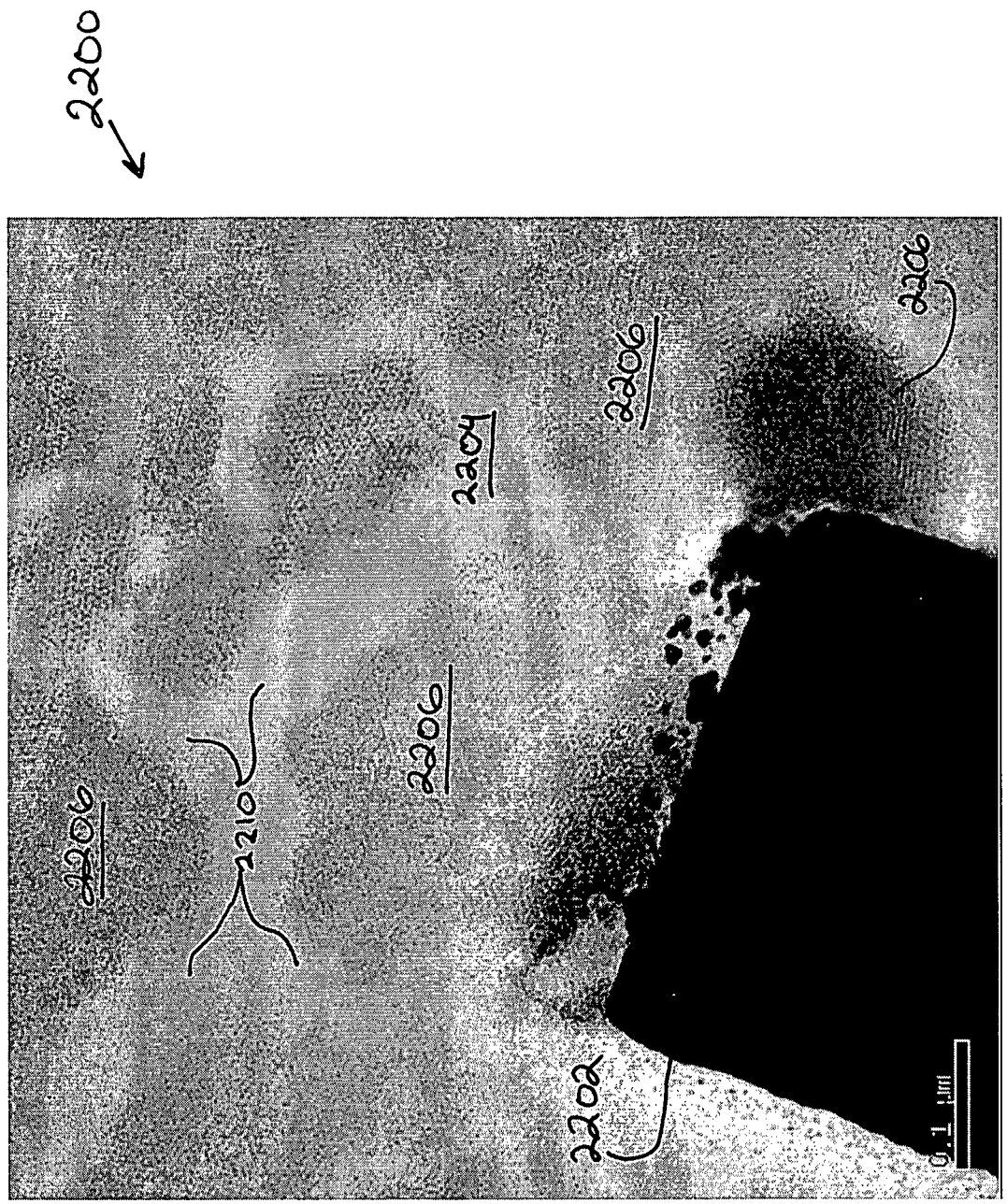
FIG. 22 is an electromicrograph (TEM) of spatially ordered nanocrystals adjacent an electrode (dark region at bottom).

FIG. 22 is an electromicrograph (TEM) 2200 of spatially ordered nanocrystals (2206) adjacent to an electrode (2202) (dark region at bottom). The substrate (2204) is visible where there are no NCs (2210).

Figure 23:
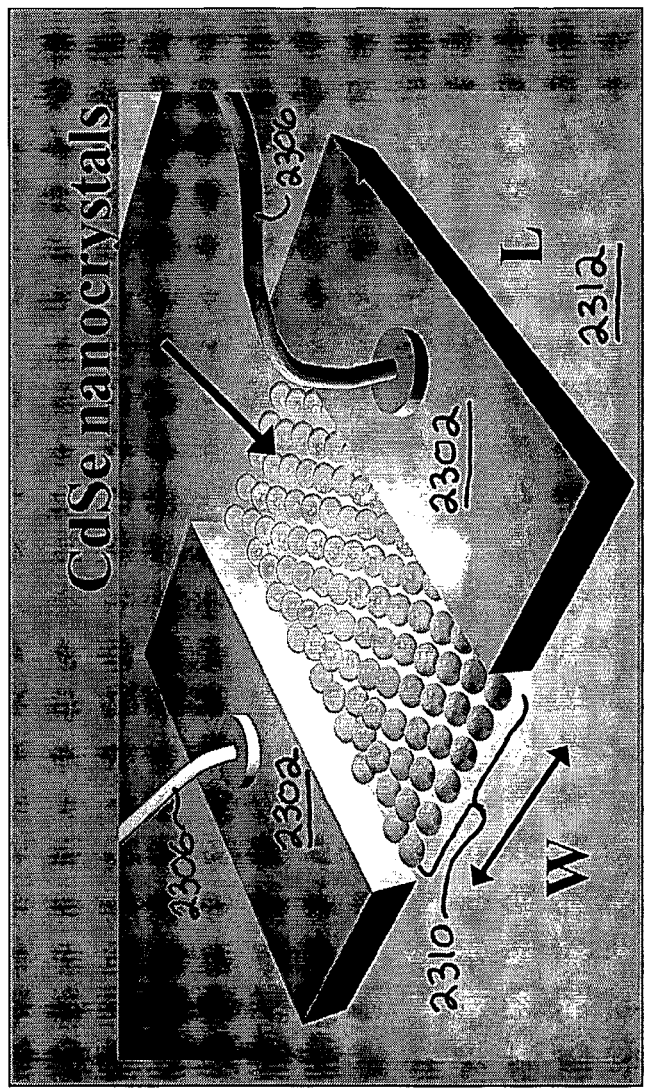
FIG. 23 is a schematic illustration of an embodiment of a device of the present invention comprising two electrodes in a capacitor plate geometry. This embodiment comprises a two dimension hexagonal array of about 100 CdSe nanocrystals.

FIG. 23 is a schematic illustration of an embodiment of a device 2300 of the present invention comprising two electrodes (2302) in a capacitor plate geometry on an insulating substrate (2312). This embodiment comprises a two dimension hexagonal array of about 100 CdSe nanocrystals (2310). The electrodes are connected to an electrical apparatus with wires (2306).

Figure 24:
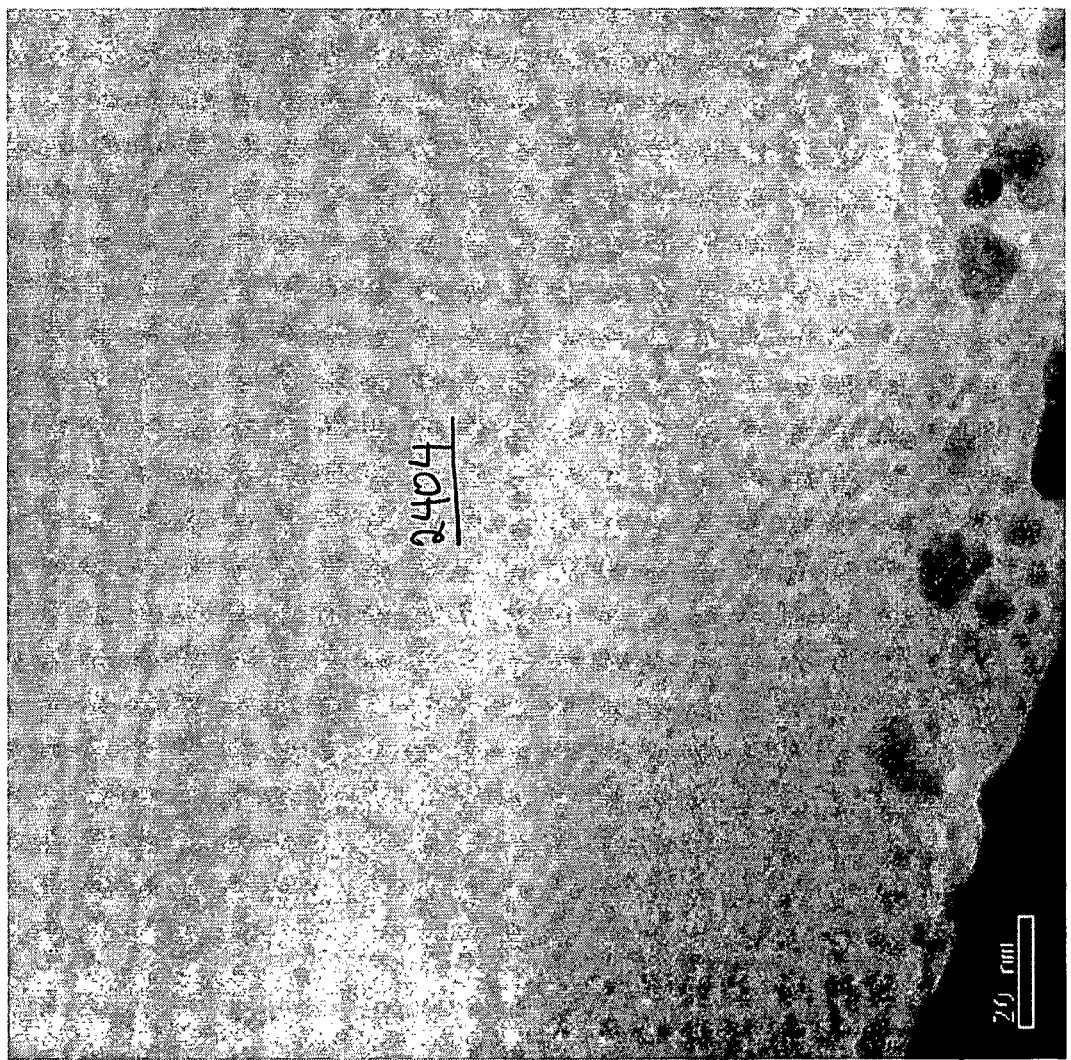
FIG. 24 is an electromicrograph (TEM) of a partially disordered assembly of nanocrystals adjacent an electrode (dark region at bottom).

FIG. 24 is an electromicrograph (TEM) of a partially disordered assembly of nanocrystals (2404) adjacent an electrode (2402) (dark region at bottom).

Figure 25:
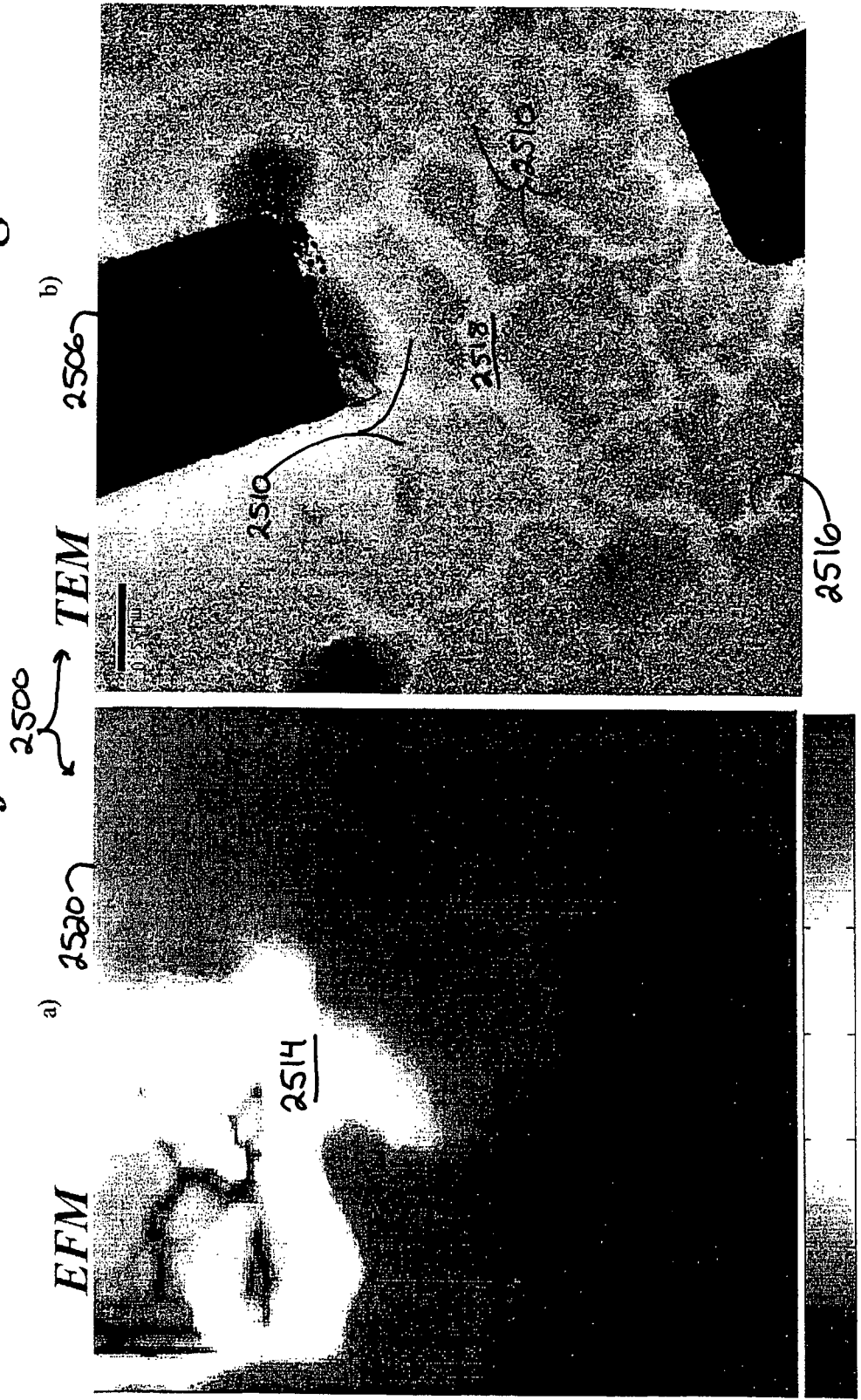
FIG. 25 depicts a correlation of (a) EFM and (b) TEM imaging of a device of the present invention. The scale bar in (b) is 200 nm.

FIG. 25 depicts a correlation of (a) EFM and (b) TEM imaging of a device of the present invention. The scale bar in (b) is 200 nm. (a) shows the NC film (2520) being charged by an electrode (2506) The charged region of the NC film (2514) appears as a bright EFM signal, while the remaining uncharged region of the film remains dark. (b) reveals the spacing between NC assembly regions (2510). Charge does not flow across regions of no NCs (2518) and this explains the contour in the EFM signal in (a). In these regions of no NCs, the substrate (2516) is visible.

FIG. 26 depicts a correlation of (a) AFM topography, (b) EFM and (c, d) TEM imaging of a device of the present invention. The scale bar in (c) is 200 nm and in (d) is 10 nm. The NC film (2620) is shown in (a) and (b) near and between electrodes (2610). The EFM image (b) shows a charged NC region (2614) and an uncharged NC region (2620). The correlation between the charged region and NC assembly (2626) configuration is shown to be due to the existence of regions of no NCs (2628) between NC assemblies. The substrate can be seen in these regions (2630).

FIG. 27 are (a) SEM and (b) TEM electron micrographs 2700 of membrane patterning used in preparing the devices of the present invention. A thin film of SiN (2702) was etched with a Focused Ion Beam to design trench discontinuities (2710) for control of NC (2722) assembly. Electrodes (2708) can be incorporated into the same device as the trench discontinuities. The trench edge (2714) seen in the zoomed TEM image (2706) defines a region of NCs which are electrically decoupled from NCs on the non etched regions (2716).

FIG. 28 is a schematic illustration (a) and electron micrographs (b, c, d) of channel control by use of a bridge used in preparing the devices 2800 of the present invention. (a) shows electrodes (2810) on an insulating thin film substrate (2832). Trenches (2824) are created (e.g., using FIB lithography) so as to define a bridge (2820) for NC assemblies (2822). The fabrication of the bridge device 2800 is shown in two steps: (b) shows two electrodes 2810 defined on the insulating thin film substrate 2832. (c) shows the device after the bridge has been defined by creating two trenches. (d) shows an NC assembly 2822 on the bridge 2820 between two electrodes 2810. One value of using a bridge is that channels for transport through NC assemblies can be tailored.

Figure 29:
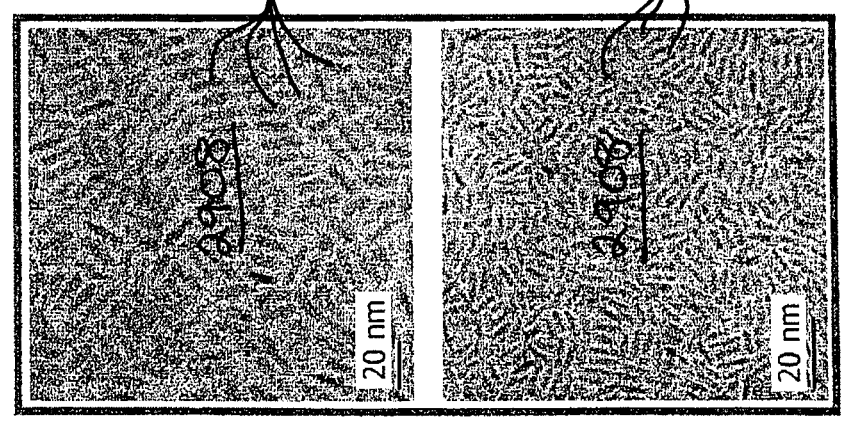
FIG. 29(a) and (b) are TEMS of CdSe nanorods (NRs); (c) is a schematic illustration of a nanorod used in various embodiments of the present invention.

FIG. 29(a) show TEMS 2900 of CdSe nanorods (NRs); (b) is a schematic illustration of a nanorod (2902) used in various embodiments of the present invention. An actual nanorod (2910) is shown in the TEM images (a). Nanorod assemblies (2908) are also shown in (a).

Figure 30:
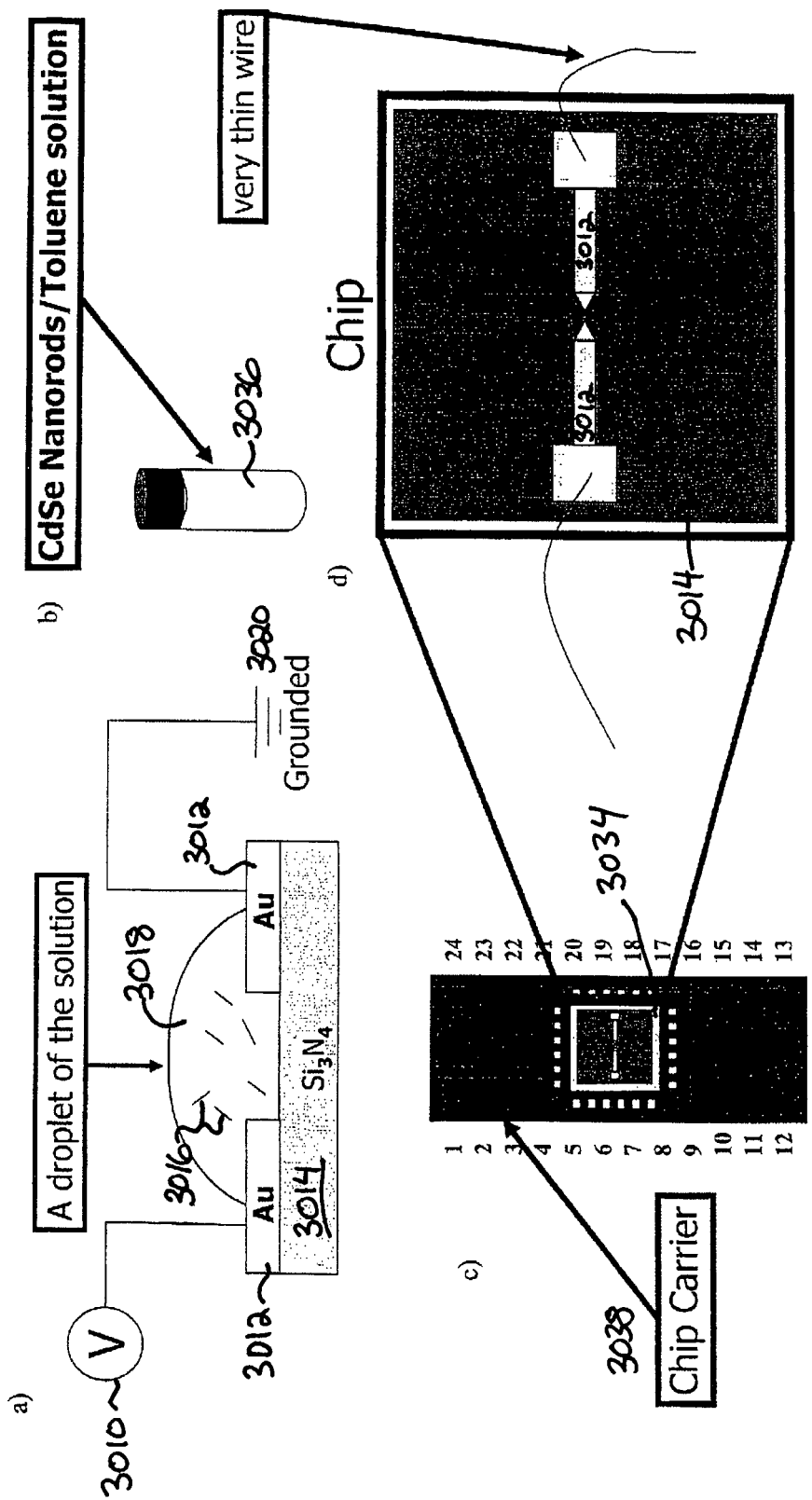
FIG. 30 is a schematic illustration of an experimental setup and process for preparing an embodiment of a device of the present invention that includes an assembly of nanorods spatially ordered between two electrode discontinuities: (a) voltage-driven ordering of nanorods between gold electrodes deposited on a silicon nitride substrate; (b) CdSe nanorods dispersed in a toluene fluid; (c) a chip carrier comprising a chip; (d) a chip comprising the silicon nitride substrate, gold electrodes and ordered nanorods (not shown).

FIG. 30 is a schematic illustration of an experimental setup and process for preparing an embodiment of a device of the present invention that includes an assembly of nanorods spatially ordered between two electrode discontinuities: (a) voltage-driven ordering of nanorods (3016) between gold electrodes (3012) deposited on a silicon nitride substrate (3014) during evaporation phase of NR drop-casting from solution (3018); an applied voltage (3010) directs assembly of NRs. The opposite electrode is at ground (3020). (b) CdSe nanorods dispersed in a toluene fluid (3036); (c) a chip carrier (3038) comprising a chip (3034); (d) a chip (3034) comprising the silicon nitride substrate (3014), gold electrodes 3012 and ordered nanorods (not shown).

Figure 31:
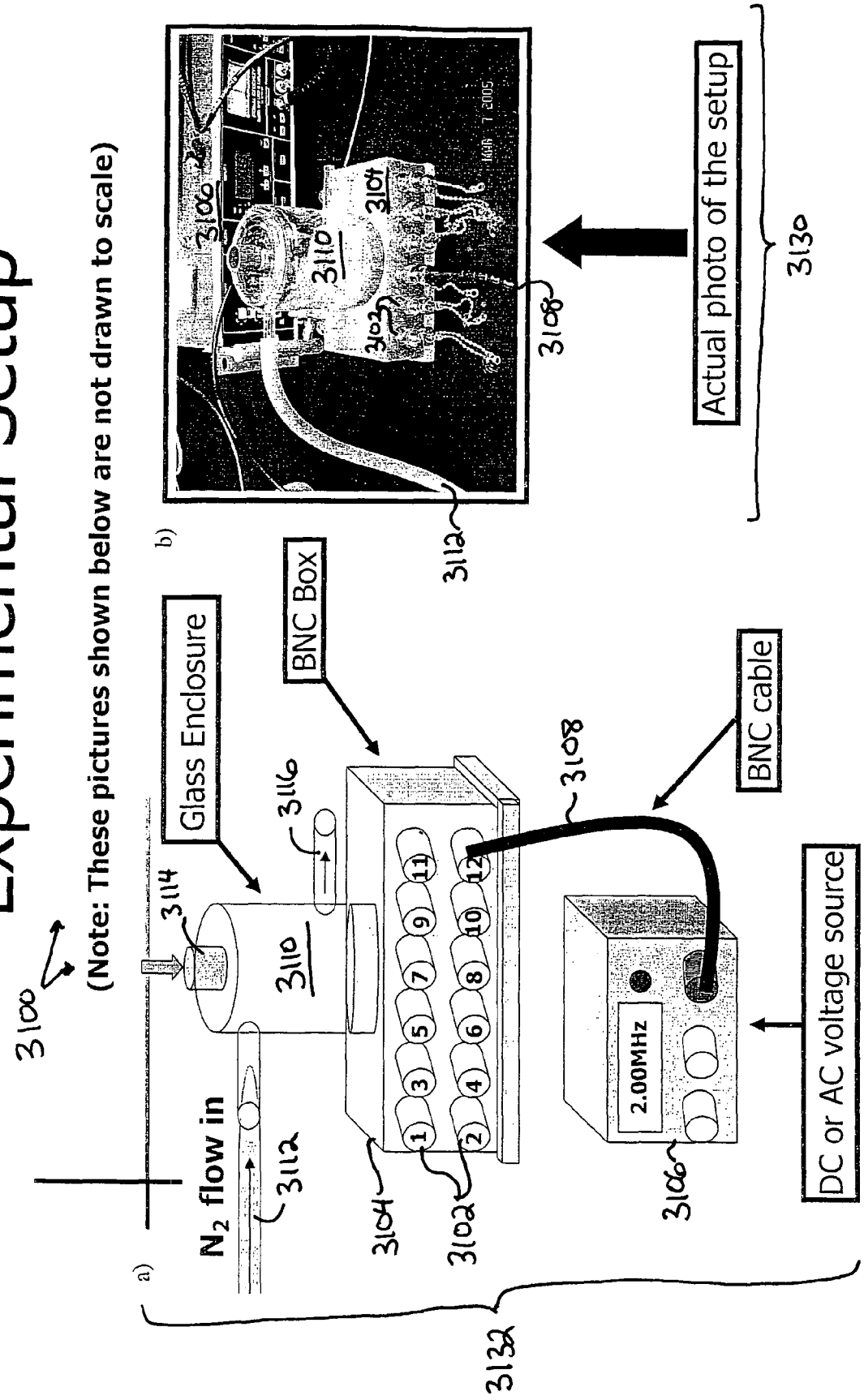
FIG. 31 is a schematic illustration of an embodiment of an environmental chamber used in testing the devices and FETs of the present invention.

FIG. 31(a) is a schematic illustration 3132 and photograph 3130 of an embodiment of an environmental chamber used in testing the devices and FETs of the present invention. The chamber consists of a glass enclosure (3110) connected to an inert gas source (3112) and gas vent (3116). Nanostructures can be introduced to a device through an hermetic injection port (3114) in a chemically neutral environment in this setup. This can be useful for protecting samples from oxidation during device preparation. The ability to apply voltage from a voltage source (3106) to the device during deposition is made possible with the BNC plug box (3104) electrical connection between external BNC cables (3108) and specific device electrodes (not shown) through connection to the appropriate BNC plug (3102).

FIG. 32(a) and (b) are SEMs of a substrate of the present invention having electrode discontinuities applied thereupon.

Figure 32:
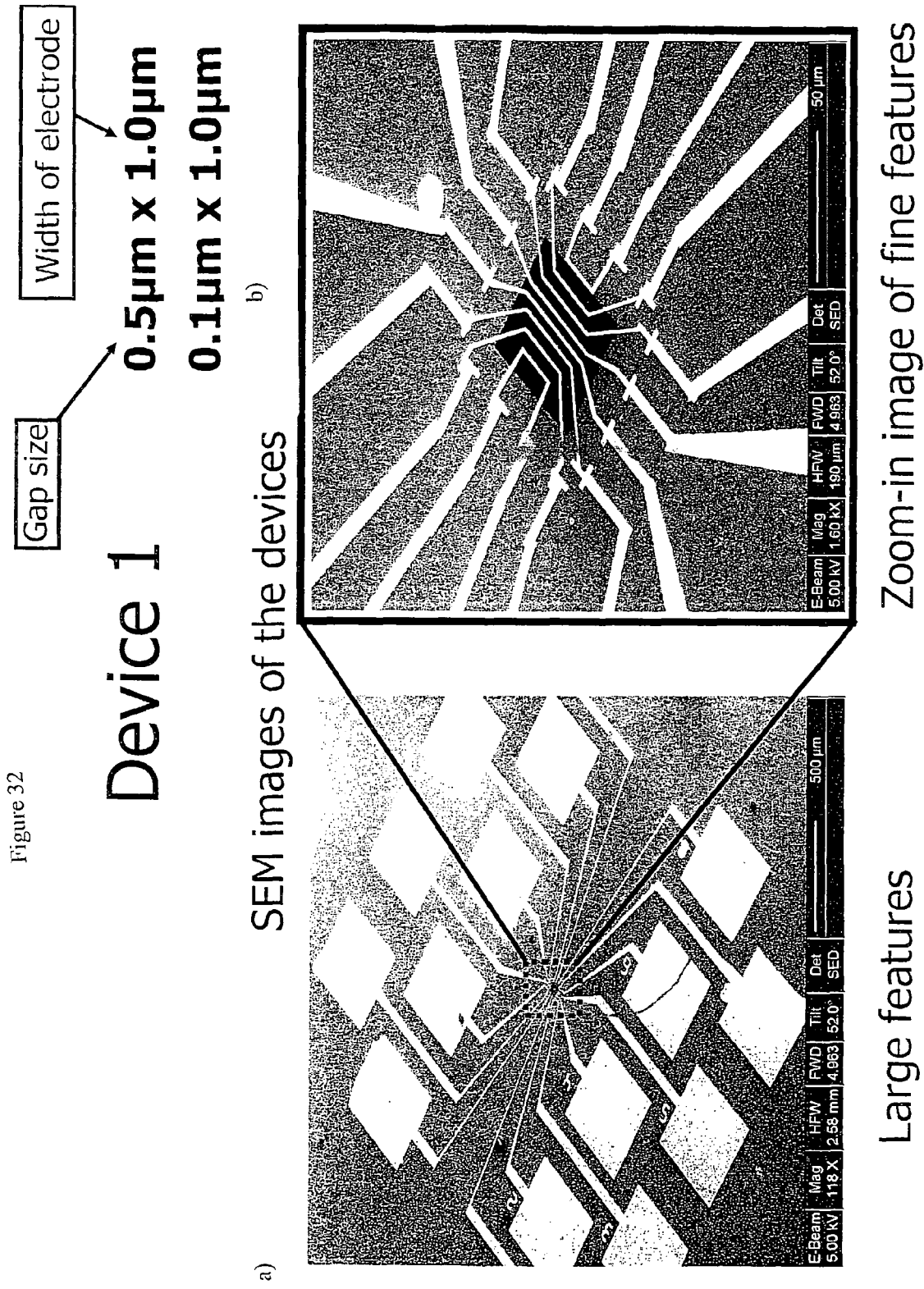
FIG. 32(a) and (b) are SEMs of a substrate of the present invention having electrode discontinuities applied thereupon.

FIG. 33 are TEMs 3300 of one of the electrodes (3304) of FIG. 32 that has been fabricated to have a gap (3316) having a width of about 100 nm. (a) scale bar is 10 microns; (b) scale bar is 1 micron. (b) shows the gap 3316. The electrodes 3304 sit on a thin film substrate (3302) (this allows for TEM imaging) which itself is held by a support layer (3306).

Figure 34:
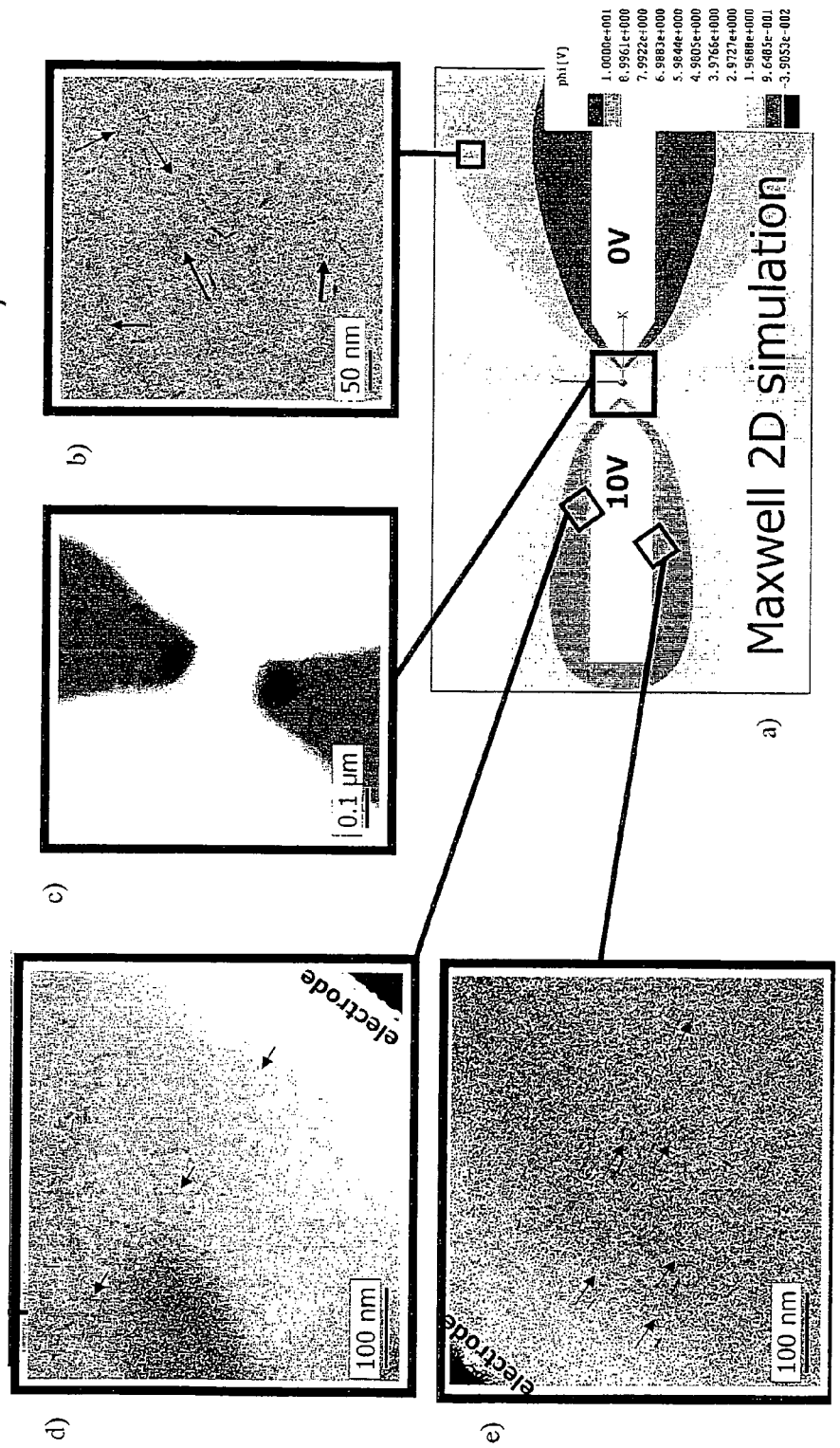
FIG. 34(a) is a Maxwell 2D simulation of the electric field between the electrodes of the device illustrated in FIG. 33; (b)-(e) are TEMs that show orientation of very dilute nanorods in solution in the presence of a 10V electric potential.
Figure 35:
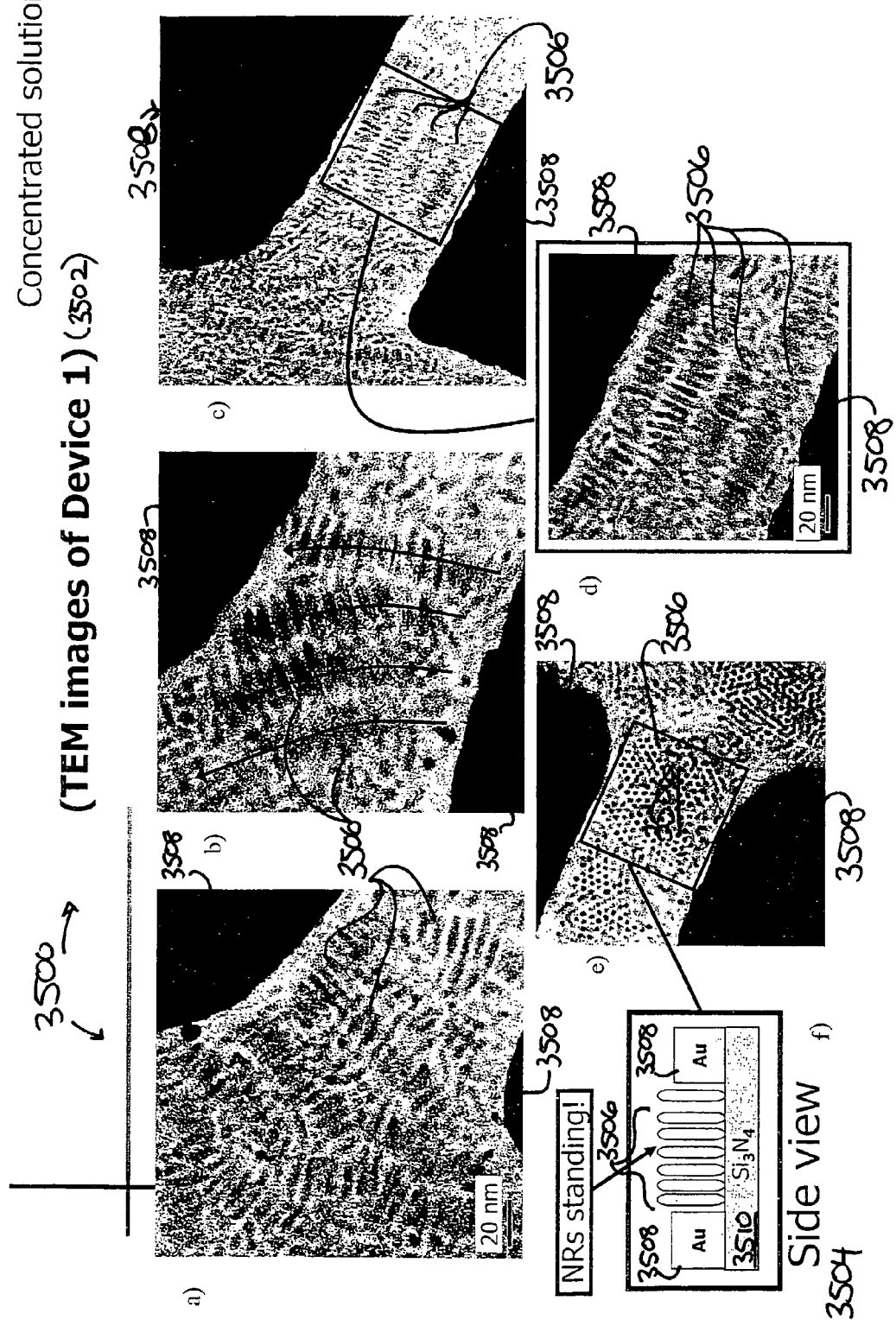
FIG. 35(a)-(e) are TEMS of an embodiment of a device of the present invention comprising two electrodes (dark regions) and an ordered two-dimensional array of nanorods assembled therebetween. (f) is an illustration of a side view that depicts that the nanorods are standing on their ends relative to the substrate.

FIG. 34(a) is a Maxwell 2D simulation of the electric field between the electrodes of the device illustrated in FIG. 33; (b)-(e) are TEMs that show orientation of the very dilute nanorods in solution in the presence of a 10V electric potential.

FIG. 35(a)-(e) are TEMS (3502) of an embodiment of a device of the present invention comprising two electrodes (3508) (dark regions) and an ordered two-dimensional array of nanorods (3506) assembled there between. (f) is an illustration (3504) of a side view that depicts that the nanorods 3506 are standing on their ends relative to the substrate 3510. Ordering of asymmetrical structures in assemblies can demonstrate beneficial properties compared to disordered assemblies. Without being bound to any particular theory of operation, discontinuities arising from the electrodes define boundary conditions that can favor the correct size assembly and tend to reject incompatible assembly arrangements.

FIG. 36 is a schematic illustration of the mechanism of conducting EFM measurements on FETs of the present invention; (a) an embodiment of an FET of the present invention comprising a gate electrode (bottom, grounded), source and drain electrodes, a linear array of 15 ordered nanocrystals, 2 disordered nanocrystals, and extra assembled nanocrystals adjacent the electrode and not part of the ordered array; (b) illustration of EFM scanning using an AFM tip.

Figure 37:
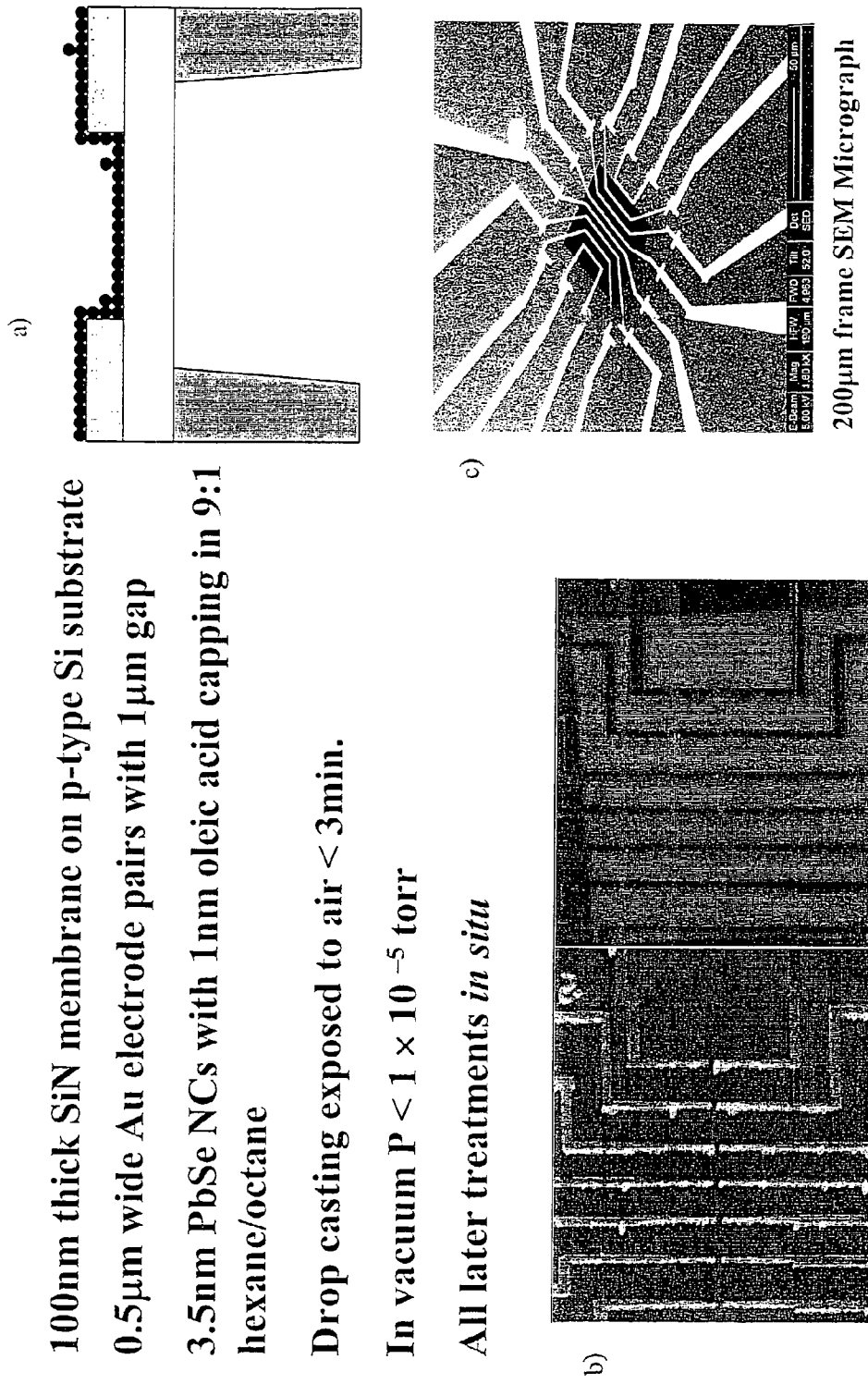
FIG. 37 is a schematic illustration of an embodiment of a method for preparing a device of the present invention; (a) device configuration; (b) AFM and EFM images before NC deposition; (c) SEM of substrate having a plurality of electrodes deposited thereupon.

FIG. 37 is a schematic illustration of an embodiment of a method for preparing a device of the present invention; (a) device configuration; (b) AFM and EFM images before NC deposition; (c) SEM of substrate having a plurality of electrodes deposited thereupon.

Figure 38:
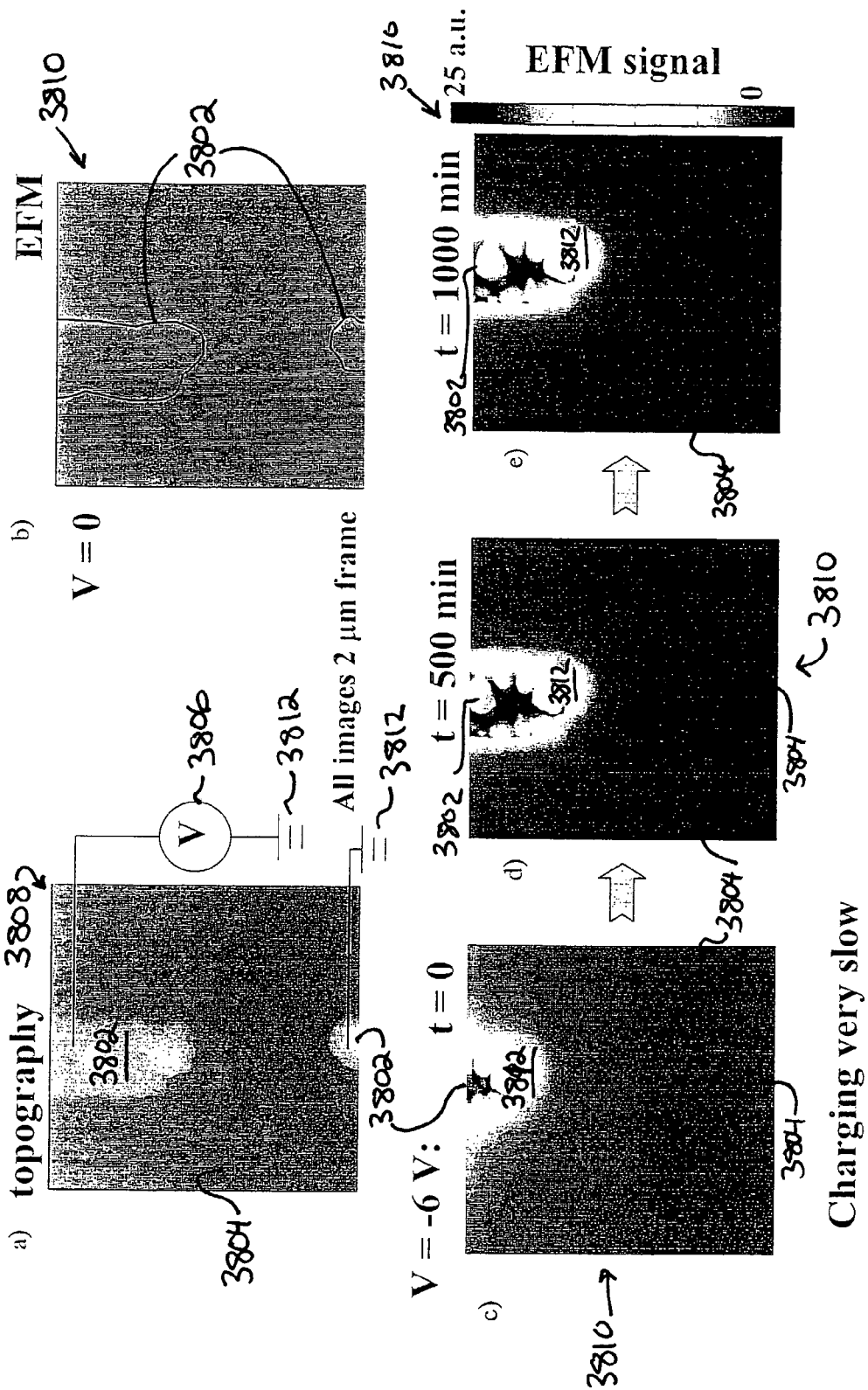
FIG. 38 depicts the charging of PbSe NC arrays at room temperature; (a) topography AFM; (b) EFM, v=0; (c) V=−6V at t=0; (d) t−500 minutes; (3) t=1000 minutes. Images are 2 microns×2 microns.

FIG. 38 depicts the charging of PbSe NC arrays (3804) at room temperature; (a) topography AFM (3808); (b) EFM (3810), v=0; (c) V=−6V at t=0; (d) t~500 minutes; (3) t=1000 minutes. All images are 2 microns×2 microns. Electrodes (3802) show up in the EFM images (3810) because they are charged with a voltage source (3806). The second electrode opposite the bright electrode in each image cannot be seen because it is connected to electrical ground (3812).

Figure 39:
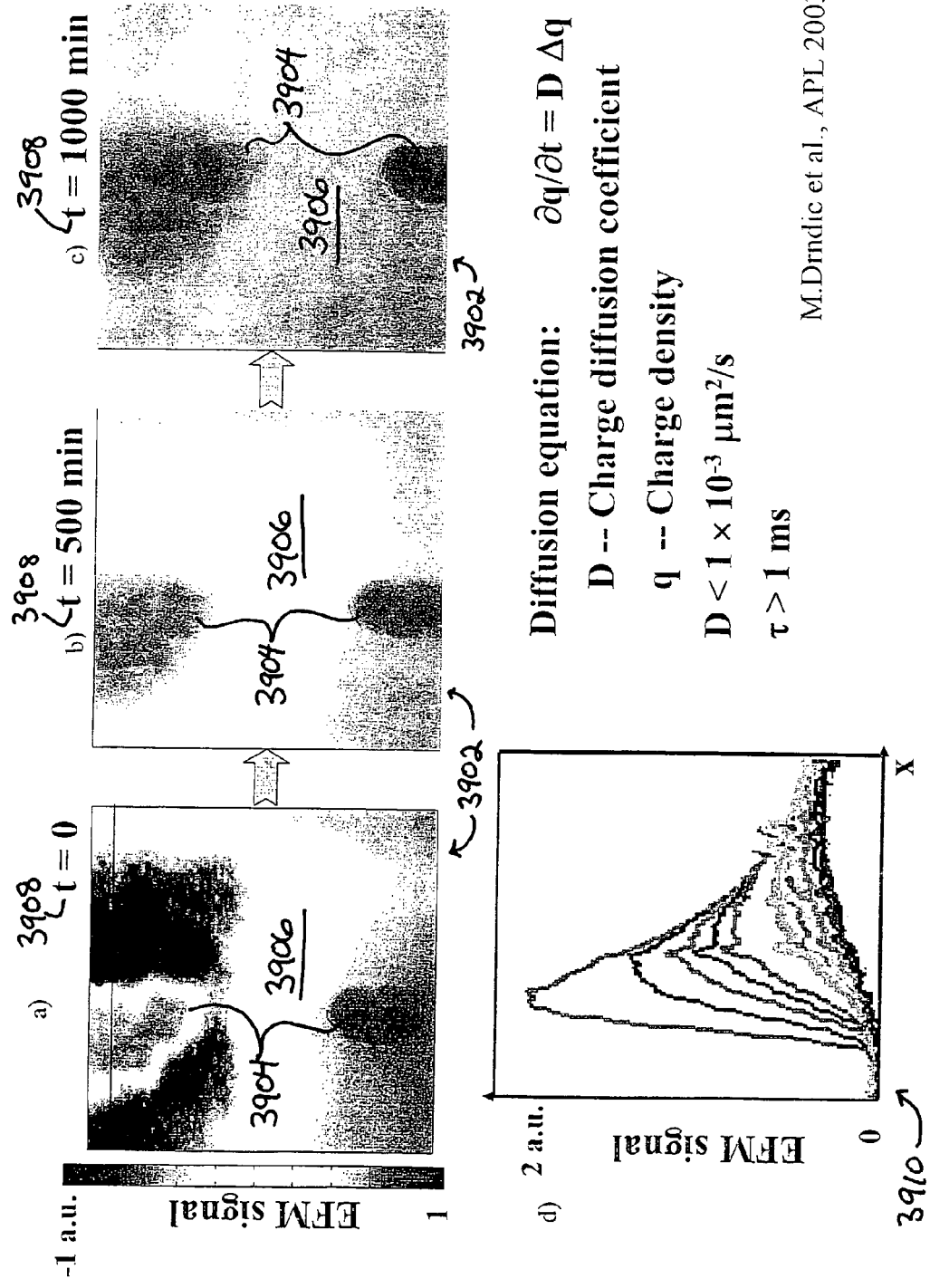
FIG. 39 depicts the discharging of the PbSe NC array of FIG. 38 at room temperature; (a) t=0; (b) t=500 min.; (c) t=1000 min.; d) EFM signal versus distance at various times showing decay of the charge with time.

FIG. 39 depicts the discharging of the PbSe NC array of FIG. 38 at room temperature; (a) t=0; (b) t=500 min.; (c) t=1000 min.; d) EFM signal versus distance at various times showing decay of the charge with time.

Figure 40:
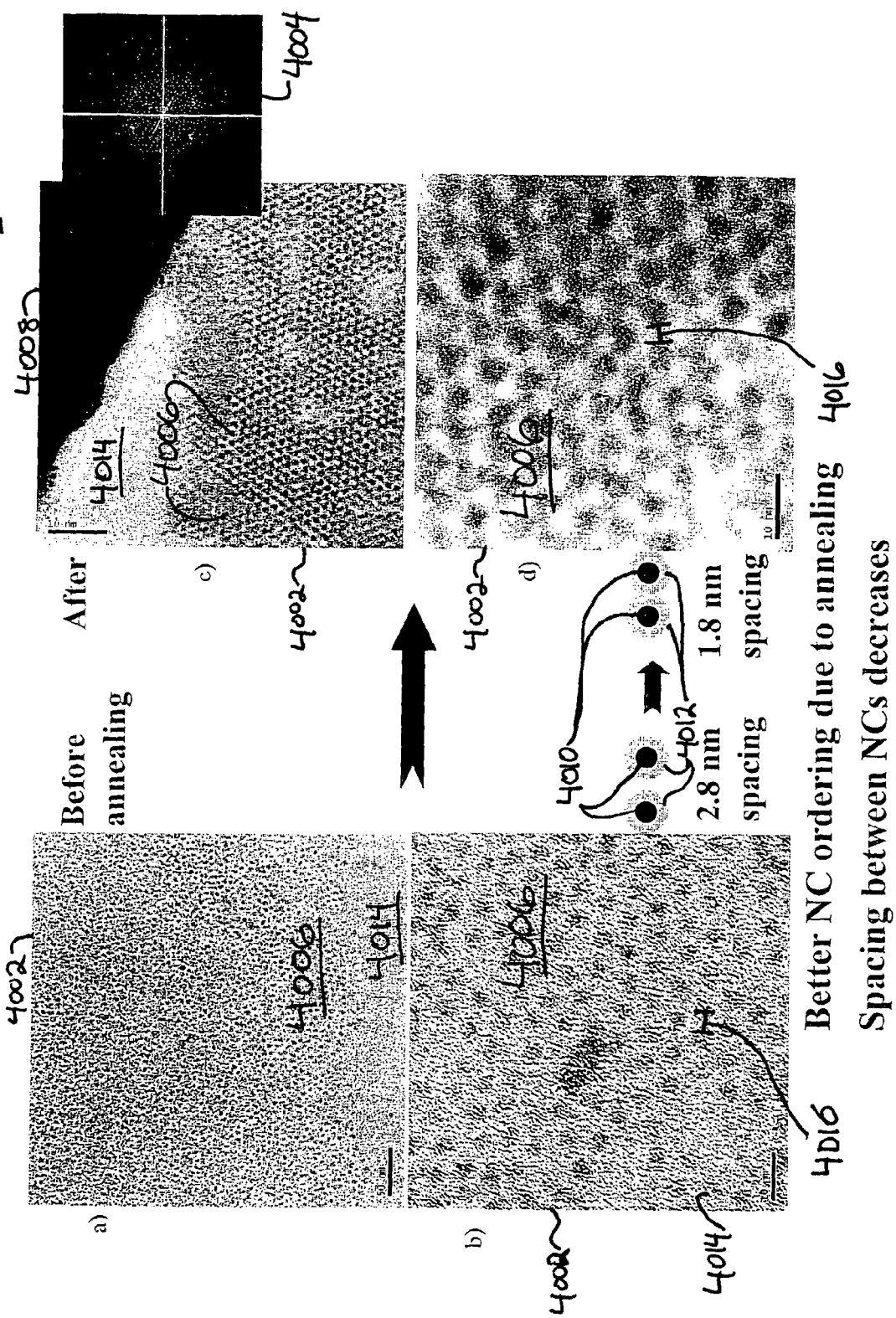
FIG. 40 are TEMs of ordered arrays of NCs that show the changes in the ordered arrays upon annealing of NCs in an embodiment of a device of the present invention. (a, b) low and high magnification, respectively, of an ordered array of NCs having a 2.8 nm spacing prior to annealing; (c, d) low and high magnification of the ordered array adjacent an electrode (c, top, black region) after annealing at 430 K (157° C.) for 4 hours; better NC ordering due to annealing is observed; spacing is reduced to 1.8 nm after annealing.

FIG. 40 are TEMs of ordered arrays of NCs that show the changes in the ordered arrays upon annealing of NCs in an embodiment of a device of the present invention. (a, b) low and high magnification of an ordered array of NCs having a 2.8 nm spacing prior to annealing; (c, d) low and high magnification of the ordered array adjacent an electrode (c, top, black region) after annealing at 430 K (157° C.) for 4 hours; better NC ordering due to annealing is observed; spacing is reduced to 1.8 nm after annealing.

Figure 41:
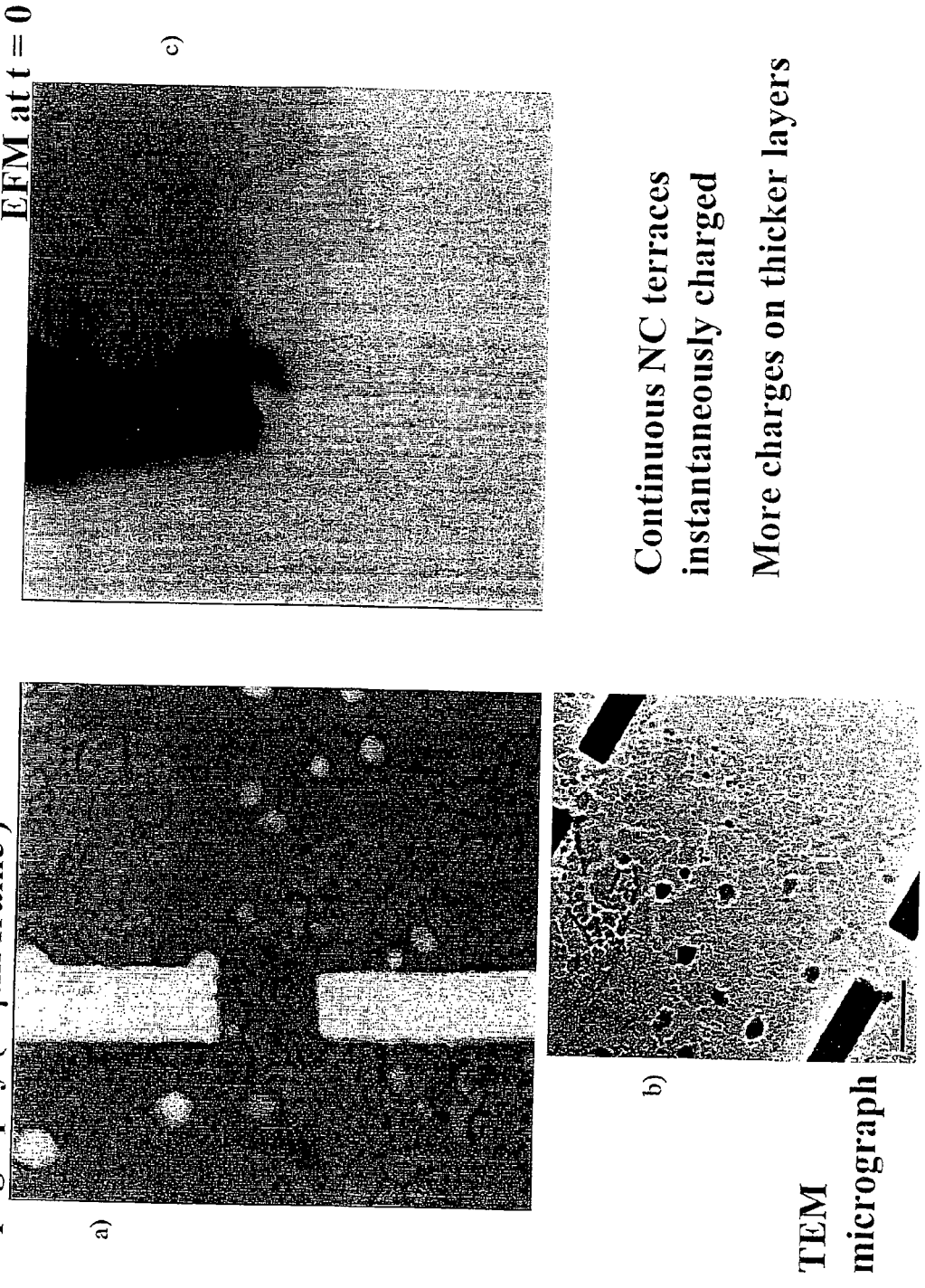
FIG. 41 depict (a) AFM, (b) TEM and (c) EFM images of a device of the present invention; a) and b) together show more charges on thicker (3D) assembled layers of NCs; continuous NC terraces are instantly charged.

FIG. 41 depict (a) AFM, (b) TEM and (c) EFM images of a device of the present invention; a) and b) together show more charges on thicker (3D) assembled layers of NCs; continuous NC terraces are instantly charged.

Figure 42:
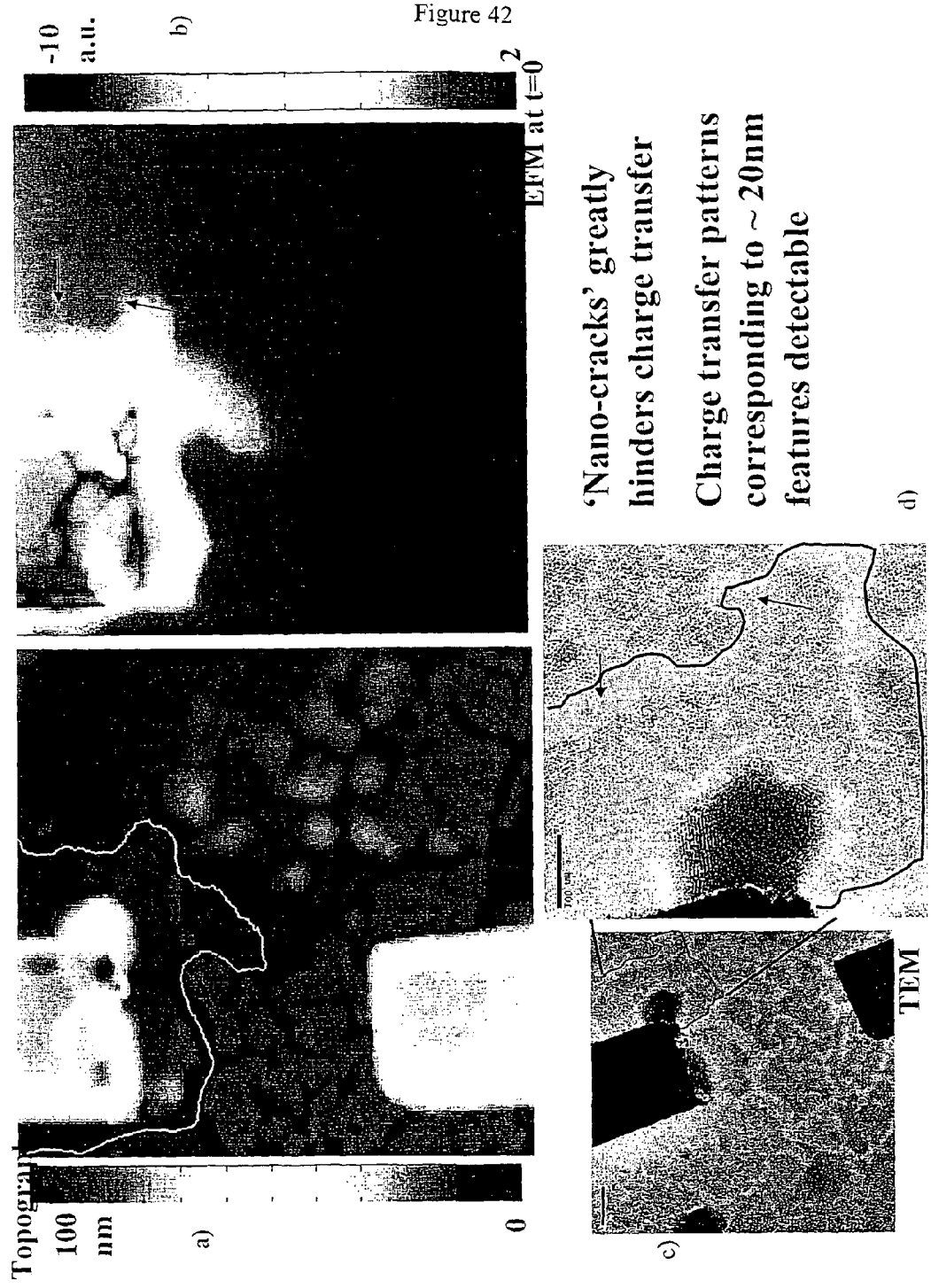
FIG. 42 depicts the correlation between EFM features and topographic nanopatterns in devices of the present invention; (a) AFM of two electrodes, a gap and NCs assembled in the gap; b) EFM of the top electrode region and NCs in a); c) TEM of two electrodes and several ordered assemblies provided within the gap between the electrodes (scale bar=200 nm); d) close-up TEM of a corner of the top-right electrode in c) depicting an ordered array adjacent the electrode and a nanocrack (illustrated using black line), scalebar in d) is 100 nm.

FIG. 42 depicts the correlation between EFM features and topographic nanopatterns in devices of the present invention; (a) AFM of two electrodes, a gap and NCs assembled in the gap; b) EFM of the top electrode region and NCs in a); c) TEM of two electrodes and several ordered assemblies provided within the gap between the electrodes (scale bar=200 nm); d) close-up TEM of a corner of the top-right electrode in c) depicting an ordered array adjacent the electrode and a nanocrack (illustrated using black line), scalebar in d) is 100 nm.

Uses in Quantum Electronics Applications. The electronic motion in NC assemblies can be used in quantum-electronics applications to develop efficient tools for integrating NCs into electronic devices (e.g., transistors and memory elements). An array of coupled quantum dots has been proposed for quantum information processing ("QIP") [9,10]. NCs are promising candidates for scalable solid-state implementation of QIP based on electron spin states. Recently, Ouyang and Awschalom have demonstrated coherent spin transfer between two CdSe NCs using optical means [11]. Quantum computing is a goal with a long timeline, but is expected to have a potentially big payoff. In the short term, there could be many spin offs, such as NC transistors, NC charge and spin sensors, and NC memory cells.

Devices of the present invention having coupled NCs can be used for preparing quantum computing circuits. Quantum computing is described in references [9,10]. For example, Loss and DiVincenzo [10] have proposed a mechanism for "two-qubit quantum-gate" operation based on electrons spins on coupled two quantum dots (or NCs). When the barrier between the NCs is high, the tunneling would be prohibited and the qubits would not change in time. When the barrier is low, the electron spins would feel the Heisenberg coupling proportional to S1S2, where S1 and S2 are the spin-½ operators for NCs 1 and 2, respectively. Devices of the present invention that are coupled this way can be used to provide one-bit gates, swap gates, XOR gates.

The devices made according to the present invention have a wide variety of applications, for example, in opto-electronics, electronics, quantum electronics, biology and medicine. A range of opto-electronic devices can also be made using the processes according to the present invention. These applications are enabled by the ability to assemble nanocrystals into desired configurations. These devices can be used in future generations of computers and other electronic, opto-electronic, molecular-electronic, and bio-electronic devices.

LIST OF REFERENCES

1. See for example, T. Chakraborty, Quantum Dots, Elsevier Science, 1999.
2. D. L. Klein, R. Roth, A. K. L. Lim, A. P. Alivisatos, P. L. McEuen, Nature 389, 699, 1997.
3. S. Coe W. K. Woo, M. Bawendi M, V. Bulovic, Nature, 420 (6917), 800, 2002.
4. X. F. Duan, Y. Huang, R. Agarwal, C. M. Lieber, Nature, 421 (6920), 241, 2003.
5. H. J. Eisler, V. C. Sundar, M. G. Bawendi, M. Walsh, H. I. Smith, V. Klimov, Appl. Phys. Lett. 80 (24), 4614, 2002.
6. B. Dubertret, P. Skourides, D. J. Norris et al., Science, 298 (5599), 1759-1762, 2002.
7. J. M. Haremza, M. A. Hahn, T. D. Krauss, Nano Letters 2 (11), p. 1253-1258, 2002.
8. L. S. Levitov and B. Kozinsky, "Charge ordering and hopping in a triangular array of quantum dots", http://xxx.lanl.gov/abs/cond-mat/9912484.
9. D. D. Awschalom et al., Semiconductor Spintronics and Quantum Computation, Spinger-Verlag, 2002.
10. D.Loss and D. P. DiVincenzo, "Quantum computation with quantum dots", Phys. Rev. A, 57 (1),120, 1998.
11. M. Ouyang, D. D. Awschalom, Science 301, 1074, 2003.
12. M. Drndic, N. Y. Morgan, M. V. Jarosz, M. A. Kastner, M. Bawendi, J. Appl. Phys. 92 (12), 7498, 2002.
13. N. Y. Morgan, C. A. Leatherdale, M. Dmdic, et al., Physical Review B 66, 075339, 2002.
14. D. S. Ginger, N. C. Greenham, J. Appl. Phys. 87, p. 1361-1368, 2000.
15. D. Yu, C. J. Wang, B. L. Wehrenberg, et al., Phys. Rev. Lett. 92 (21), 216801, 2004.
16. D. Yu, C. J. Wang, P. Guyot-Sionnest, Science 300 (5623), 1277-1280, 2003.
17. See for review S. V. Gaponenko, Optical Properties of Semiconductor Nanocrystals, Cambridge University Press, 1998.
18. C. B. Murray, D. J. Norris, and M. G. Bawendi, J. Am. Chem. Soc. 115, 8706, 1993.
19. M. G. Bawendi and N. E. Stott, US Patent App. Pub. No. 2002/0071952.
20. F. Chen et al., Mat.Res. Soc. Symp. Proc. 691, p. 359-364, 2002; B. L. Wehrenberg et al. J. Phys. Chem. B 106, p. 10634-10640, 2002; E. Lifshitz et al., Nano Lett. 3 (6), p. 857-862, 2003; S. Kim, J. Am. Chem. Soc. 125 (38), p. 11466-11467, 2003; A. Sashchiuk et al., Nano Lett. 4 (1), p. 159-165, 2004.
21. See for introduction, N. W. Ashcroft, N. D. Mermin, Solid State Physics, 1st edition, 1976.
22. R. Parthasarathy, X. M. Lin and H. M. Jaeger, Phys. Rev. Lett. 87, Art. No. 186807, 2001.
23. M. V. Jarosz, N. E. Scott, M. Drndic, et al., J. of Chem. Physics B, 107, 12585, 2003.
24. E. Rabani, D. R. Reichman, P. L. Geissler, L. E. Brus, Nature, 426, p. 271-274, 2003.
25. Drndic and Fischbein, "Semiconducting-Nanocrystal Transistors for Quantum Electronics", U.S. Pat. Ser. No. 60/574,353, filed May 25, 2004.
26. M. A. Islam, I. P. Herman, Appl. Phys. Lett. 80 (20), p. 3823-3825, 2002.
27. M. Gleiche, L. F. Chi, H. Fuchs, Nature, 403, p. 173-175, 2000.
28. N. Lu, X. D. Chen, D. Molenda, et al., Nano Lett. 4 (5), p. 885-888, 2004.
29. S. Ravindran, S. Chaudhary, B. Colburn, M. Ozkan, and C. Ozkan, Nano Lett. 2, p. 447-453, 2003.

30. F. X. Redl, K. S. Cho, C. B. Murray, S. O. Brien, Nature 423, p. 968-970, 2003.
31. D. S. Novikov, M. Dmdic, L. S. Levitov et al., submitted to Phys. Rev. Lett., 2003. cond-mat/0307031.
32. B. L. Wehrenberg, P. Guyot-Sionnest, J. Am. Chem. Soc. 125, p. 7806-7807, 2003.
33. For review see D. Bonnell, editor, Scanning Probe Microscopy and Spectroscopy, Theory, Techniques and Applications, Wiley-VCH, Inc., 2000.
34. M. Bockrath, N. Markovic, A. Shepard et al., Nano Letters, 2 (3),187, 2002.
35. A. Bachtold , M. S. Fuhrer, S. Plyasunov et al., Phys. Rev. Lett. 84 (26), 6082, 2000.
36. E. Tevaarwerk, P. Rugheimer, I. M. Castellini et al., Appl. Phys. Lett. 80, 4626, 2002.
37. T. D. Krauss and L. E. Brus, Phys. Rev. Lett. 83 (23), 4840,1999.
38. M. Drndic, R. Markov, M. V. Jarosz, M. G. Bawendi, M. A. Kastner, N. Markovic, M. Tinkham, Appl. Phys. Lett. 83 (19), 4008, 2003.
39. H. Scher, E. W. Montroll, Phys. Rev. B 12 (6), p. 2455-2477, 1975.
40. For review see, J. P. Bouchaud and A. Georges, Anomalous diffusion in disordered media, Elsevier Science Publishers (North-Holland), 1990.
41. S. Wolfram, Cellular Automata and Complexity, Perseus Publishing, 2002.

What is claimed:

1. A method, comprising:
providing a plurality of nanostructures;
providing a substrate comprising at least one discontinuity;
contacting the plurality of nanostructures to the substrate, wherein at least a portion of the plurality of nanostructures assemble adjacent to the discontinuity, the assembled nanostructures including at least one nanostructure comprising a bridging molecule; and removing excess nanostructures that are adjacent to the substrate and not adjacent to the discontinuity.

2. A method, comprising:
providing a plurality of nanostructures;
providing a substrate comprising at least one discontinuity; and
contacting the plurality of nanostructures to the substrate, wherein at least a portion of the plurality of nanostructures assemble adjacent to the discontinuity, the assembled nanostructures including at least one nanostructure comprising a bridging molecule,
wherein substantially all or all of the assembled nanostructures include a bridging molecule,
wherein a plurality of bridging molecules are covalently attached to the surface of each assembled nanostructure, and wherein the distance between two neighboring nanostructures is up to about the length of one of the bridging molecules.

3. A method, comprising:
providing a plurality of nanostructures;
providing a substrate comprising at least one discontinuity;
contacting the plurality of nanostructures to the substrate, wherein at least a portion of the plurality of nanostructures assemble adjacent to the discontinuity, the assembled nanostructures including at least one nanostructure comprising a bridging molecule,
wherein the nanostructures comprise a Group II-VI compound, a Group IV-VI compound, or any combination thereof, and wherein the nanostructures are semiconducting.

4. The method of claim 3, wherein the nanostructures are composed of CdSe, CdSe/ZnS, Cd/Te, Pb/Se, or any combination thereof.

5. A method, comprising:
providing a plurality of nanostructures;
providing a substrate comprising at least one discontinuity; and
contacting the plurality of nanostructures to the substrate, wherein at least a portion of the plurality of nanostructures assemble adjacent to the discontinuity, the assembled nanostructures including at least one nanostructure comprising a bridging molecule, and
wherein the discontinuity comprises two electrodes directly adjacent to the substrate and a gap between the two electrodes, wherein the gap between the two electrodes is from about 1nm to about 3000 nm wide.

6. A device, comprising:
a substrate comprising at least one discontinuity; and
a plurality of spatially assembled nanostructures residing adjacent to the at least one discontinuity, wherein at least two of the spatially assembled nanostructures are linked by one or more bridging molecules,
wherein all of the spatially assembled nanostructures are linked by bridging molecules, and
wherein each of the spatially assembled nanostructures includes a surface and a plurality of bridging molecules covalently attached to the surface.

7. A device, comprising:
a substrate comprising at least one discontinuity; and
a plurality of spatially assembled nanostructures residing adjacent to the at least one discontinuity, wherein at least two of the spatially assembled nanostructures are linked by one or more bridging molecules,
wherein the bridging molecules are organic, inorganic, or both,
wherein the organic bridging molecules include an alkyl phosphine oxide, a molecule comprising aromatic, amine or thiol functionality, an electrically conductive molecule, oligomer or polymer, or any combination thereof, and wherein the alkyl phosphine oxide comprises an alkyl group composed of a linear, branched or cyclic hydrocarbon, the hydrocarbon composed of from 1 to about 100 carbon atoms and from 1 to about 200 hydrogen atoms.

8. A device, comprising:
a substrate comprising at least one discontinuity; and
a plurality of spatially assembled nanostructures residing adjacent to the at least one discontinuity, wherein at least two of the spatially assembled nanostructures are linked by one or more bridging molecules,
wherein the nanostructures comprise a Group II-VI compound, a Group IV-VI compound, or any combination thereof, and wherein the nanostructures are semiconducting.

9. A device, comprising:
a substrate comprising at least one discontinuity, the discontinuity comprising comprises two electrodes directly adjacent to the substrate and a gap between the two electrodes, the gap being from about 1 nm to about 3000 nm wide and
a plurality of spatially assembled nanostructures residing adjacent to the at least one discontinuity,
wherein at least two of the spatially assembled nanostructures are linked by one or more bridging molecules.

10. A field-effect transistor, comprising:
a substrate comprising a first surface and a second surface;
a discontinuity situated on the first surface;

a source electrode and a drain electrode situated directly adjacent to the discontinuity and the first surface, the source electrode and drain electrode separated by a distance providing a gap therebetween of from about 10 nm to about 1000 nm wide;

from 2 to about 100,000 spatially assembled semiconducting nanostructures residing within the gap, wherein the nanostructures are electronically coupled to each other and the two electrodes by one or more bridging molecules; and a gate electrode situated on the second surface opposite to the spatially assembled nanostructures for altering the charge carrier density of the nanostructures when a gate voltage is applied.

11. The field effect transistor of claim 10, wherein the nanostructures include nanowires, nanorods, nanotubes, branched nanowires, nanotetrapods, nanotripods, nanobipods, nanocrystals (NCs), nanodots, quantum dots, nanoparticles, nanoribbons, or any combination thereof.

12. The field-effect transistor of claim 10, wherein the nanostructures have an average particle size in the range of from about 1 nm to about 20 nm.

13. The field-effect transistor of claim 10, wherein the nanostructures comprise a Group II-VI compound, a Group II-V compound, a Group III-VI compound, a Group III-V compound, a Group IV-VI compound, a Group I-III-VI compound, a Group II-IV-VI compound, a Group II-IV-V compound, or any combination thereof.

14. The field-effect transistor of claim 13, wherein the nanostructures comprise a Group II-VI compound, a Group IV-VI compound, or any combination thereof, and wherein the nanostructures comprise a core or a core/shell morphology.

15. The field-effect transistor of claim 14, wherein the nanostructures are composed of CdSe, CdSe/ZnS, Cd/Te, Pb/Se, or any combination thereof.

16. The field-effect transistor of claim 10, wherein the source and drain electrodes are composed of a metal, a molecular wire, or both.

17. The field-effect transistor of claim 10, wherein the bridging molecules are organic, inorganic, or both.

18. The field-effect transistor of claim 17, wherein the organic bridging molecules include an alkyl phosphine oxide, a molecule comprising aromatic, amine or thiol functionality, an electrically conductive molecule, oligomer or polymer, or any combination thereof.

19. The field-effect transistor of claim 10, wherein a majority or all of the nanostructures reside spatially ordered in the gap.

* * * * *